United States Patent
Itai et al.

(10) Patent No.: US 9,907,140 B2
(45) Date of Patent: Feb. 27, 2018

(54) ORGANIC ELECTROLUMINESCENT ELEMENT

(75) Inventors: Yuichirou Itai, Kanagawa (JP); Toshihiro Ise, Kanagawa (JP)

(73) Assignee: UDC IRELAND LIMITED, Dublin (IE)

( * ) Notice: Subject to any disclaimer, the term of this patent is extended or adjusted under 35 U.S.C. 154(b) by 851 days.

(21) Appl. No.: 13/808,904

(22) PCT Filed: Jul. 8, 2011

(86) PCT No.: PCT/JP2011/065716
§ 371 (c)(1),
(2), (4) Date: Apr. 25, 2013

(87) PCT Pub. No.: WO2012/005361
PCT Pub. Date: Jan. 12, 2012

(65) Prior Publication Data
US 2013/0207540 A1    Aug. 15, 2013

(30) Foreign Application Priority Data
Jul. 9, 2010   (JP) .................................. 2010-157353

(51) Int. Cl.
*H01L 51/54* (2006.01)
*C09K 11/06* (2006.01)
(Continued)

(52) U.S. Cl.
CPC ............. *H05B 33/14* (2013.01); *C09B 57/00* (2013.01); *C09K 11/06* (2013.01); *H01L 51/0054* (2013.01); *H01L 51/0067* (2013.01); *H01L 51/0072* (2013.01); *H01L 51/0074* (2013.01); *C09K 2211/1007* (2013.01);
(Continued)

(58) Field of Classification Search
CPC ............. H01L 51/0032; H01L 51/0052; H01L 51/0054; H01L 51/0062; H01L 51/0067; H01L 51/0071; H01L 51/0072; H01L 51/0074; H01L 51/0081; H01L 51/0085; H01L 51/50; H01L 51/5012; H01L 51/5016; H01L 51/5072; H05B 33/15; C09K 11/06; C09K 2211/00; C09K 2211/10; C09K 2211/1011; C09K 2211/1007; C09K 2211/1018; C09K 2211/1029; C09K 2211/1044; C09K 2211/1092; C09K 2211/185
USPC ....... 428/690, 691, 917, 411.4, 336; 427/58, 427/66; 313/500–512; 257/40, 88–104, 257/E51.001–E51.052; 252/301.16–301.35
See application file for complete search history.

(56) References Cited

U.S. PATENT DOCUMENTS

2004/0142208 A1* 7/2004 Hamada .............. C07F 15/0033
428/690
2007/0257600 A1* 11/2007 Matsuura ............ H01L 51/0067
313/498

FOREIGN PATENT DOCUMENTS

JP    2007220721    8/2007
JP    2009117850    5/2009
(Continued)

*Primary Examiner* — Andrew K Bohaty
(74) *Attorney, Agent, or Firm* — Riverside Law LLP

(57) ABSTRACT

Disclosed is an organic electroluminescent element which has high luminous efficiency, a low driving voltage, high durability in a high-current-density region, and little change in chromaticity before and after the driving in a high-current-density region. Specifically disclosed is an organic electroluminescent element comprising a pair of electrodes composed of an anode and a cathode, a light-emitting layer arranged between the electrodes, and at least one organic layer arranged between the light-emitting layer and the anode, wherein the light-emitting layer contains, for example, a compound (A), and at least one organic layer arranged between the light-emitting layer and the cathode contains, for example, a compound (a-3).

AA

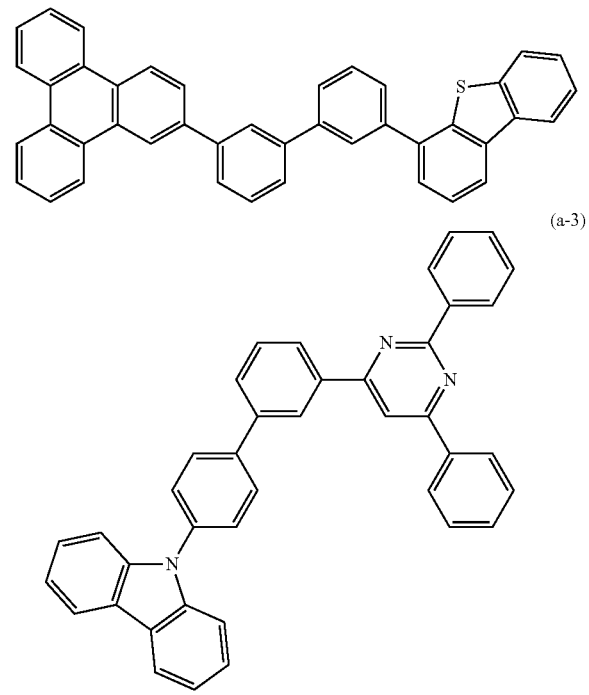

18 Claims, 1 Drawing Sheet

(51) Int. Cl.
*H05B 33/14* (2006.01)
*H01L 51/00* (2006.01)
*C09B 57/00* (2006.01)
*H01L 51/50* (2006.01)

(52) U.S. Cl.
CPC ........... *C09K 2211/1011* (2013.01); *C09K 2211/1029* (2013.01); *C09K 2211/1044* (2013.01); *C09K 2211/1092* (2013.01); *C09K 2211/185* (2013.01); *H01L 51/0081* (2013.01); *H01L 51/0085* (2013.01); *H01L 51/5072* (2013.01)

(56) References Cited

FOREIGN PATENT DOCUMENTS

| | | | |
|---|---|---|---|
| JP | 2010515255 | 5/2010 | |
| JP | 4474493 | 6/2010 | |
| JP | 4523992 | 8/2010 | |
| WO | 2007142083 | 12/2007 | |
| WO | 2009/021126 | 2/2009 | |
| WO | 2009030981 | 3/2009 | |
| WO | 2010002848 | 1/2010 | |
| WO | WO 2010044489 A1 * | 4/2010 | ......... H01L 51/5268 |

* cited by examiner

ORGANIC ELECTROLUMINESCENT ELEMENT

CROSS-REFERENCE TO RELATED APPLICATIONS

The present application is a U.S. National Stage Entry of International Patent Application No. PCT/JP2011/065716, filed 8 Jul. 2011, which in turn claims priority benefit of prior Japanese Patent Application No. 2010-157353, filed 9 Jul. 2010, now granted as Japanese Patent No. 4751954 on 17 Aug. 2011, all of which are hereby incorporated by reference in their entirety.

TECHNICAL FIELD

The present invention relates to an organic electroluminescence device (hereinafter also referred to as a "device" or an "organic EL device"). More particularly, the present invention relates to an organic electroluminescence device including a specific dibenzothiophene-based compound and a carbazole-based compound having a specific structure.

BACKGROUND ART

Organic electroluminescence devices are capable of obtaining light emission with high luminance intensity with low voltage driving, and thus have been actively researched and developed. Generally, organic electroluminescence devices are composed of an organic layer including a light emitting layer, and a pair of electrodes having the layer therebetween, and utilize, for light emission, energy of the exciton generated as a result of recombination of electrons injected from a cathode and holes injected from an anode in the light emitting layer.

Improvement in the efficiency of devices has been recently made by using a phosphorescent light emitting material. For example, an organic electroluminescence device having improved light emission efficiency and heat resistance has been studied, using an iridium complex or a platinum complex as a phosphorescent light emitting material.

Further, doping-type devices, which utilize light emitting layers in which a light emitting material is doped in a host material, have been widely employed.

For example, Patent Document 1 discloses a compound containing a benzothiophene structure and a triphenylene structure as a host material used together with a phosphorescent light emitting material, and discloses that an organic electroluminescence device having high durability is obtained by using the material even when driving at a high current density (a current density of 25 mA/cm$^2$ or more, 40 mA/cm$^2$ in Examples of Patent Document 1).

In addition, Patent Document 2 discloses a compound having a benzothiophene structure or a compound having a carbazole structure and a triazine structure as a material used in an organic layer, and discloses that an organic electroluminescence device having excellent light emission efficiency and durability is obtained by using the material particularly in a light emitting layer or a hole transporting layer.

RELATED ART

Patent Document

Patent Document 1: International Publication No. WO09/021,126

Patent Document 2: Japanese Patent Application Laid-Open No. 2009-117850

DISCLOSURE OF INVENTION

Problems to be Solved by Invention

However, the organic electroluminescence device described in Patent Document 1 has high durability in a high current density region, but has a high driving voltage and insufficient light emission efficiency. The present inventors have studied intensively and, as a result, have found that in an organic electroluminescence device in which a specific compound containing a benzothiophene structure and a triphenylene structure is used in a light emitting layer as a host material, durability is improved in a high current density region and a high light emission efficiency is obtained even at a low driving voltage by using a specific material containing a carbazole structure and a phenylpyridine or phenylpyrimidine structure as an electron transporting material in at least one organic layer (for example, electron transporting layer) between the light emitting layer and the cathode. Patent Document 2 does not describe clearly the function of the material used in an organic layer, specifically describes only the case where the above-described specific material is used in the light emitting layer or the hole transporting layer, and does not describe the specific guideline on a material for an electron transporting material.

Furthermore, the present inventors have found that in an organic electroluminescence device having the configuration of the present invention, in addition to the aforementioned characteristics, change in chromaticity is also suppressed before and after driving in a high current density region. Patent Documents 1 and 2 do not describe these characteristics.

That is, an object of the present invention is to provide an organic electroluminescence device having high light emission efficiency, a low driving voltage, high durability in a high current density region, and a small change in chromaticity before and after driving in the high current density region.

Furthermore, another object of the present invention is to provide a light emission apparatus, a display apparatus, and an illumination apparatus, which include the organic electroluminescence device.

Means for Solving the Problems

The above-mentioned objects of the present invention may be accomplished by the following means.

[1] An organic electroluminescence device including a pair of electrodes including an anode and a cathode, a light emitting layer between the electrodes, and at least one organic layer between the light emitting layer and the cathode, in which the light emitting layer contains at least one compound represented by the following Formula (I), and the at least one organic layer between the light emitting layer and the cathode contains at least one compound represented by the following Formula (II).

[Chem. 1]

Formula (I)

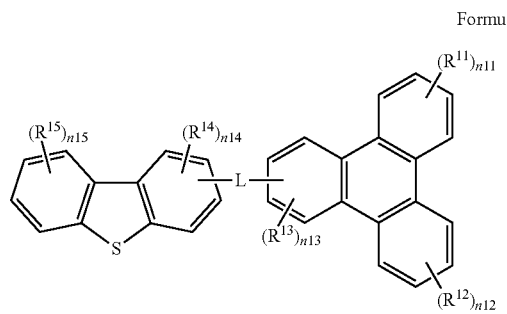

(In Formula (I), each of $R^{11}$ to $R^{15}$ independently represents an alkyl group, an alkoxy group, an aryl group, an aromatic heterocyclic group, an alkenyl group, an alkynyl group, —$OAr^{11}$, —$N(R^{16})(R^{17})$ or —$N(Ar^{11})(Ar^{12})$. Each of $R^{16}$ and $R^{17}$ independently represents a hydrogen atom or a substituent. Each of $Ar^{11}$ and $Ar^{12}$ independently represents an aryl group or an aromatic heterocyclic group. L represents a single bond, an arylene group, a divalent aromatic heterocyclic group or a group composed of a combination thereof. Each of n11, n12 and n15 independently represents an integer of 0 to 4, and each of n13 and n14 independently represents an integer of 0 to 3.)

[Chem. 2]

Formula (II)

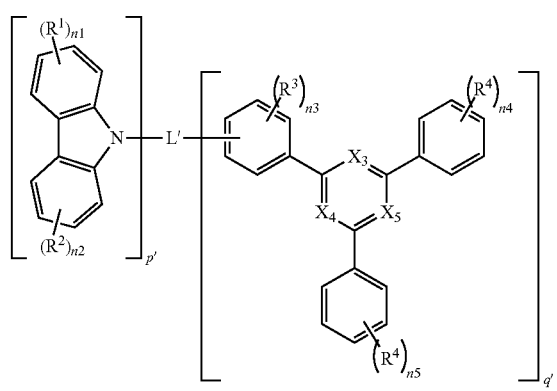

(In Formula (II), each of $X_3$, $X_4$ and $X_5$ is independently a nitrogen atom, or a carbon atom having a hydrogen atom or a substituent bonded thereto, and the ring containing $X_3$, $X_4$ and $X_5$ is pyridine or pyrimidine. L' represents a single bond or a benzene ring. Each of $R^1$ to $R^5$ independently represents a fluorine atom, a methyl group, a phenyl group, a cyano group, a pyridyl group, a pyrimidyl group, a silyl group, a carbazolyl group, or a tert-butyl group. Each of n1 to n5 independently represents 0 or 1, and each of p' and q' independently represents 1 or 2.)

[2] The organic electroluminescence device described in [1], in which the compound represented by Formula (I) is a compound represented by the following Formula (I-1).

[Chem. 3]

Formula (I-1)

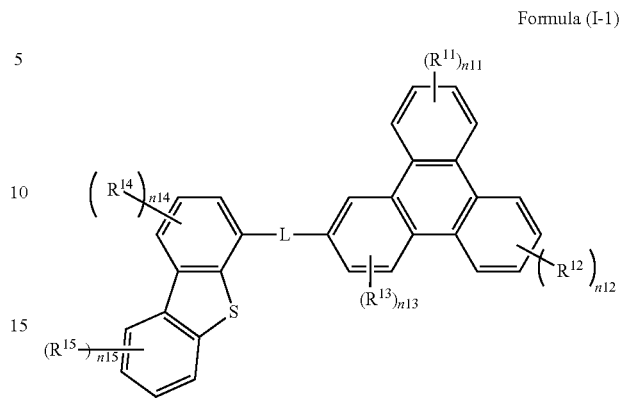

(In Formula (I-1), $R^{11}$ to $R^{15}$, L and n11 to n15 have the same meaning as $R^{11}$ to $R^{15}$, L and n11 to n15 in Formula (I).)

[3] The organic electroluminescence device described in [1], in which the compound represented by Formula (I) is a compound represented by the following Formula (I-2).

[Chem. 4]

Formula (I-2)

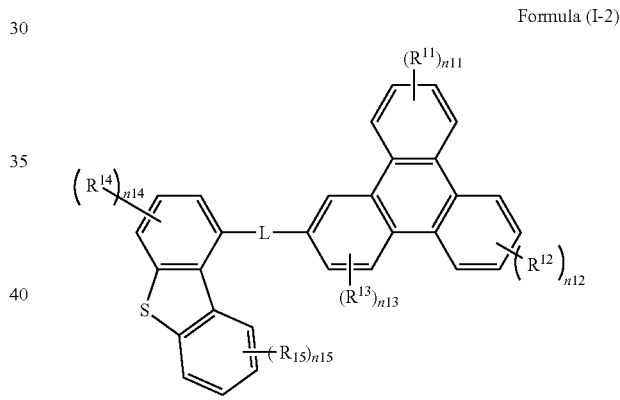

(In Formula (I-2), $R^{11}$ to $R^{15}$, L and n11 to n15 have the same meaning as $R^{11}$ to $R^{15}$, L and n11 to n15 in Formula (I).)

[4] The organic electroluminescence device described in any one of [1] to [3], in which each of $R^{11}$ to $R^{15}$ is independently an aryl group or an aromatic heterocyclic group.

[5] The organic electroluminescence device described in any one of [1] to [4], in which L is an arylene group.

[6] The organic electroluminescence device described in any one of [1] to [5], in which the light emitting layer contains at least one phosphorescent light emitting material.

[7] The organic electroluminescence device described in any one of [1] to [6], in which at least one layer of the light emitting layer and other organic layers present between the anode and the cathode is formed by a solution application process.

[8] A light emission apparatus using the organic electroluminescence device described in any one of [1] to [6].

[9] A display apparatus using the organic electroluminescence device described in any one of [1] to [6].

[10] An illumination apparatus using the organic electroluminescence device described in any one of [1] to [6].

Effects of the Invention

According to the present invention, it is possible to provide an organic electroluminescence device having a high light emission efficiency, a low driving voltage, a high durability in a high current density region, and a small change in chromaticity before and after driving in the high current density region.

EMBODIMENTS FOR CARRYING OUT THE INVENTION

Figure 1:
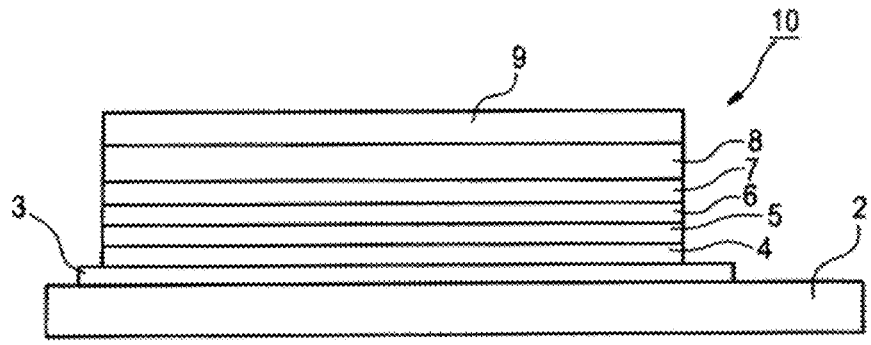
FIG. 1 is a schematic view illustrating an example (first embodiment) of a layer configuration of the organic EL device according to the present invention.

In the present specification, the description of each general formula represents that the hydrogen atom also includes isotopes (such as a deuterium atom and the like), and atoms which further constitute a substituent also include isotopes thereof.

In the present specification, the Groups A and B of substituents will be defined as follows.

(Group A of Substituents)

An alkyl group (having preferably 1 to 30 carbon atoms, more preferably 1 to 20 carbon atoms, and particularly preferably 1 to 10 carbon atoms, and examples thereof include methyl, ethyl, isopropyl, t-butyl, n-octyl, n-decyl, n-hexadecyl, cyclopropyl, cyclopentyl, cyclohexyl, neopentyl and the like), an alkenyl group (having preferably 2 to 30 carbon atoms, more preferably 2 to 20 carbon atoms, and particularly preferably 2 to 10 carbon atoms, and examples thereof include vinyl, allyl, 2-butenyl, 3-pentenyl and the like), an alkynyl group (having preferably 2 to 30 carbon atoms, more preferably 2 to 20 carbon atoms, and particularly preferably 2 to 10 carbon atoms, and examples thereof include propargyl, 3-pentynyl and the like), an aryl group (having preferably 6 to 30 carbon atoms, more preferably 6 to 20 carbon atoms, and particularly preferably 6 to 12 carbon atoms, and examples thereof include phenyl, 4-methylphenyl, 2,6-dimethylphenyl and the like), an amino group (having preferably 0 to 30 carbon atoms, more preferably 0 to 20 carbon atoms, and particularly preferably 0 to 10 carbon atoms, and examples thereof include amino, methylamino, dimethylamino, diethylamino, dibenzylamino, diphenylamino, ditolylamino and the like), an alkoxy group (having preferably 1 to 30 carbon atoms, more preferably 1 to 20 carbon atoms, and particularly preferably 1 to 10 carbon atoms, and examples thereof include methoxy, ethoxy, butoxy, 2-ethylhexyloxy and the like), an aryloxy group (having preferably 6 to 30 carbon atoms, more preferably 6 to 20 carbon atoms, and particularly preferably 6 to 12 carbon atoms, and examples thereof include phenyloxy, 1-naphthyloxy, 2-naphthyloxy and the like), a heterocyclic oxy group (having preferably 1 to 30 carbon atoms, more preferably 1 to 20 carbon atoms, and particularly preferably 1 to 12 carbon atoms, and examples thereof include pyridyloxy, pyrazyloxy, pyrimidyloxy, quinolyloxy and the like), an acyl group (having preferably 2 to 30 carbon atoms, more preferably 2 to 20 carbon atoms, and particularly preferably 2 to 12 carbon atoms, and examples thereof include acetyl, benzoyl, formyl, pivaloyl and the like), an alkoxycarbonyl group (having preferably 2 to 30 carbon atoms, more preferably 2 to 20 carbon atoms, and particularly preferably 2 to 12 carbon atoms, and examples thereof include methoxycarbonyl, ethoxycarbonyl and the like), an aryloxycarbonyl group (having preferably 7 to 30 carbon atoms, more preferably 7 to 20 carbon atoms, and particularly preferably 7 to 12 carbon atoms, and examples thereof include phenyloxycarbonyl and the like), an acyloxy group (having preferably 2 to 30 carbon atoms, more preferably 2 to 20 carbon atoms, and particularly preferably 2 to 10 carbon atoms, and examples thereof include acetoxy, benzoyloxy and the like), an acylamino group (having preferably 2 to 30 carbon atoms, more preferably 2 to 20 carbon atoms, and particularly preferably 2 to 10 carbon atoms, and examples thereof include acetylamino, benzoylamino and the like), an alkoxycarbonylamino group (having preferably 2 to 30 carbon atoms, more preferably 2 to 20 carbon atoms, and particularly preferably 2 to 12 carbon atoms, and examples thereof include methoxycarbonylamino and the like), an aryloxycarbonylamino group (having preferably 7 to 30 carbon atoms, more preferably 7 to 20 carbon atoms, and particularly preferably 7 to 12 carbon atoms, and examples thereof include phenyloxycarbonylamino and the like), a sulfonylamino group (having preferably 1 to 30 carbon atoms, more preferably 1 to 20 carbon atoms, and particularly preferably 1 to 12 carbon atoms, and examples thereof include methanesulfonylamino, benzenesulfonylamino and the like), a sulfamoyl group (having preferably 0 to 30 carbon atoms, more preferably 0 to 20 carbon atoms, and particularly preferably 0 to 12 carbon atoms, and examples thereof include sulfamoyl, methylsulfamoyl, dimethylsulfamoyl, phenylsulfamoyl and the like), a carbamoyl group (having preferably 1 to 30 carbon atoms, more preferably 1 to 20 carbon atoms, and particularly preferably 1 to 12 carbon atoms, and examples thereof include carbamoyl, methylcarbamoyl, diethylcarbamoyl, phenylcarbamoyl and the like), an alkylthio group (having preferably 1 to 30 carbon atoms, more preferably 1 to 20 carbon atoms, and particularly preferably 1 to 12 carbon atoms, and examples thereof include methylthio, ethylthio and the like), an arylthio group (having preferably 6 to 30 carbon atoms, more preferably 6 to 20 carbon atoms, and particularly preferably 6 to 12 carbon atoms, and examples thereof include phenylthio and the like), a heterocyclic thio group (having preferably 1 to 30 carbon atoms, more preferably 1 to 20 carbon atoms, and particularly preferably 1 to 12 carbon atoms, and examples thereof include pyridylthio, 2-benzimidazolylthio, 2-benzoxazolylthio, 2-benzthiazolylthio and the like), a sulfonyl group (having preferably 1 to 30 carbon atoms, more preferably 1 to 20 carbon atoms, and particularly preferably 1 to 12 carbon atoms, and examples thereof include mesyl, tosyl and the like), a sulfinyl group (having preferably 1 to 30 carbon atoms, more preferably 1 to 20 carbon atoms, and particularly preferably 1 to 12 carbon atoms, and examples thereof include methanesulfinyl, benzenesulfinyl and the like), a ureido group (having preferably 1 to 30 carbon atoms, more preferably 1 to 20 carbon atoms, and particularly preferably 1 to 12 carbon atoms, and examples thereof include ureido, methylureido, phenylureido and the like), a phosphoric acid amide group (having preferably 1 to 30 carbon atoms, more preferably 1 to 20 carbon atoms, and particularly preferably 1 to 12 carbon atoms, and examples thereof include diethylphosphoric acid amide, phenylphosphoric acid amide and the like), a hydroxyl group, a mercapto group, a halogen atom (for example, a fluorine atom, a chlorine atom, a bromine atom and an iodine atom), a cyano group, a sulfo group, a carboxyl group, a nitro group, a hydroxamic acid group, a sulfino group, a hydrazino group, an imino group, a heterocyclic group (also includes an aromatic heterocyclic group, having preferably 1 to 30 carbon atoms, and more preferably 1 to 12 carbon atoms, and examples of the hetero atom include a nitrogen atom, an oxygen atom, a sulfur atom, a phosphorus atom, a silicon atom, a selenium atom and a tellurium atom, and specific examples thereof include pyridyl, pyrazinyl, pyrimidyl, pyridazinyl, pyrrolyl, pyrazolyl, triazolyl, imidazolyl, oxazolyl, thiazolyl, isoxazolyl, isothiazolyl, quinolyl, furyl, thienyl, selenophenyl, tellurophenyl, piperidyl, piperidino, morpholino, pyrrolidyl, pyrrolidino, benzoxazolyl, benzoimidazolyl, benzothiazolyl, a carbazolyl group, an azepinyl group, a silolyl group and the like), a silyl group (having preferably 3 to 40 carbon atoms, more preferably 3 to 30 carbon atoms, and particularly preferably 3 to 24 carbon atoms, and examples thereof include trimethylsilyl, triphenylsilyl and the like), a silyloxy group (having preferably 3 to 40 carbon atoms, more preferably 3 to 30 carbon atoms, and particularly preferably 3 to 24 carbon atoms, and examples thereof include trimethylsilyloxy, triphenylsilyloxy and the like) and a phosphoryl group (examples thereof include a diphenylphosphoryl group, a dimethylphosphoryl group and the like). These substituents may be further substituted, and examples of a further substituted substituent include a group selected from Group A of substituents as described above.

(Group B of Substituents)

An alkyl group (having preferably 1 to 30 carbon atoms, more preferably 1 to 20 carbon atoms, and particularly preferably 1 to 10 carbon atoms, and examples thereof include methyl, ethyl, isopropyl, t-butyl, n-octyl, n-decyl, n-hexadecyl, cyclopropyl, cyclopentyl, cyclohexyl and the like), an alkenyl group (having preferably 2 to 30 carbon atoms, more preferably 2 to 20 carbon atoms, and particularly preferably 2 to 10 carbon atoms, and examples thereof include vinyl, allyl, 2-butenyl, 3-pentenyl and the like), an alkynyl group (having preferably 2 to 30 carbon atoms, more preferably 2 to 20 carbon atoms, and particularly preferably 2 to 10 carbon atoms, and examples thereof include propargyl, 3-pentynyl and the like), an aryl group (having preferably 6 to 30 carbon atoms, more preferably 6 to 20 carbon atoms, and particularly preferably 6 to 12 carbon atoms, and examples thereof include phenyl, p-methylphenyl, naphthyl, anthranyl and the like), a cyano group, a heterocyclic group (also includes an aromatic heterocyclic group, having preferably 1 to 30 carbon atoms, and more preferably 1 to 12 carbon atoms, and examples of the hetero atom include a nitrogen atom, an oxygen atom, a sulfur atom, a phosphorus atom, a silicon atom, a selenium atom and a tellurium atom, and specific examples thereof include pyridyl, pyrazinyl, pyrimidyl, pyridazinyl, pyrrolyl, pyrazolyl, triazolyl, imidazolyl, oxazolyl, thiazolyl, isoxazolyl, isothiazolyl, quinolyl, furyl, thienyl, selenophenyl, tellurophenyl, piperidyl, piperidino, morpholino, pyrrolidyl, pyrrolidino, benzoxazolyl, benzoimidazolyl, benzothiazolyl, a carbazolyl group, an azepinyl group, a silolyl group and the like). These substituents may be further substituted, and examples of a further substituted substituent include a group selected from Group B of substituents as described above. Further, a substituent substituted with a substituent may be further substituted, and examples of a further substituted substituent include a group selected from Group B of substituents as described above. In addition, a substituent substituted with a substituent substituted with a substituent may be further substituted, and examples of a further substituted substituent include a group selected from Group B of substituents as described above.

The organic electroluminescence device of the present invention is an organic electroluminescence device including a pair of electrodes composed of an anode and a cathode, a light emitting layer between the electrodes, and at least one organic layer between the light emitting layer and the cathode, in which the light emitting layer contains at least one compound represented by Formula (I) as described below and the organic layer of at least one layer between the light emitting layer and the cathode contains at least one compound represented by Formula (II) as described below.

Although it is not clear why an organic photoelectric conversion device having a high light emission efficiency, a low driving voltage, a high durability in a high current density region and a small change in chromaticity before and after driving is obtained by the aforementioned configuration is not clear, it is assumed as follows.

That is, it is thought that a compound represented by Formula (II) has an electron transportability and a hole transportability, and thus it is thought that a light emitting layer using a compound represented by Formula (I) is combined with a layer using a compound represented by Formula (II) (at least one organic layer between the light emitting layer and the cathode, and for example, an electron transporting layer) to suppress the light emitting layer from deteriorating, such that the layer using the compound represented by Formula (II) may receive and transport holes to some degree when the device is driving in a high current density region, and accordingly, a light emission efficiency is maintained to promote a low voltage and a high durability. Furthermore, as a result, it is assumed that a change in chromaticity before and after driving is also suppressed.

[Compound Represented by Formula (I)]

Hereinafter, a compound represented by Formula (I) will be described.

[Chem. 5]

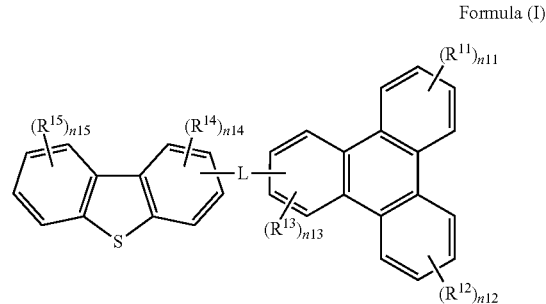

Formula (I)

In Formula (I), each of $R^{11}$ to $R^{15}$ independently represents an alkyl group, an alkoxy group, an aryl group, an aromatic heterocyclic group, an alkenyl group, an alkynyl group, —$OAr^{11}$, —$N(R^{16})(R^{17})$, or —$N(Ar^{11})(Ar^{12})$. Each of $R^{16}$ and $R^{17}$ independently represents a hydrogen atom or a substituent. Each of $Ar^{11}$ and $Ar^{12}$ independently represents an aryl group or an aromatic heterocyclic group. L represents a single bond, an arylene group, a divalent aromatic heterocyclic group or a group composed of a combination thereof. Each of n11, n12 and n15 independently represents an integer of 0 to 4, and each of n13 and n14 independently represents an integer of 0 to 3.

The alkyl group represented by $R^{11}$ to $R^{15}$ is preferably an alkyl group having 1 to 10 carbon atoms, and more preferably an alkyl group having 1 to 6 carbon atoms. Examples thereof include a methyl group, an ethyl group, an n-propyl group, an isopropyl group, an isobutyl group, a t-butyl group, an n-butyl group, a cyclopropyl group and the like.

The alkoxy group represented by $R^{11}$ to $R^{15}$ is preferably an alkoxy group having 1 to 10 carbon atoms, and more preferably an alkoxy group having 1 to 4 carbon atoms. Examples thereof include a methoxy group, an ethyl group, an n-propoxy group, an isopropoxy group, an isobutoxy group, a t-butoxy group, an n-butoxy group, a cyclopropyl oxy group and the like.

The aryl group represented by $R^{11}$ and $R^{15}$ is preferably an aryl group having 6 to 18 carbon atoms, and more preferably an aryl group having 6 to 12 carbon atoms. Examples thereof include a phenyl group, a biphenyl group, a naphthyl group, a triphenyl group, a tolyl group, a xylyl group and the like. A phenyl group, a biphenyl group or a triphenyl group are preferred, and a phenyl group is more preferred.

The aromatic heterocyclic group represented by $R^{11}$ to $R^{15}$ is preferably an aromatic heterocyclic group having 4 to 12 carbon atoms. Examples of an aromatic heterocyclic ring that forms the aromatic heterocyclic group represented by $R^{11}$ to $R^{15}$ include pyridine, pyrimidine, furan, thiophene, benzofuran, benzothiophene, carbazole, dibenzofuran, dibenzothiophene and the like. Carbazole or dibenzothiophene is preferred, and dibenzothiophene is more preferred.

The alkenyl group represented by $R^{11}$ to $R^{15}$ is preferably an alkenyl group having 2 to 10 carbon atoms and more preferably an alkenyl group having 2 to 6 carbon atoms. Examples thereof include a vinyl group, an n-propenyl group, an isopropenyl group, an isobutenyl group, an n-butenyl group and the like.

The alkynyl group represented by $R^{11}$ to $R^{15}$ is preferably an alkynyl group having 2 to 10 carbon atoms and more preferably an alkynyl group having 2 to 6 carbon atoms. Examples thereof include an ethynyl group, a propynyl group, a propargyl group, a butynyl group, an isobutynyl group and the like.

Examples of the substituent represented by $R^{16}$ or $R^{17}$ include an alkyl group, an aryl group, an aromatic heterocyclic group and the like. Preferred and specific examples of these groups include those explained as the alkyl group, the aryl group and the aromatic heterocyclic group, which are represented by $R^{11}$ to $R^{15}$ as described above.

Preferred and specific examples of the aryl group and the aromatic heterocyclic group, which are represented by $Ar^{11}$ or $Ar^{12}$, include those explained as the aryl group and the aromatic heterocyclic group, which are represented by $R^{11}$ to $R^{15}$ as described above.

The arylene group represented by L is preferably an arylene group having 6 to 18 carbon atoms and more preferably an arylene group having 6 to 12 carbon atoms. Examples thereof include a phenylene group, a biphenylene group, a napthylene group, a tolyl group, a xylene group and the like. A phenylene group or a biphenylene group is preferred, and a biphenylene group is more preferred.

The divalent aromatic heterocyclic group represented by L is preferably a divalent aromatic heterocyclic group having 4 to 12 carbon atoms. Examples of an aromatic heterocyclic ring that forms the divalent aromatic heterocyclic group represented by L include pyridine, pyrimidine, pyridazine, triazine, furan, pyran, thiophene and the like. Pyridine is preferred.

Each group represented by $R^{11}$ to $R^{17}$, $Ar^{11}$, $Ar^{12}$ and L may further have a substituent, if possible. Examples of the substituent include an alkyl group, an aryl group, an aromatic heterocyclic group and the like. Preferred and specific examples of these groups include those explained as the alkyl group, the aryl group and the aromatic heterocyclic group, which are represented by $R^{11}$ to $R^{15}$ as described above. A triphenyl group or a dibenzothienyl group is particularly preferred.

$R^{11}$ to $R^{15}$ are preferably an aryl group, an aromatic heterocyclic group or $N(Ar^{11})(Ar^{12})$ [$Ar^{11}$ and $Ar^{12}$ are an aryl group], more preferably an aryl group or an aromatic heterocyclic group, still more preferably a phenyl group, a carbazolyl group or a dibenzothienyl group, and further still more preferably a phenyl group or a dibenzothienyl group.

$Ar^{11}$ and $Ar^{12}$ are preferably an aryl group, and more preferably a phenyl group.

L is preferably a single bond or an arylene group, and more preferably an arylene group. Further, L is preferably a single bond, a phenylene group, a biphenylene group, a pyridinylene group or a group composed of a combination thereof, more preferably a single bond, a phenylene group or a biphenylene group, still more preferably a phenylene group or a biphenylene group, and further still more preferably a biphenylene group.

Each of n11, n12, and n15 independently represents an integer of 0 to 4, and is preferably 0 to 2, and more preferably 0 or 1.

Each of n13 and n14 independently represents an integer of 0 to 3, and 0 or 1 is preferred and 0 is more preferred.

In addition, the fact that n11 to n15 are 0 means that the compound represented by Formula (I) does not have the group represented by $R^{11}$ to $R^{15}$.

From the viewpoint of improving durability in a high current density region, the compound represented by Formula (I) is preferably a compound represented by the following Formula (I-1).

[Chem. 6]

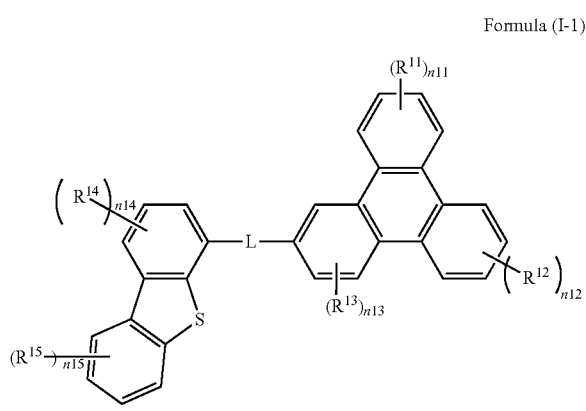

Formula (I-1)

(In Formula (I-1), $R^{11}$ to $R^{15}$, L and n11 to n15 have the same meaning as $R^{11}$ to $R^{15}$, L and n11 to n15 in Formula (I).)

$R^{11}$ to $R^{15}$, L and n11 to n15 have the same meaning as $R^{11}$ to $R^{15}$, L and n11 to n15 in Formula (I), and preferred examples thereof are also the same.

In addition, from the viewpoint of suppressing change in chromaticity before and after driving, the compound represented by Formula (I) is preferably a compound represented by the following Formula (I-2).

[Chem. 7]

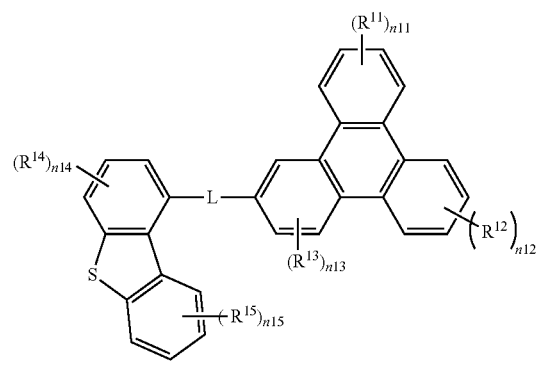

Formula (I-2)

(In Formula (I-2), $R^{11}$ to $R^{15}$, L and n11 to n15 have the same meaning as $R^{11}$ to $R^{15}$, L and n11 to n15 in Formula (I).)

$R^{11}$ to $R^{15}$, L and n11 to n15 have the same meaning as $R^{11}$ to $R^{15}$, L and n11 to n15 in Formula (I), and preferred examples thereof are also the same.

Hereinafter, specific examples of the compound represented by Formula (I) will be exemplified, but the present invention is not limited thereto.

[Chem. 8]

1G

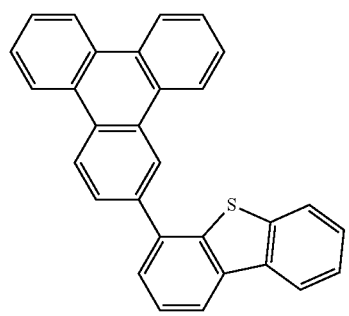

2G

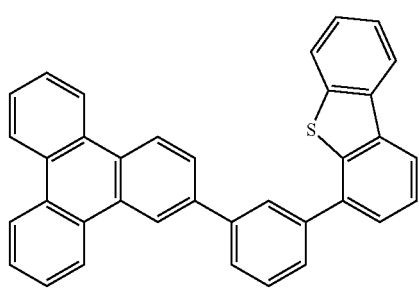

3G

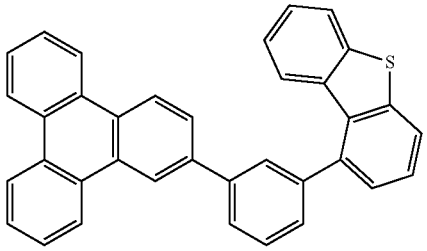

4G

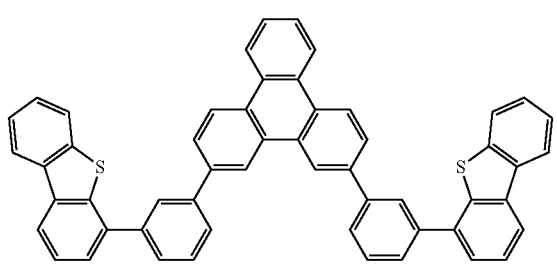

5G

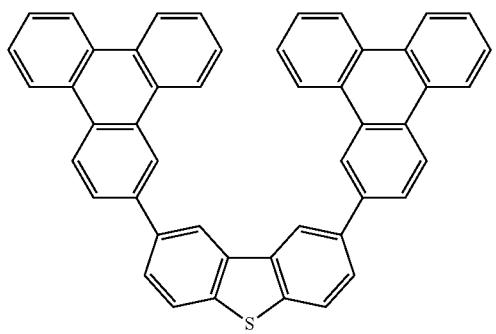

6G

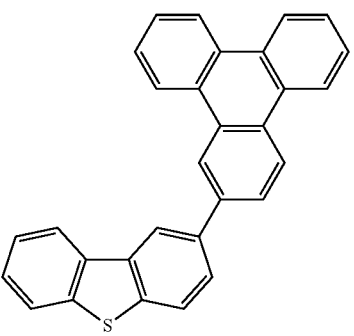

7G

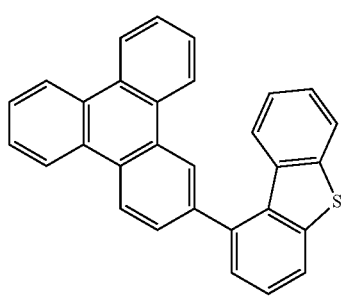

-continued
8G
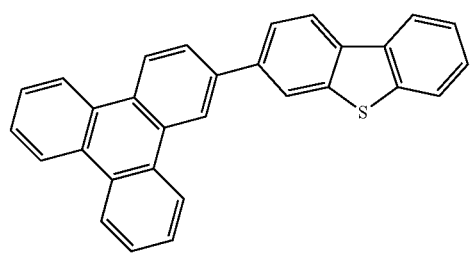
[Chem. 9]
9G
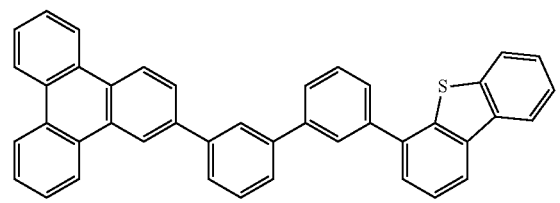
10G
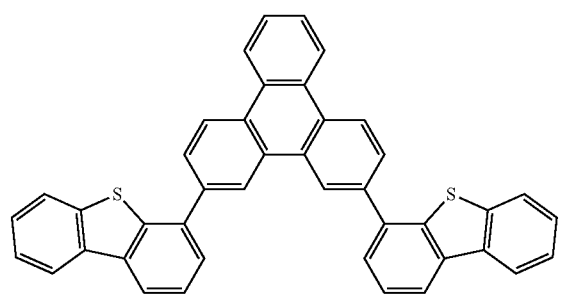
15G
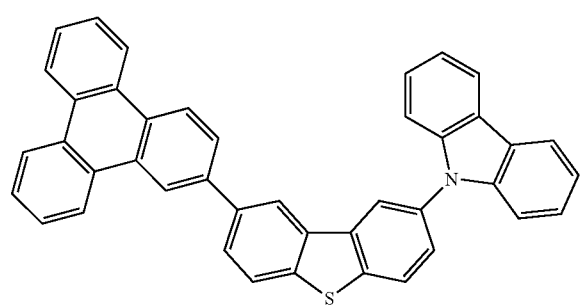
19G
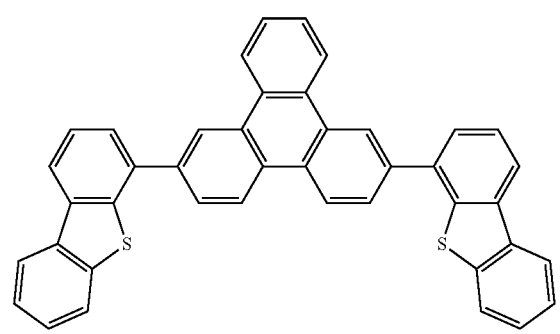
-continued
20G
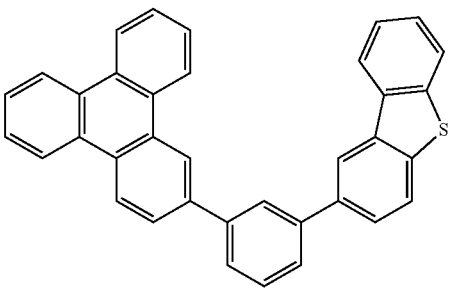
21G
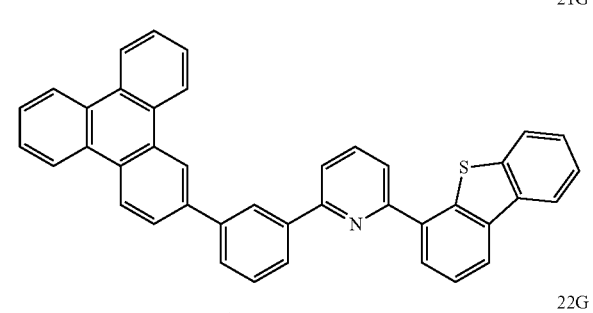
22G
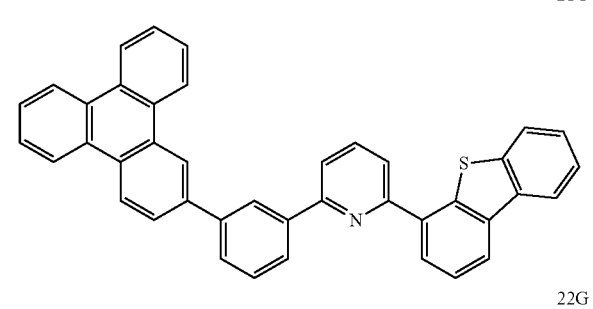
23G
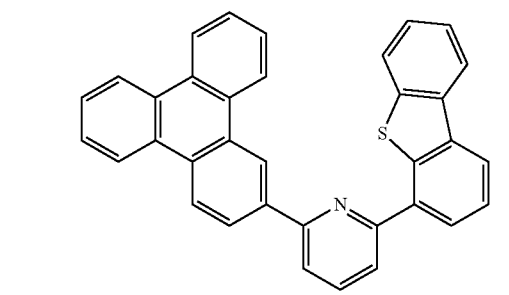
[Chem. 10]
24G
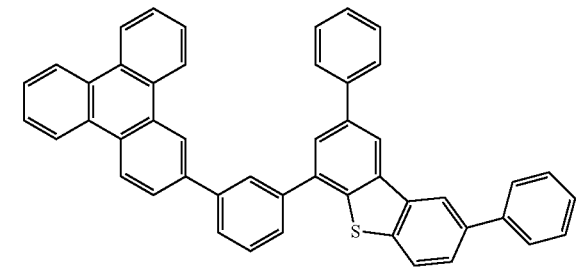

25G
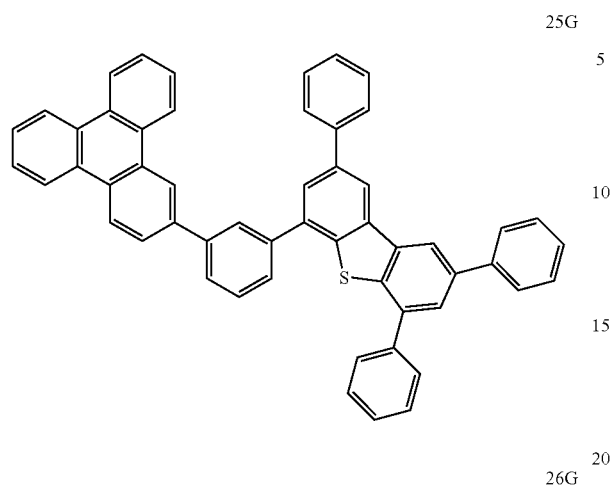
26G
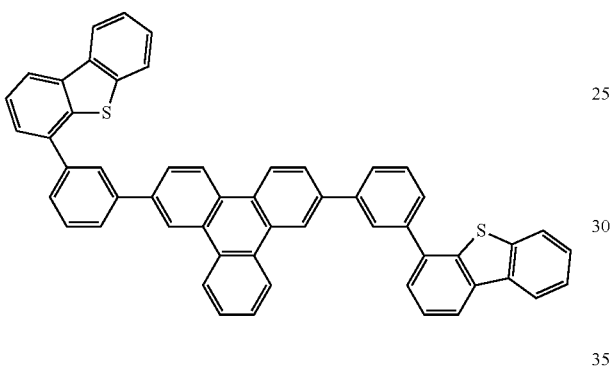
27G
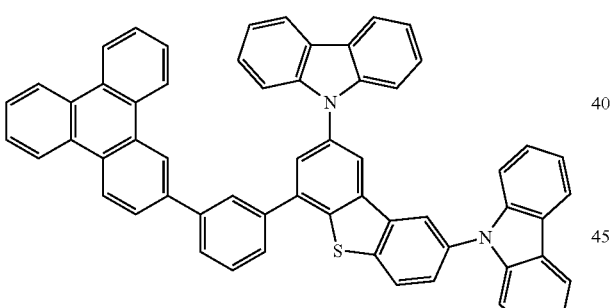
[Chem. 11]
28G
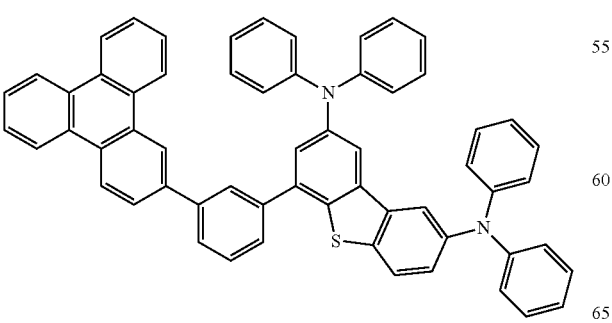
29G
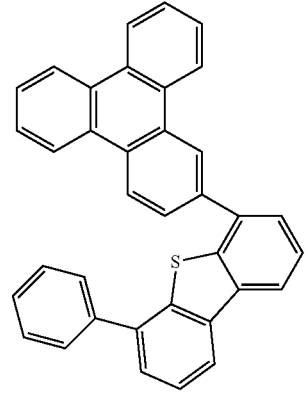
30G
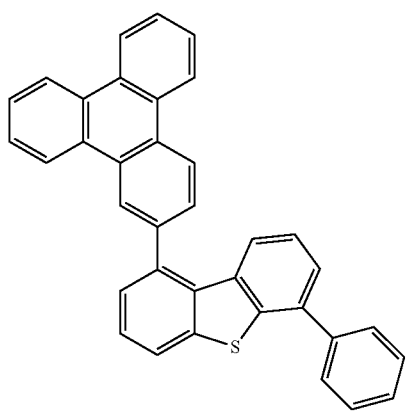
31G
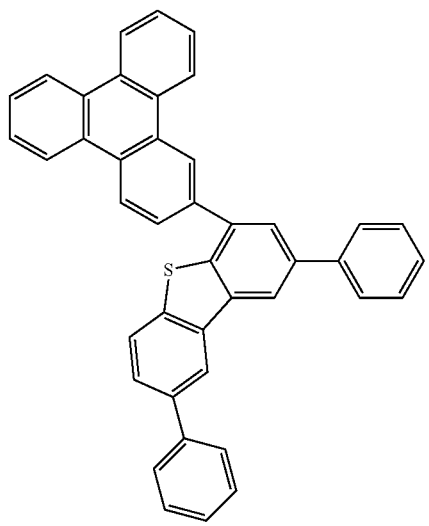

32G
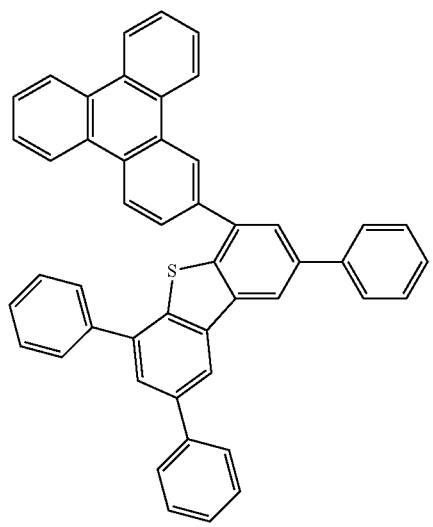
[Chem. 12]
33G
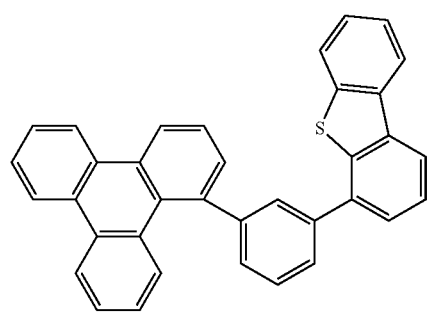
34G
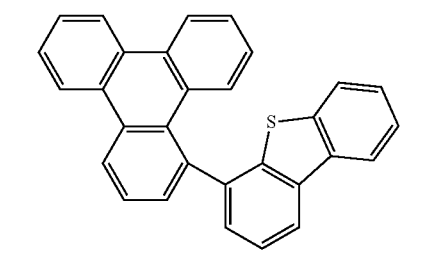
35G
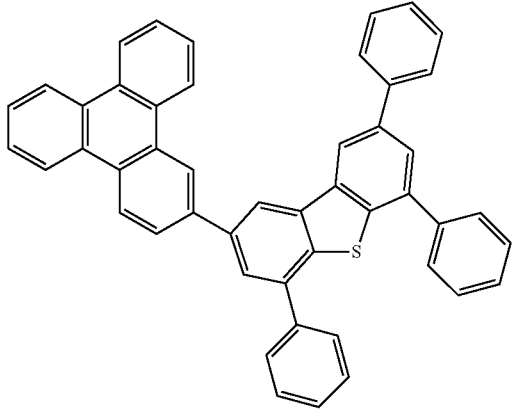
36G
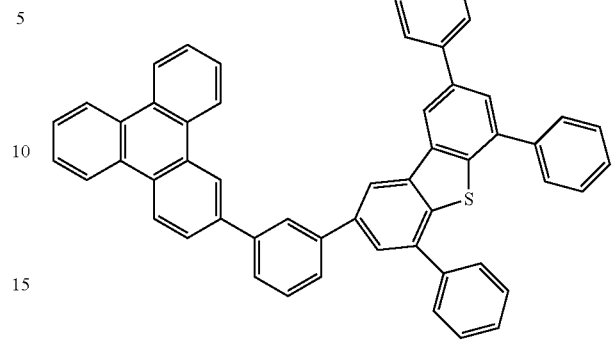
37G
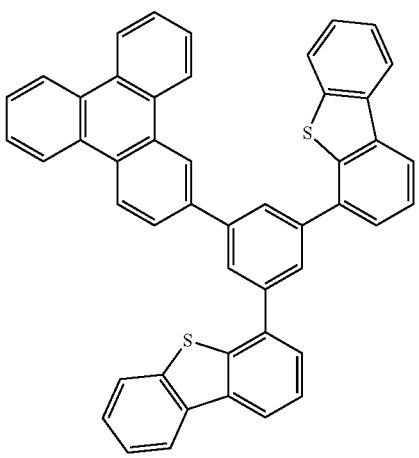
38G
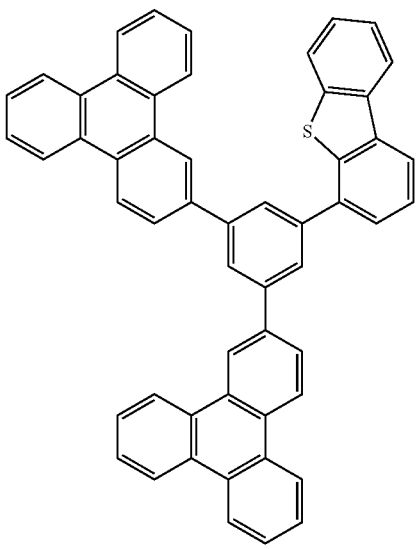

[Chem. 13]
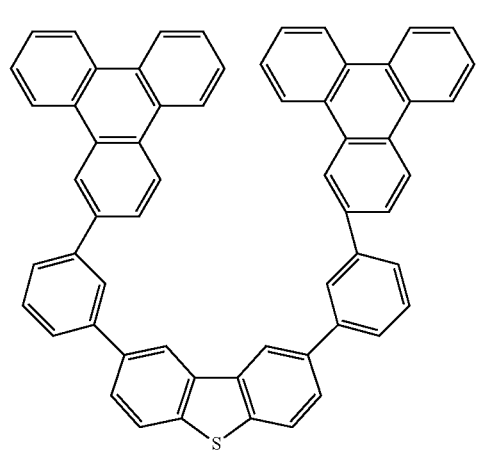 39G
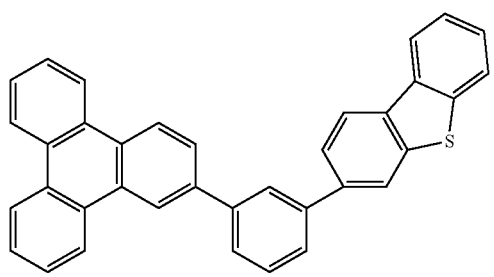 40G
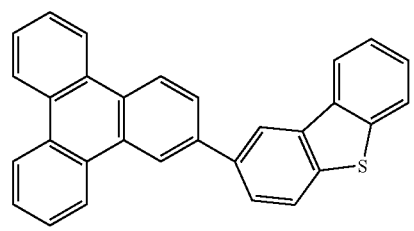 41G
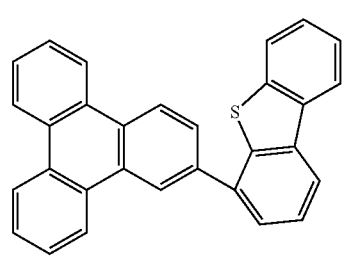 42G
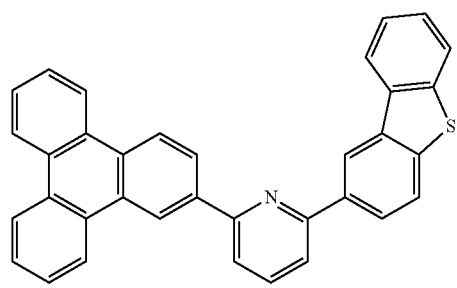 43G
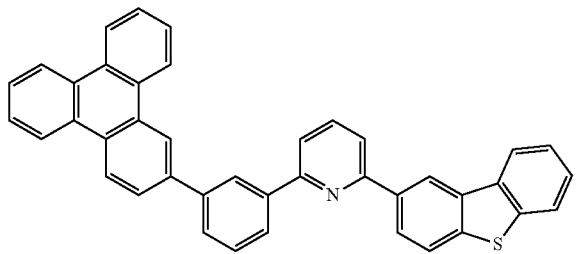 44G
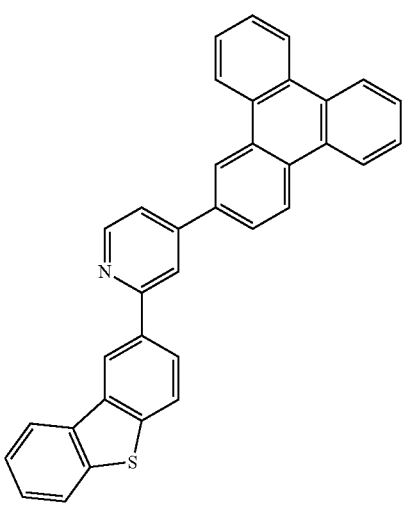 45G
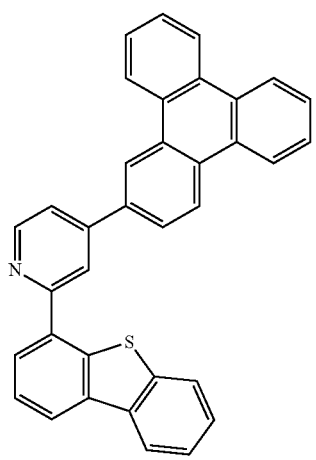 46G -continued

[Chem. 14]

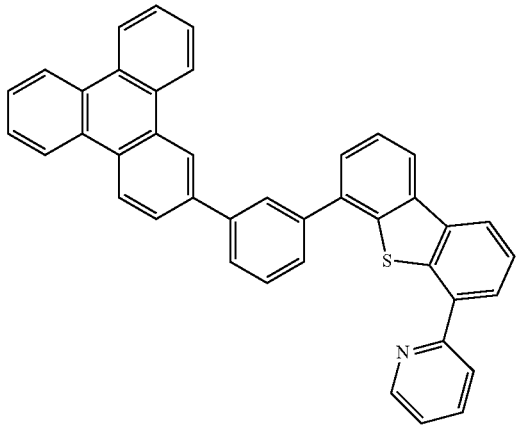

47G

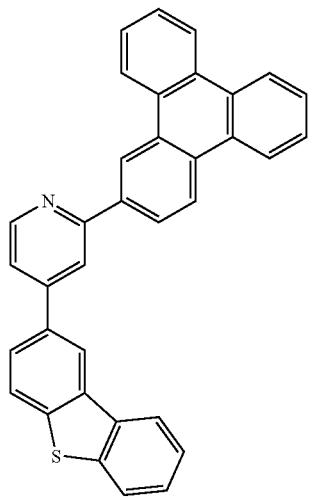

48G

Compounds exemplified as the compound represented by Formula (I) may be synthesized by a synthesis method described in International Publication No. 2009/021126 and the like.

In the present invention, the compound represented by Formula (I) is contained in a light emitting layer, but may be further contained in any layer in the organic layer without restricting the use thereof. Examples of an introducing layer of the compound represented by Formula (I) include any one of a light emitting layer, a hole injection layer, a hole transporting layer, an electron transporting layer, an electron injection layer, an exciton blocking layer, and a charge blocking layer.

The compound represented by Formula (I) is contained in an amount of preferably 0.1% by mass to 99% by mass, more preferably 1% by mass to 95% by mass, and still more preferably 10% by mass to 95% by mass, based on the total mass of the light emitting layer. When the compound represented by Formula (I) is further contained in a layer other than the light emitting layer, the compound is included in an amount of preferably 70% by mass to 100% by mass and more preferably 85% by mass to 100% by mass, based on the total mass of the layer.

[Compound Represented by Formula (II)]

Hereinafter, a compound represented by Formula (II) will be described.

[Chem. 15]

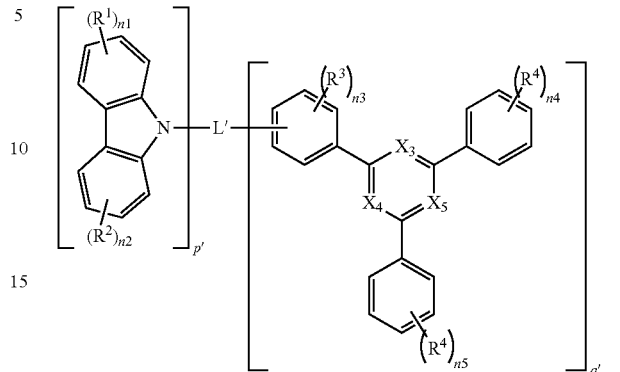

Formula (II)

(In Formula (II), each of $X_3$, $X_4$ and $X_5$ is independently a nitrogen atom, or a carbon atom having a hydrogen atom or a substituent bonded thereto, and the ring containing $X_3$, $X_4$ and $X_5$ is pyridine or pyrimidine. L' represents a single bond or a benzene ring. Each of $R^1$ to $R^5$ independently represents a fluorine atom, a methyl group, a phenyl group, a cyano group, a pyridyl group, a pyrimidyl group, a silyl group, a carbazolyl group, or a tert-butyl group. Each of n1 to n5 independently represents 0 or 1, and each of p' and q' independently represents 1 or 2.)

Each of $X_3$, $X_4$, and $X_5$ is independently a nitrogen atom or a hydrogen atom, or a carbon atom, and the ring containing $X_3$, $X_4$, and $X_5$ is pyridine or pyrimidine. $X_3$ is preferably a nitrogen atom. $X_4$ is preferably a carbon atom having a hydrogen atom bonded thereto, and $X_5$ is preferably a nitrogen atom. Furthermore, the ring containing $X_3$, $X_4$, and $X_5$ is more preferably pyrimidine.

L' represents a single bond or a benzene ring, and is preferably a benzene ring (in the case of a divalent group, a phenylene group). L' is linked to a benzene ring in a nitrogen-containing heteroaromatic structure in Formula (II).

Each of $R^1$ to $R^5$ independently represents a fluorine atom, a methyl group, a phenyl group, a cyano group, a pyridyl group, a pyrimidyl group, a silyl group, a carbazolyl group, or a tert-butyl group. $R^3$ is more preferably a pyrimidyl group, and still more preferably a pyrimidyl group having a phenyl group as a substituent.

When a plurality of $R^1$ to $R^5$ is present, each of $R^1$ to $R^5$ may be the same as or different from every other $R^1$ to $R^5$.

Each of n1 to n5 independently represents 0 or 1, and is preferably 0.

Each of p' and q' independently represents 1 or 2, and it is preferred that p' is 1 and q' is 1.

Each group represented by R' to $R^5$ and L' may additionally have a substituent if possible, and examples of the substituent include a halogen atom such as fluorine, chlorine, bromine, iodine and the like, a carbazole group, a hydroxyl group, a substituted or unsubstituted amino group, a nitro group, a cyano group, a silyl group, a trifluoromethyl group, a carbonyl group, a carboxyl group, a substituted or unsubstituted alkyl group, a substituted or unsubstituted alkenyl group, a substituted or unsubstituted arylalkyl group, a substituted or unsubstituted aromatic group, a substituted or unsubstituted aromatic heterocyclic group, a substituted or unsubstituted aralkyl group, a substituted or unsubstituted aryloxy group, a substituted or unsubstituted alkyloxy group and the like. Among them, a fluorine atom, a methyl group, a perfluorophenylene group, a phenyl group, a naphthyl group, a pyridyl group, a pyrazil group, a pyrimidyl group, an adamantyl group, a benzyl group, a nitro group, a cyano group, a silyl group, a trifluoromethyl group, a carbazolyl group and a group composed only of a combination thereof are preferred, a fluorine atom, a methyl group, a phenyl group, a pyridyl group, a pyrimidyl group, a cyano group, a silyl group, a carbazolyl group and a group composed only of a combination thereof are more preferred, a phenyl group, a pyridyl group, a pyrimidyl group, a carbazolyl group and a group composed only of a combination thereof are still more preferred, and a phenyl group is most preferred. Furthermore, when the group has a plurality of substituents, the substituents may combine with each other to form a ring.

When $X_3$, $X_4$, or $X_5$ is a carbon atom having a substituent bonded thereto, examples of the substituent include the aforementioned groups.

The compound represented by Formula (II) is most preferably composed only of a carbon atom, a hydrogen atom and a nitrogen atom.

The molecular weight of the compound represented by Formula (II) is preferably 400 to 1,000, more preferably 450 to 800, and still more preferably 500 to 700.

The lowest triplet excited state ($T_1$) energy of the compound represented by Formula (II) in the state of membrane is preferably 2.61 eV (62 kcal/mol) to 3.51 eV (80 kcal/mol), more preferably 2.69 eV (63.5 kcal/mol) to 3.51 eV (80 kcal/mol), and still more preferably 2.76 eV (65 kcal/mol) to 3.51 eV (80 kcal/mol).

The glass transition temperature (Tg) of the compound represented by Formula (II) is preferably 80° C. to 400° C., more preferably 100° C. to 400° C., and still more preferably 120° C. to 400° C.

When Formula (II) has a hydrogen atom, Formula (II) also includes isotopes (such as a deuterium atom and the like). In this case, all the hydrogen atoms in the compound may be substituted with the isotope and may also be a mixture in which a part thereof are a compound including the isotope.

Hereinafter, specific examples of the compound represented by Formula (II) will be exemplified, but the present invention is not limited thereto. Further, Ph in the following specific examples represents a phenyl group.

[Chem. 16]

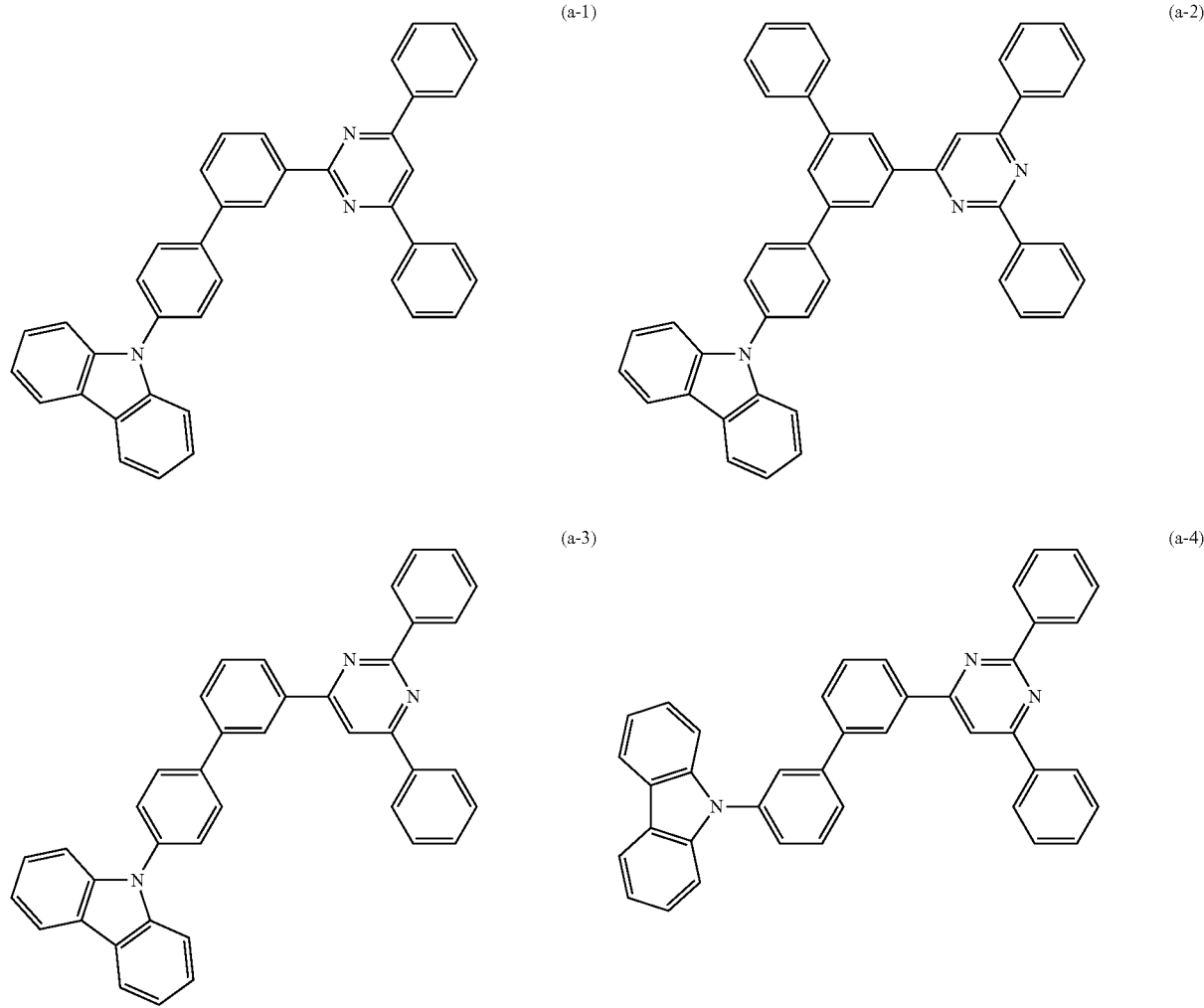

-continued
(a-5)
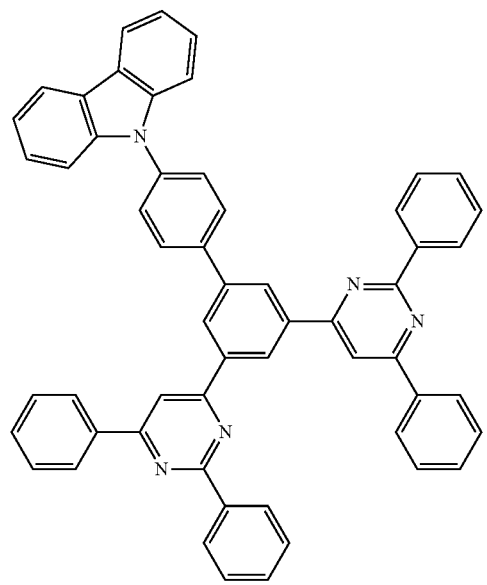
(a-6)
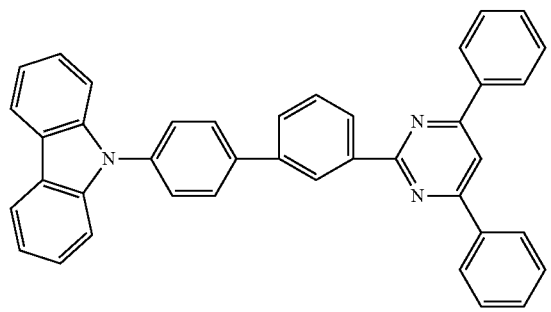
(a-7)
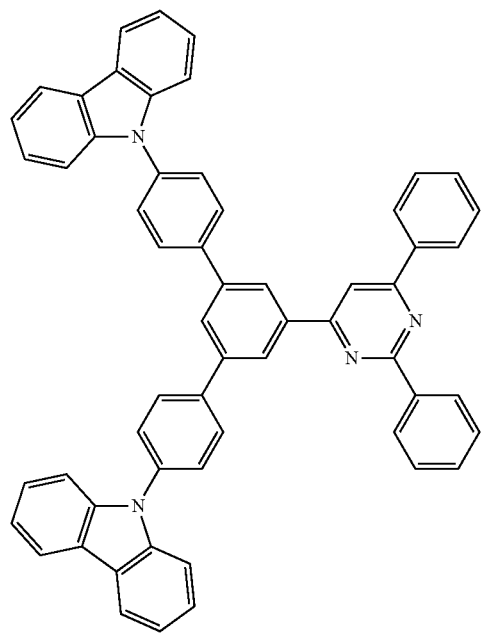
(a-8)
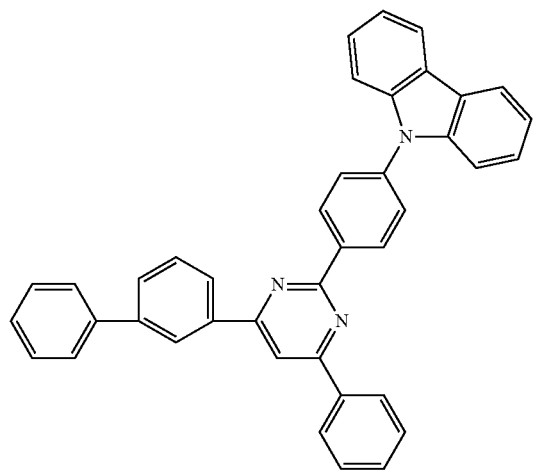
(a-9)
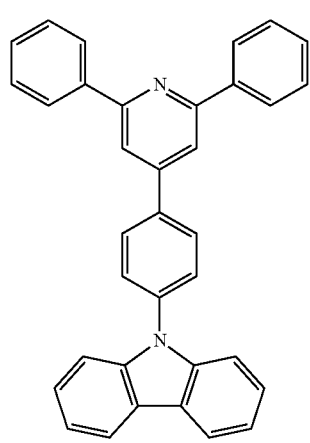
(a-10)
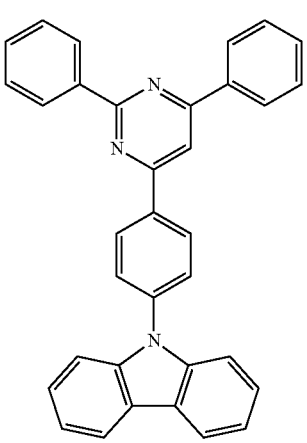

-continued
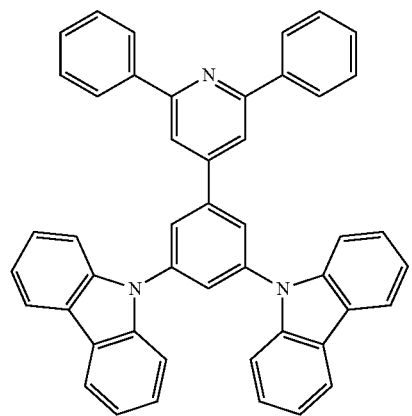
(a-11)
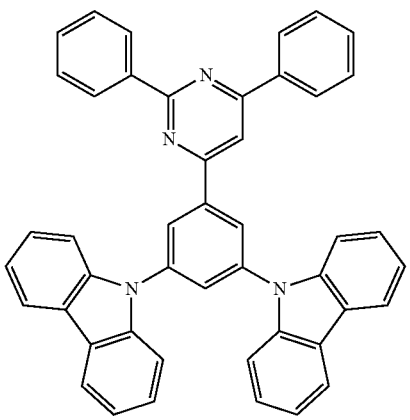
(a-12)
[Chem. 17]
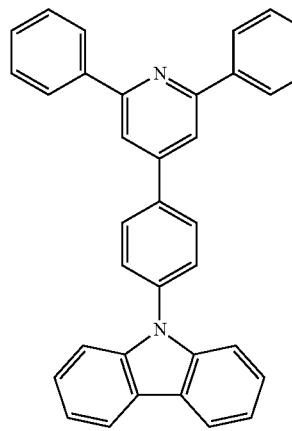
(a-13)
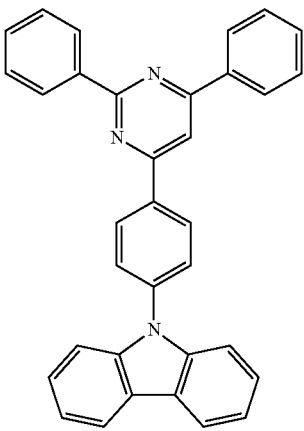
(a-14)
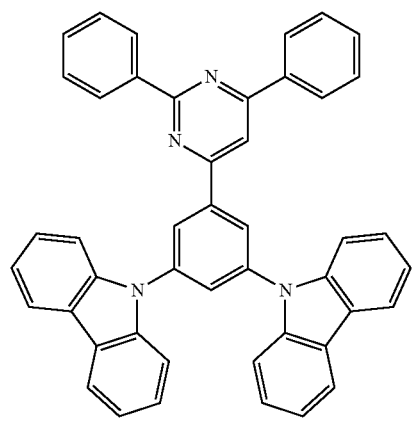
(a-15)
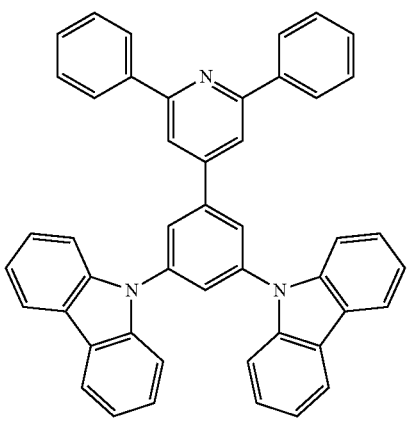
(a-16)

(a-17)
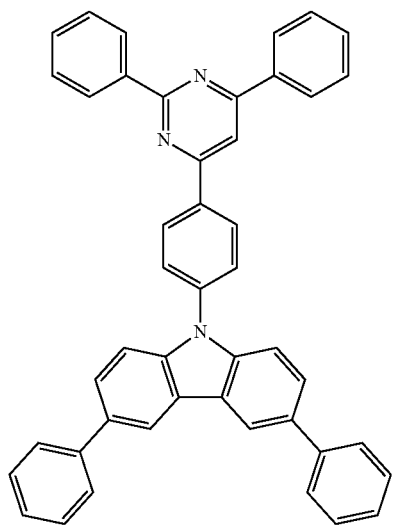
(a-18)
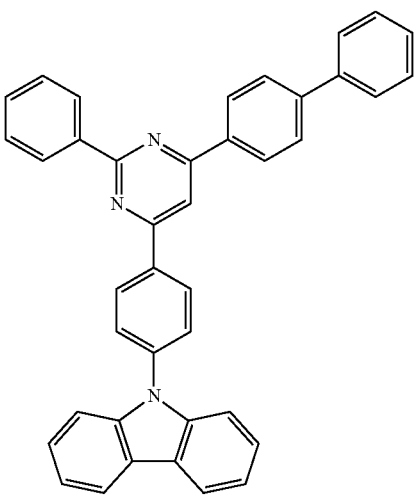
(a-19)
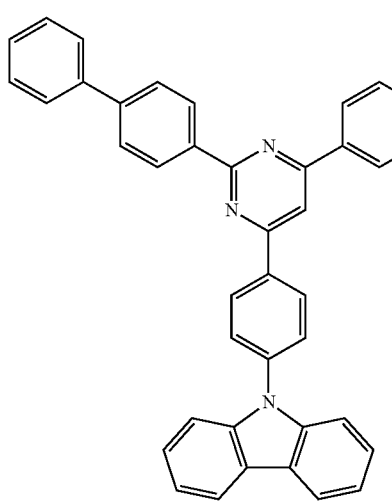
(a-20)
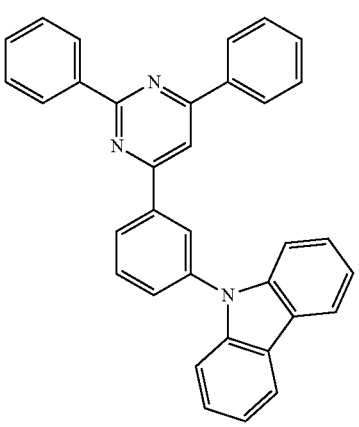
(a-17)
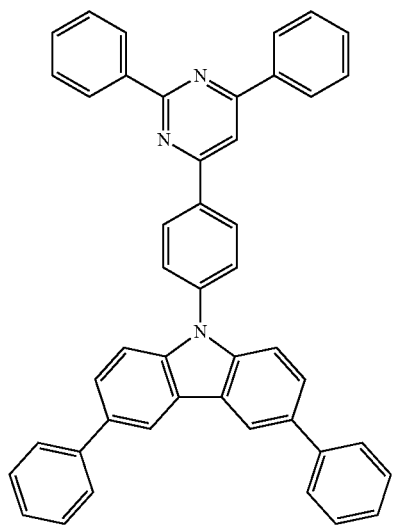
(a-18)
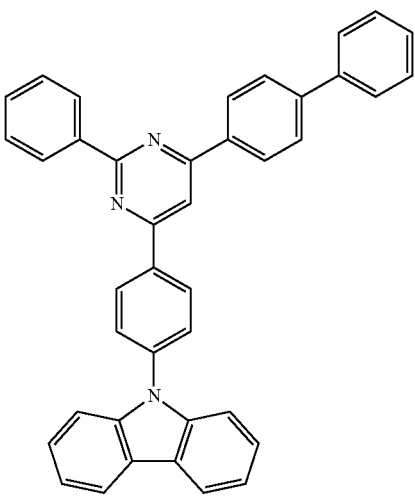

-continued
(a-21)
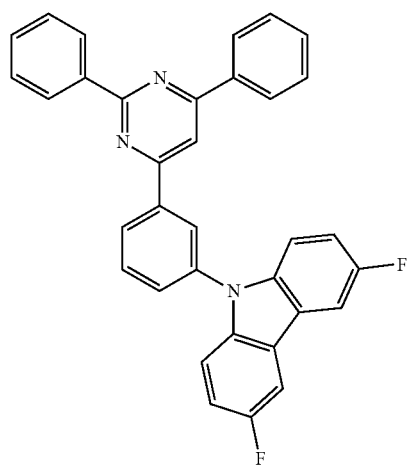
(a-22)
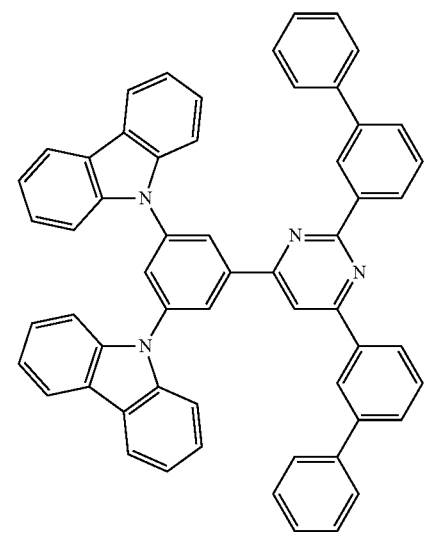
(a-23)
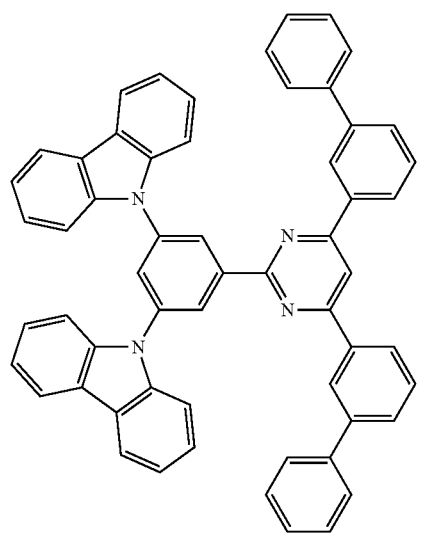
(a-24)
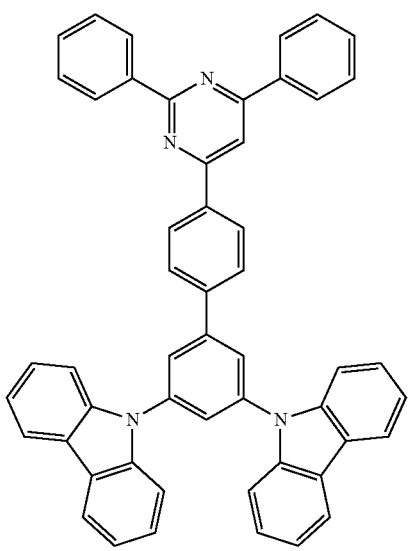
(a-25)
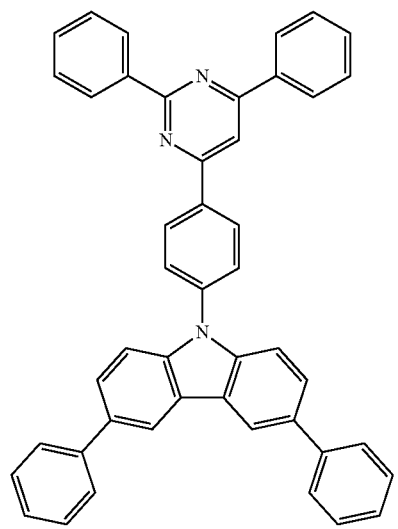

[Chem. 18]
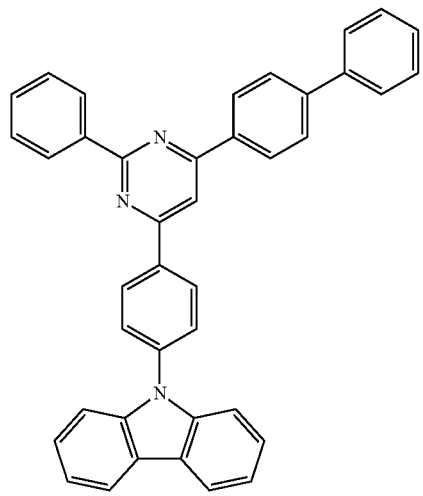 (a-26)
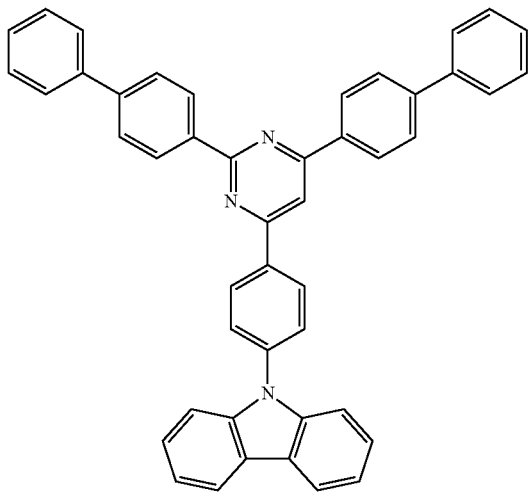 (a-27)
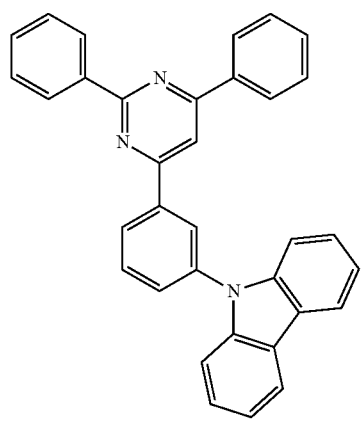 (a-28)
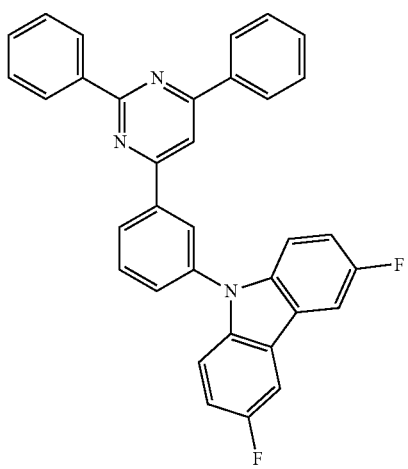 (a-29)
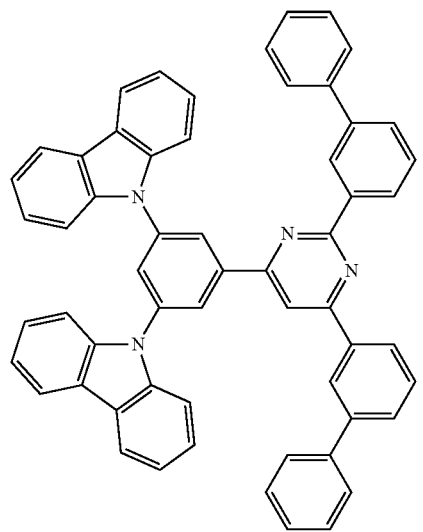 (a-30)
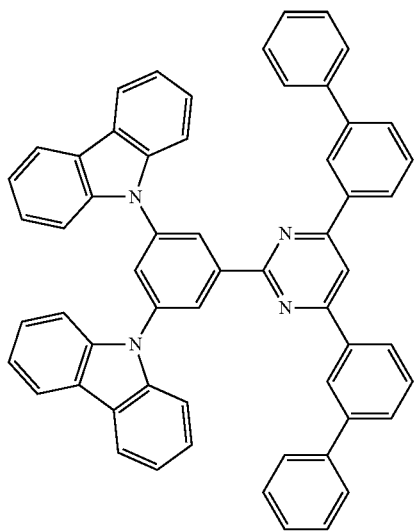 (a-31)

(a-32)
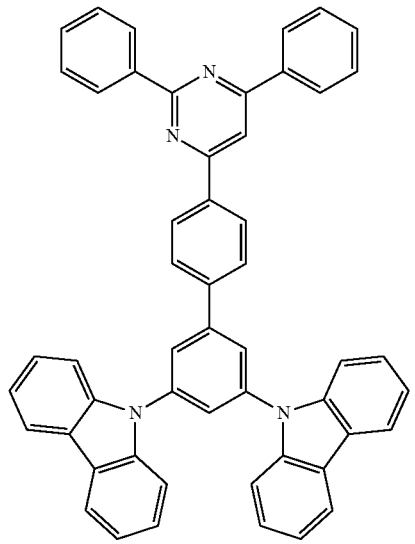
(a-33)
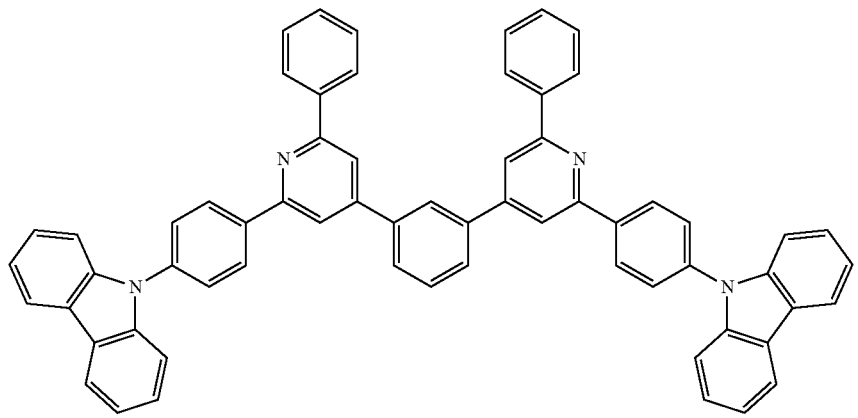
(a-34)
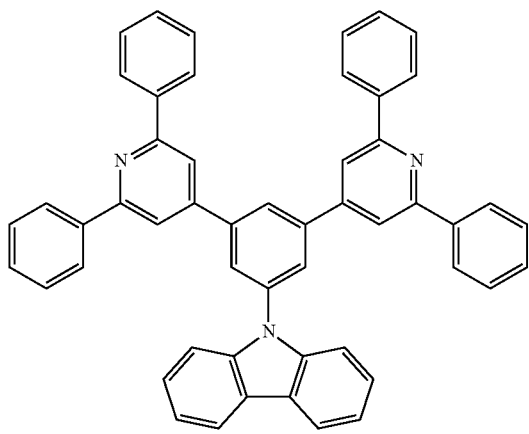
(a-35)
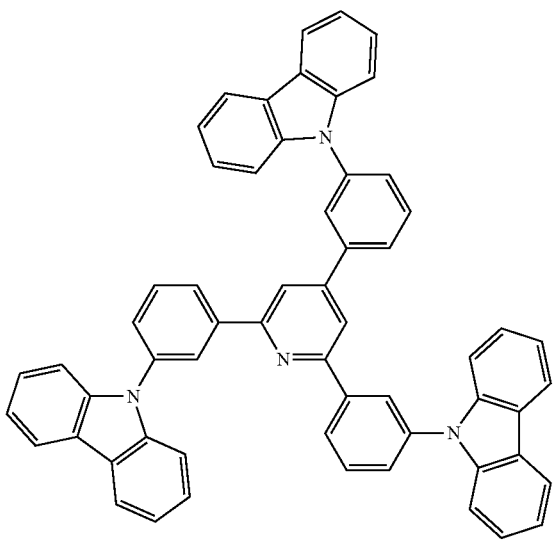

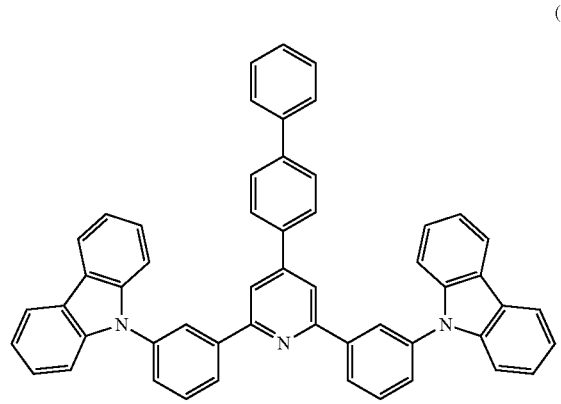
(a-36)
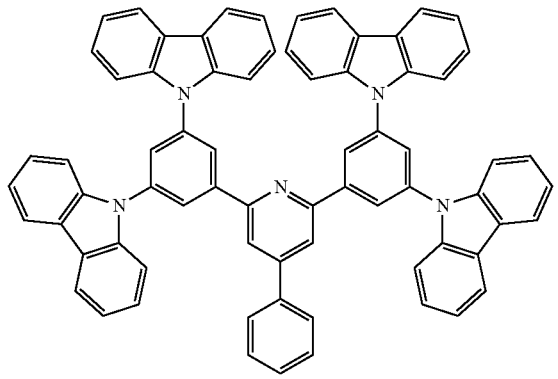
(a-37)
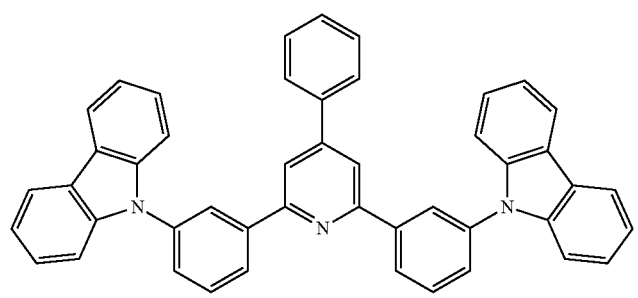
(a-38)
[Chem. 19]
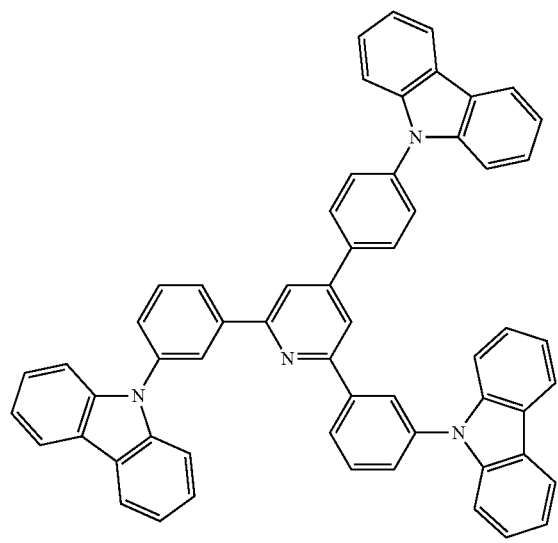
(a-39)
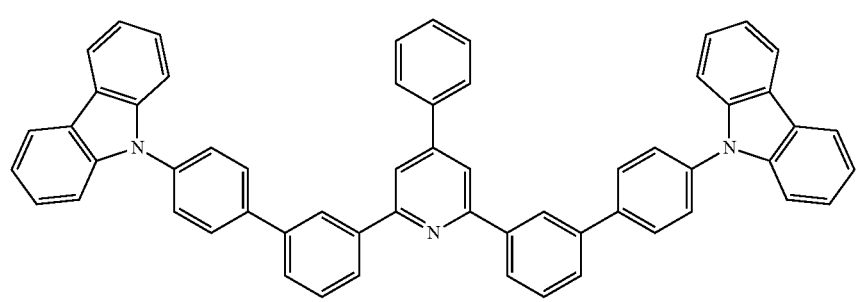
(a-40)

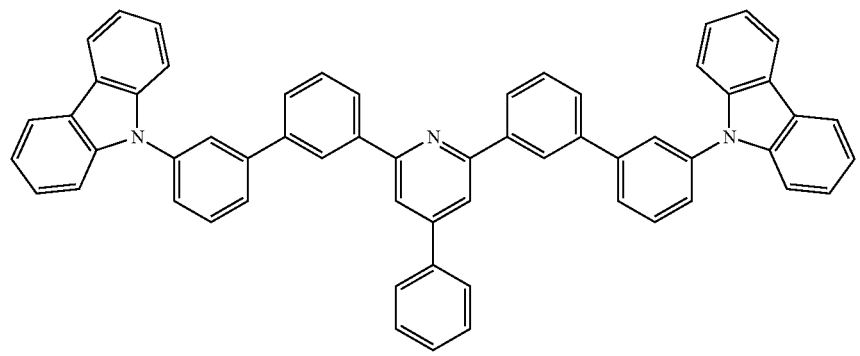
(a-41)
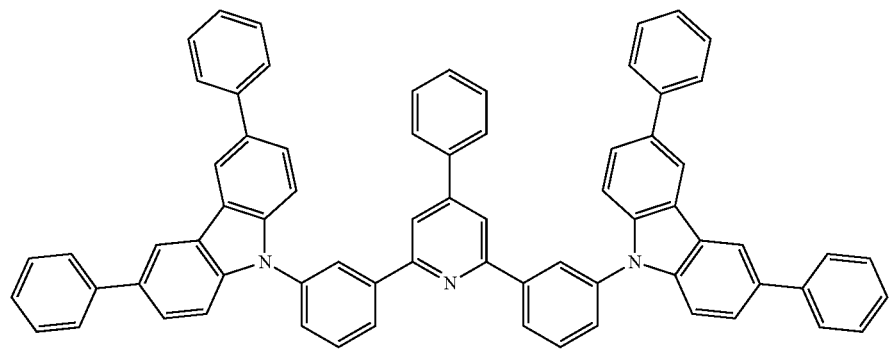
(a-42)
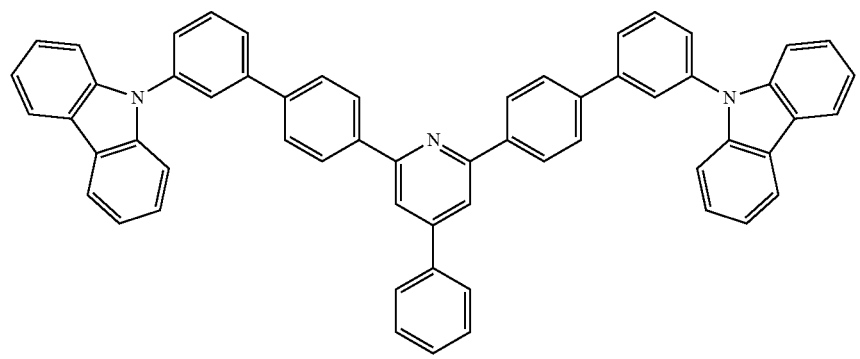
(a-43)
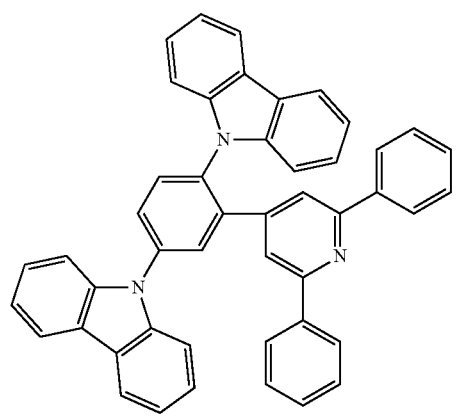
(a-44)
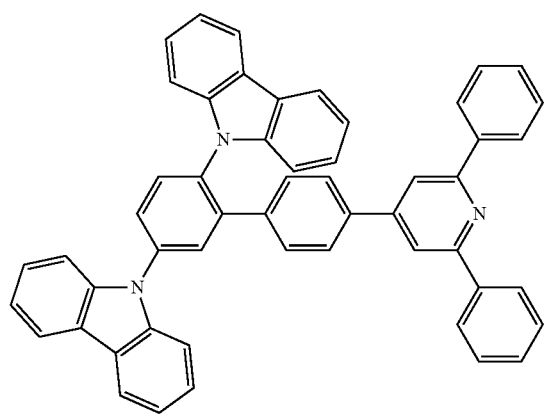
(a-45)

-continued
(a-46)
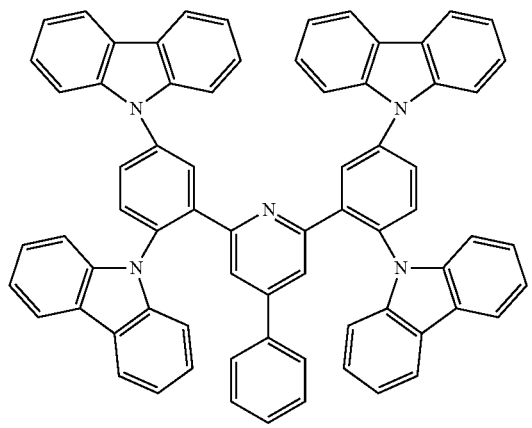
(a-47)
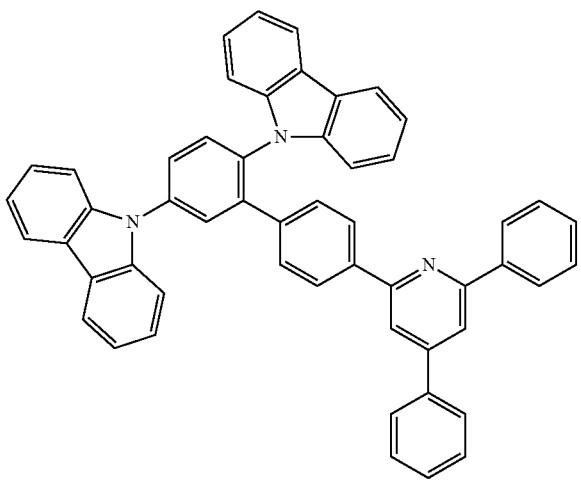
(a-48)
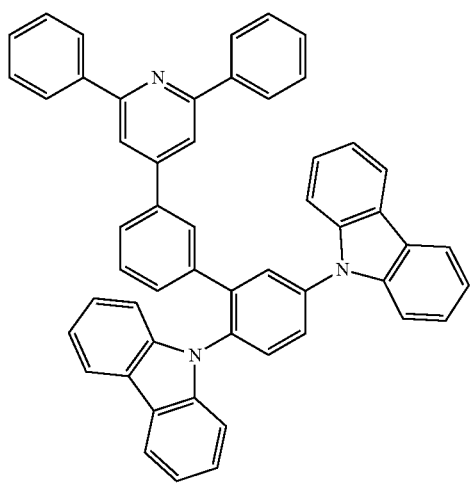
(a-49)
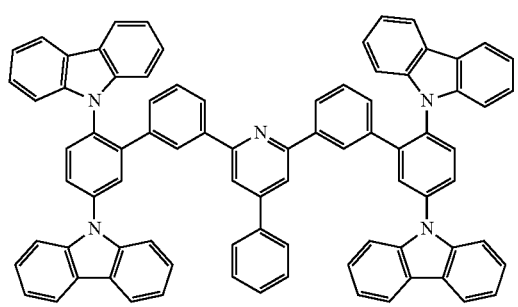
(a-50)
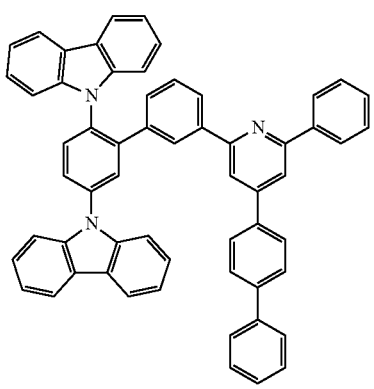

[Chem. 20]
(a-51)
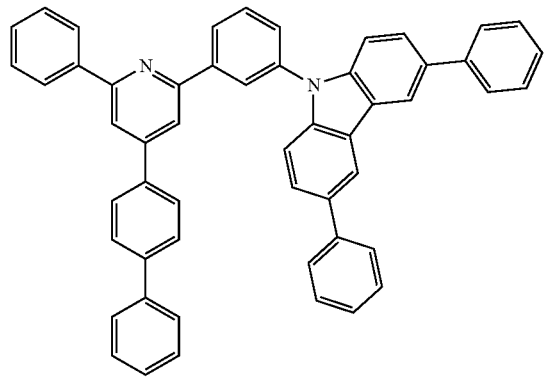
(a-52)
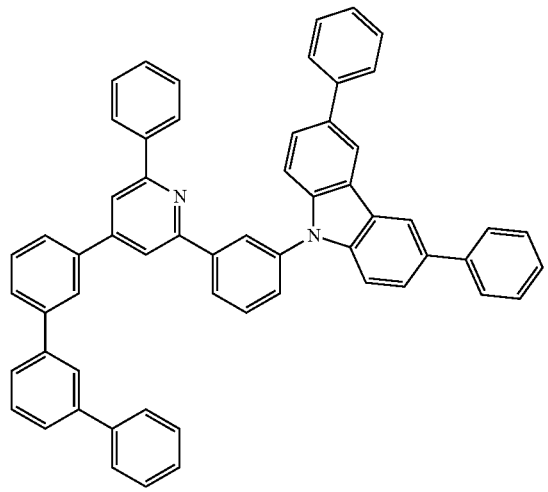
(a-53)
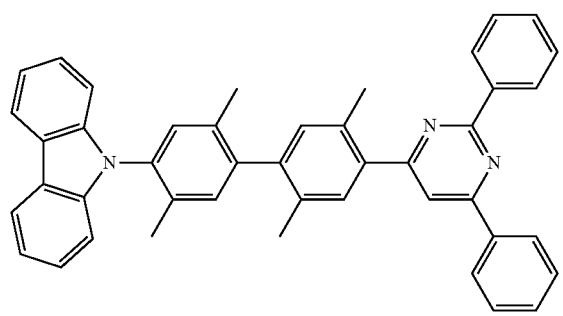
(a-54)
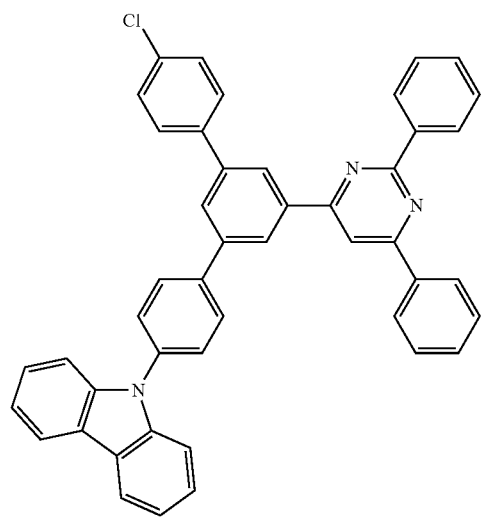
(a-55)
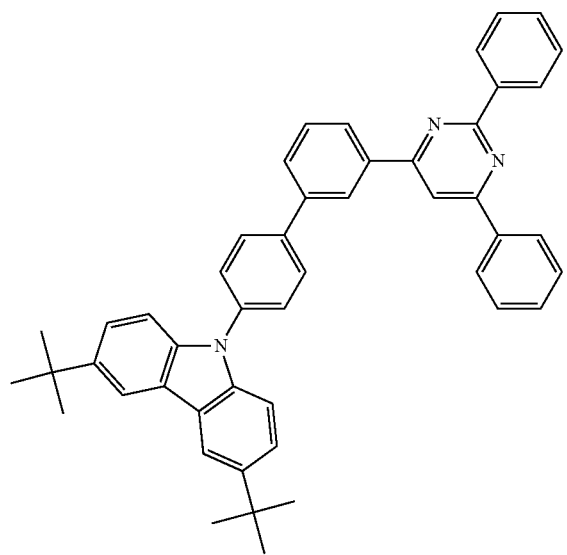
(a-56)
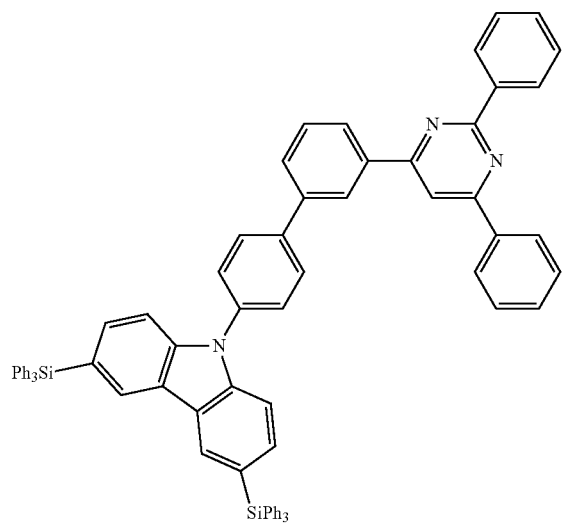

-continued
(a-57)
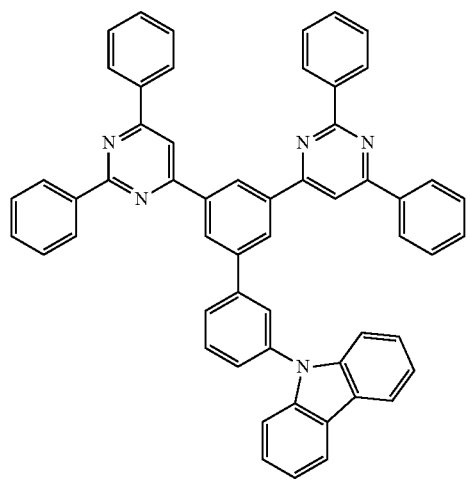
(a-58)
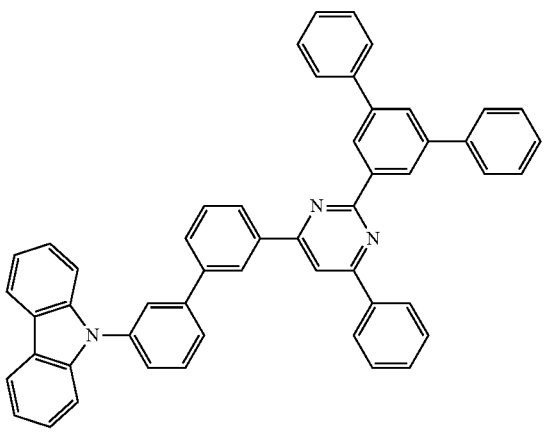
(a-59)
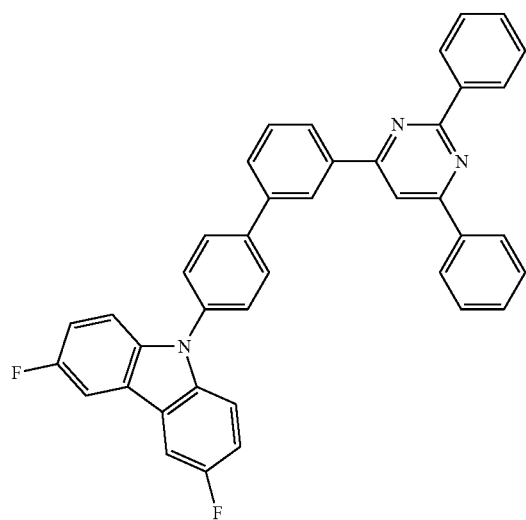
(a-60)
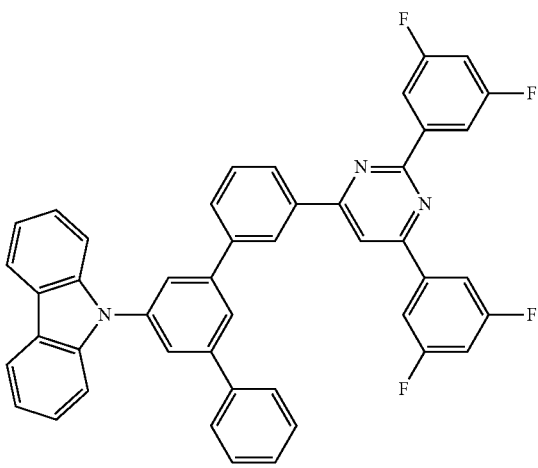
(a-61)
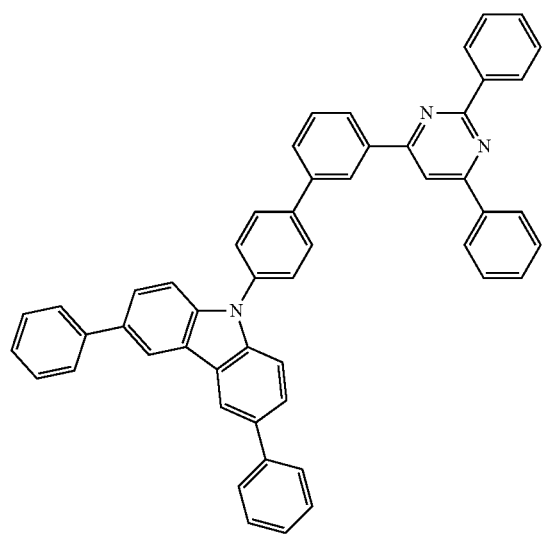
(a-62)
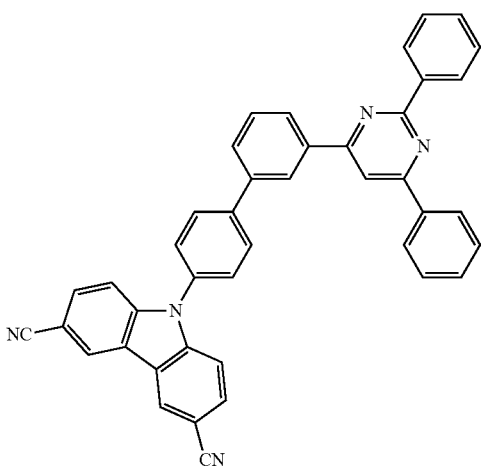

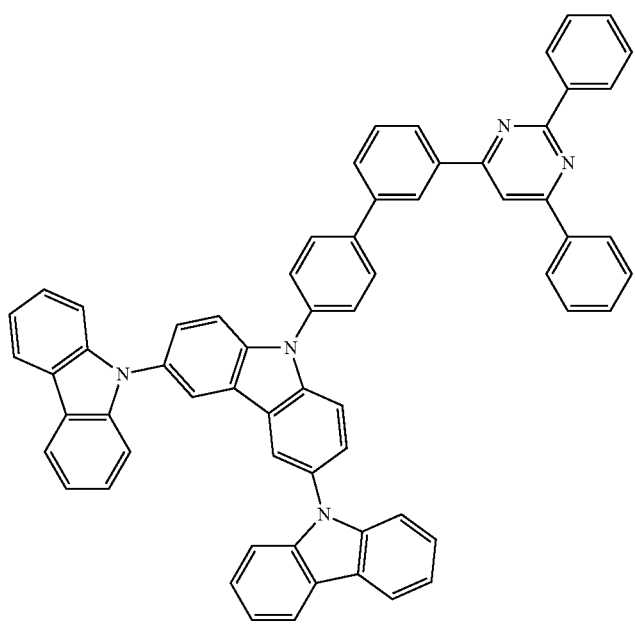

(a-63)

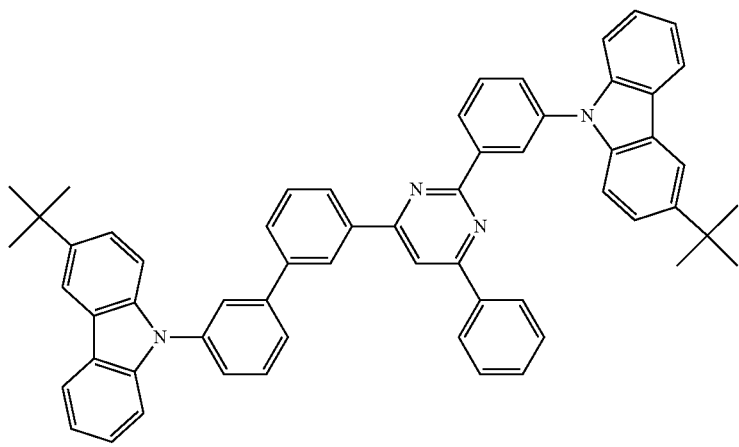

(a-64)

The compounds exemplified as the compound represented by Formula (II) may be synthesized by various methods such as a method described in the pamphlet of International Publication No. 03/080760, a method described in the pamphlet of International Publication No. 03/078541, a method described in the pamphlet of International Publication No. 05/085387 and the like.

For example, the exemplary compound (a-3) may be synthesized by a method described in Paragraph [0074] to [0075] of the pamphlet of International Publication No. 05/085387 (from page 45, line 11 to page 46, line 18) using m-bromobenzoaldehyde as a starting material. The exemplary compound (a-17) may be synthesized by a method described in page 46, line 9 to page 46, line 12 of the pamphlet of International Publication No. 03/080760 using 3,5-dibromobenzoaldehyde as a starting material. Further, the exemplary compound (a-36) may be synthesized by a method described in page 137, line 10 to page 139, line 9 of International Publication No. 05/022962 using N-phenylcarbazole as a starting material.

After the synthesis, it is preferred that purification by column chromatography, recrystallization and the like is performed, and then purification is performed by sublimation purification. By sublimation purification, organic impurities may be separated and inorganic salts, residual solvents and the like may be effectively removed.

The introducing layer of the compound represented by Formula (II) is not particularly limited as long as the layer is an organic layer present between a light emitting layer and a cathode, but examples thereof include an electron transporting layer, an electron injection layer, an exciton blocking layer, a charge blocking layer (for example, a hole blocking layer) and the like. Among them, the electron transporting layer is preferred.

In a layer containing the compound represented by Formula (II), the content of the compound is preferably 70% by mass to 100% by mass and more preferably 85% by mass to 100% by mass, based on the total mass of the layer.

[Organic Electroluminescence Device]

The device of the present invention will be described in detail.

The organic electroluminescence device of the present invention includes a pair of electrodes composed of an anode and a cathode, a light emitting layer between the electrodes, and at least one organic layer between the light emitting layer and the cathode, in which the light emitting layer contains at least one compound represented by Formula (I) and at least one layer of the organic layers between the light emitting layer and the cathode contains at least one compound represented by Formula (II).

The organic electroluminescence device of the present invention again includes at least one organic layer between a light emitting layer and a cathode, in which the light emitting layer is an organic layer, but may additionally have an organic layer.

Due to properties of the luminescence device, at least one of the anode and the cathode is preferably transparent or semi-transparent.

FIG. 1 illustrates an example of the configuration of an organic electroluminescence device according to the present invention.

An organic electroluminescence device 10 according to the present invention, which is illustrated in FIG. 1, has a light emitting layer 6 interposed between an anode 3 and a cathode 9 on a supporting substrate 2. Specifically, a hole injection layer 4, a hole transporting layer 5, the light emitting layer 6, a hole blocking layer 7 and an electron transporting layer 8 are stacked in this order between the anode 3 and the cathode 9.

<Configuration of Organic Layer>

The layer configuration of the organic layer is not particularly limited and may be appropriately selected depending on the use and purpose of the organic electroluminescence device, but is preferably formed on the transparent electrode or the back electrode. In this case, the organic layer is formed on the front surface or one surface on the transparent electrode or the back electrode.

The shape, size, thickness and the like of the organic layer are not particularly limited and may be appropriately selected depending on the purpose thereof.

The specific layer configuration may include the followings, but the present invention is not limited to the configurations.

- Anode/hole transporting layer/light emitting layer/electron transporting layer/cathode
- Anode/hole transporting layer/light emitting layer/blocking layer/electron transporting layer/cathode
- Anode/hole transporting layer/light emitting layer/blocking layer/electron transporting layer/electron injection layer/cathode
- Anode/hole injection layer/hole transporting layer/light emitting layer/electron transporting layer/electron injection layer/cathode
- Anode/hole injection layer/hole transporting layer/light emitting layer/blocking layer/electron transporting layer/cathode
- Anode/hole injection layer/hole transporting layer/light emitting layer/blocking layer/electron transporting layer/electron injection layer/cathode The device configuration, substrate, cathode, and anode of the organic electroluminescence device are described in detail in, for example, Japanese Patent Application Laid-Open No. 2008-270736, and the subject matters described in the publication may be applied to the present invention.

<Substrate>

It is preferred that the substrate which is used in the present invention is a substrate which does not scatter or decay light generated from the organic layer. In the case of an organic material, it is preferred that the organic material has excellent heat resistance, dimensional stability, solvent resistance, electrical insulation properties and processibility.

<Anode>

Typically, the anode may have a function as an electrode for supplying a hole into the organic layer, is not particularly limited with respect to the shape, structure, size, and the like thereof and may be appropriately selected among known electrode materials depending on the use and purpose of the luminescence device. As described above, the anode is usually provided as a transparent anode.

<Cathode>

Typically, the cathode may have a function as an electrode for injecting an electron into the organic layer, is not particularly limited with respect to the shape, structure, size, and the like thereof, and may be appropriately selected among known electrode materials depending on the use and purpose of the luminescence device.

With respect to the substrate, the anode, and the cathode, the subject matters described in paragraph Nos. [0070] to [0089] of Japanese Patent Application Laid-Open No. 2008-270736 may be applied to the present invention.

<Organic Layer>

The organic layer in the present invention will be described.

[Formation of Organic Layer]

In the organic electroluminescence device of the present invention, each organic layer may be appropriately formed by any one of dry film-forming methods such as a vapor deposition method, a sputtering method and the like, and solution application processes such as a transfer method, a printing method, a spin-coat method, a bar-coat method and the like. In the device of the present invention, it is preferred that at least one layer of a light emitting layer, an organic layer between the light emitting layer and a cathode, and other organic layers present between the anode and the cathode are formed by the solution application process.

[Light Emitting Layer]

The light emitting layer is a layer having functions of accepting a hole from the anode, the hole injection layer or the hole transporting layer, accepting an electron from the cathode, the electron injection layer or the electron transporting layer and providing a site of recombination of the hole and the electron, at the time of applying an electric field, thereby achieving light emission.

The substrate, the anode, the cathode, the organic layer and the light emitting layer are described in detail in, for example, Japanese Patent Application Laid-Open No. 2008-270736 and Japanese Patent Application Laid-Open No. 2007-266458, and the subject matters described in these publications may be applied to the present invention. Further, the light emitting layer may include a material which does not have a charge transportability nor emit light.

(Light Emitting Material)

As the light emitting material in the present invention, any of a phosphorescent light emitting material, a fluorescent light emitting material and the like may be used.

The light emitting layer in the present invention may contain two or more of the light emitting materials in order to improve color purity or to expand a light emitting wavelength region. At least one of the light emitting materials is preferably a phosphorescent light emitting material.

From the viewpoint of driving durability, it is preferred that the light emitting material in the present invention satisfies a relationship of 1.2 eV>$\Delta$Ip>0.2 eV and/or 1.2 eV>$\Delta$Ea>0.2 eV with the host material. Here, $\Delta$Ip and $\Delta$Ea mean a difference between Ip values (ionization potential) of the host material and the light emitting material and a difference between Ea values (electron affinity) of the host material and the light emitting material, respectively.

At least one of the light emitting materials is preferably a platinum complex material or an iridium complex material, and more preferably an iridium complex material.

The fluorescent light emitting material and the phosphorescent light emitting material are described in detail in, for example, paragraph Nos. [0100] to [0164] of Japanese Patent Application Laid-Open No. 2008-270736 and paragraph Nos. [0088] to [0090] of Japanese Patent Application Laid-Open No. 2007-266458, and the subject matters described in these publications may be applied to the present invention.

From the viewpoint of light emission efficiency and the like, phosphorescent light emitting materials are preferred. Examples of the phosphorescent light emitting material which may be used in the present invention include phosphorescent light emitting compounds, and the like described in the patent documents such as U.S. Pat. No. 6,303,238B1, U.S. Pat. No. 6,097,147, WO00/57676, WO00/70655, WO01/08230, WO01/39234A2, WO01/41512A1, WO02/02714A2, WO02/15645A1, WO02/44189A1, WO05/19373A2, Japanese Patent Application Laid-Open Nos. 2001-247859, 2002-302671, 2002-117978, 2003-133074, 2002-235076, 2003-123982, and 2002-170684, EP1211257, Japanese Patent Application Laid-Open Nos. 2002-226495, 2002-234894, 2001-247859, 2001-298470, 2002-173674, 2002-203678, 2002-203679, 2004-357791, 2006-256999, 2007-19462, 2007-84635, 2007-96259, and the like, and among them, examples of an still more preferred light emitting dopant include an Ir complex, a Pt complex, a Cu complex, a Re complex, a W complex, a Rh complex, a Ru complex, a Pd complex, an Os complex, an Eu complex, a Tb complex, a Gd complex, a Dy complex and a Ce complex. An Ir complex, a Pt complex or a Re complex is particularly preferred, and among them, an Ir complex, a Pt complex, or a Re complex including at least one coordination mode of a metal-carbon bond, a metal-nitrogen bond, a metal-oxygen bond and a metal-sulfur bond is preferred. In addition, from the viewpoint of light emission efficiency, driving durability, chromaticity and the like, an Ir complex and a Pt complex are particularly preferred, and an Ir complex is most preferred.

A platinum complex is preferably a platinum complex represented by the following Formula (C-1).

[Chem. 21]

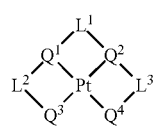

(C-1)

(In the formula, each of $Q^1$, $Q^2$, $Q^3$ and $Q^4$ independently represents a ligand which is coordinated to Pt. Each of $L^1$, $L^2$ and $L^3$ independently represents a single bond or a divalent linking group.)

Formula (C-1) will be described. Each of $Q^1$, $Q^2$, $Q^3$ and $Q^4$ independently represents a ligand which is coordinated to Pt. At this time, the bond of $Q^1$, $Q^2$, $Q^3$ and $Q^4$ to Pt may be any of a covalent bond, an ionic bond, a coordination bond and the like. As an atom bound to Pt in $Q^1$, $Q^2$, $Q^3$ and $Q^4$, a carbon atom, a nitrogen atom, an oxygen atom, a sulfur atom and a phosphorus atom are preferred, and among the atoms bound to Pt in $Q^1$, $Q^2$, $Q^3$ and $Q^4$, it is preferred that at least one of the atoms is a carbon atom, it is more preferred that two of the atoms are a carbon atom, and it is particularly preferred that two of the atoms are a carbon atom and the other two are a nitrogen atom.

$Q^1$, $Q^2$, $Q^3$ and $Q^4$ bound to Pt with a carbon atom may be an anionic ligand or a neutral ligand, and examples of the anionic ligand include a vinyl ligand, an aromatic hydrocarbon ring ligand (for example, a benzene ligand, a naphthalene ligand, an anthracene ligand, a phenanthrene ligand and the like), a heterocyclic ligand (for example, a furan ligand, a thiophene ligand, a pyridine ligand, a pyrazine ligand, a pyrimidine ligand, a pyridazine ligand, a triazine ligand, a thiazole ligand, an oxazole ligand, a pyrrole ligand, an imidazole ligand, a pyrazole ligand, a triazole ligand and a condensed ring body including the same (for example, a quinoline ligand, a benzothiazole ligand and the like)). Examples of the neutral ligand include a carbene ligand.

$Q^1$, $Q^2$, $Q^3$ and $Q^4$ bound to Pt with a nitrogen atom may be a neutral ligand or an anionic ligand, and examples of the neutral ligand include a nitrogen-containing aromatic heterocyclic ligand (a pyridine ligand, a pyrazine ligand, a pyrimidine ligand, a pyridazine ligand, a triazine ligand, an imidazole ligand, a pyrazole ligand, a triazole ligand, an oxazole ligand, a thiazole ligand, and a condensed ring body including the same (for example, a quinoline ligand, a benzoimidazole ligand and the like)), an amine ligand, a nitrile ligand and an imine ligand. Examples of the anionic ligand include an amino ligand, an imino ligand, a nitrogen-containing aromatic heterocyclic ligand (a pyrrole ligand, an imidazole ligand, a triazole ligand, and a condensed ring body including the same (for example, an indole ligand, a benzoimidazole ligand and the like)).

$Q^1$, $Q^2$, $Q^3$ and $Q^4$ bound to Pt with an oxygen atom may be a neutral ligand or an anionic ligand, and examples of the neutral ligand include an ether ligand, a ketone ligand, an ester ligand, an amide ligand and an oxygen-containing heterocyclic ligand (a furan ligand, an oxazole ligand and a condensed ring body including the same (a benzoxazole ligand and the like)). Examples of the anionic ligand include an alkoxy ligand, an aryloxy ligand, a heteroaryloxy ligand, an acyloxy ligand, a silyloxy ligand and the like.

$Q^1$, $Q^2$, $Q^3$, and $Q^4$ bound to Pt with a sulfur atom may be a neutral ligand or an anionic ligand, and examples of the neutral ligand include a thioether ligand, a thioketone ligand, a thioester ligand, a thioamide ligand and a sulfur-containing heterocyclic ligand (a thiophene ligand, a thiazole ligand and a condensed ring body including the same (a benzothiazole ligand and the like)). Examples of the anionic ligand include an alkyl mercapto ligand, an aryl mercapto ligand, a heteroaryl mercapto ligand and the like.

$Q^1$, $Q^2$, $Q^3$ and $Q^4$ bound to Pt with a phosphorus atom may be a neutral ligand or an anionic ligand, and examples of the neutral ligand include a phosphine ligand, a phosphoric ester ligand, a phosphorous acid ester ligand and a phosphorus-containing heterocyclic ligand (a phosphinine ligand and the like) and examples of the anionic ligand include a phosphino ligand, a phosphinyl ligand, a phosphoryl ligand and the like.

The group represented by $Q^1$, $Q^2$, $Q^3$, and $Q^4$ may have a substituent, and as the substituent, those exemplified above for Group A of substituents may be appropriately applied. Furthermore, the substituents may be linked to each other (when $Q^3$ and $Q^4$ are linked to each other, a Pt complex of a cyclic tetradentate ligand is formed).

The group represented by $Q^1$, $Q^2$, $Q^3$, and $Q^4$ is preferably an aromatic hydrocarbon ring ligand bound to Pt with a carbon atom, an aromatic heterocyclic ligand bound to Pt with a carbon atom, a nitrogen-containing aromatic heterocyclic ligand bound to Pt with a nitrogen atom, an acyloxy ligand, an alkyloxy ligand, an aryloxy ligand, a heteroaryloxy ligand and a silyloxy ligand, more preferably an aromatic hydrocarbon ring ligand bound to Pt with a carbon atom, an aromatic heterocyclic ligand bound to Pt with a carbon atom, a nitrogen-containing aromatic heterocyclic ligand bound to Pt with a nitrogen atom, an acyloxy ligand and an aryloxy ligand, and still more preferably an aromatic hydrocarbon ring ligand bound to Pt with a carbon atom, an aromatic heterocyclic ligand bound to Pt with a carbon atom, a nitrogen-containing aromatic heterocyclic ligand bound to Pt with a nitrogen atom and an acyloxy ligand.

$L^1$, $L^2$ and $L^3$ represent a single bond or a divalent linking group. Examples of the divalent linking group represented by $L^1$, $L^2$ and $L^3$ include an alkylene group (methylene, ethylene, propylene and the like), an arylene group (phenylene and naphthalenediyl), a heteroarylene group (pyridinediyl, thiophenediyl and the like), an imino group (—NR—) (a phenylimino group and the like), an oxy group (—O—), a thio group (—S—), a phosphinidene group (—PR—) (a phenylphosphinidene group and the like), a silylene group (—SiRR'—) (a dimethylsilylene group, a diphenylsilylene group and the like) or a combination thereof. Here, each of R and R' independently represents an alkyl group, an aryl group and the like. These linking groups may further have a substituent.

From the viewpoint of stability and light emission quantum yield of the complex, $L^1$, $L^2$ and $L^3$ are preferably a single bond, an alkylene group, an arylene group, a heteroarylene group, an imino group, an oxy group, a thio group and a silylene group, more preferably a single bond, an alkylene group, an arylene group and an imino group, further preferably a single bond, an alkylene group and an arylene group, even further preferably a single bond, a methylene group and a phenylene group, still more preferably a single bond and a di-substituted methylene group, even still further preferably a single bond, a dimethylmethylene group, a diethylmethylene group, a diisobutylmethylene group, a dibenzylmethylene group, an ethylmethylmethylene group, a methylpropylmethylene group, an isobutylmethylmethylene group, a diphenylmethylene group, a methylphenylmethylene group, a cyclohexanediyl group, a cyclopentanediyl group, a fluorenediyl group and a fluoromethylmethylene group.

$L^1$ is particularly preferably a dimethylmethylene group, a diphenylmethylene group and a cyclohexanediyl group, and most preferably a dimethylmethylene group.

$L^2$ and $L^3$ are most preferably a single bond.

A platinum complex represented by Formula (C-1) is more preferably a platinum complex represented by the following Formula (C-2).

[Chem. 22]

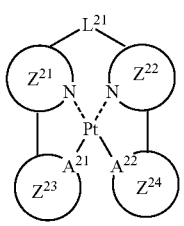

Formula (c-2)

(In the formula, $L^{21}$ represents a single bond or a divalent linking group. Each of $A^{21}$ and $A^{22}$ independently represents a carbon atom or a nitrogen atom. Each of $Z^{21}$ and $Z^{22}$ independently represents a nitrogen-containing aromatic heterocyclic ring. Each of $Z^{23}$ and $Z^{24}$ independently represents a benzene ring or an aromatic heterocyclic ring.)

Formula (C-1) will be described. $L^{21}$ has the same meaning as $L^{21}$ in Formula (C-1), and preferred ranges thereof are also the same.

Each of $A^{21}$ and $A^{22}$ independently represents a carbon atom or a nitrogen atom. It is preferred that at least one of $A^{21}$ and $A^{22}$ is a carbon atom, and it is preferred that both $A^{21}$ and $A^{22}$ are a carbon atom from the viewpoint of stability of the complex and light emission quantum yield of the complex.

Each of $Z^{21}$ and $Z^{22}$ independently represents a nitrogen-containing aromatic heterocyclic ring. Examples of the nitrogen-containing aromatic heterocyclic ring represented by $Z^{21}$ and $Z^{22}$ include a pyridine ring, a pyrimidine ring, a pyrazine ring, a triazine ring, an imidazole ring, a pyrazole ring, an oxazole ring, a thiazole ring, a triazole ring, an oxadiazole ring, a thiadiazole ring and the like. From the viewpoint of stability, control of light emission wavelength and light emission quantum yield of the complex, the ring represented by $Z^{21}$ and $Z^{22}$ is preferably a pyridine ring, a pyrazine ring, an imidazole ring and a pyrazole ring, more preferably a pyridine ring, an imidazole ring and a pyrazole ring, still more preferably a pyridine ring and a pyrazole ring, and particularly preferably a pyridine ring.

The nitrogen-containing aromatic heterocyclic ring represented by $Z^{21}$ and $Z^{22}$ may have a substituent, and as a substituent on the carbon atom, the group A of substituents may be applied, and as a substituent on the nitrogen atom, the group B of substituents may be applied. The substituent on the carbon atom is preferably an alkyl group, a perfluoroalkyl group, an aryl group, an aromatic heterocyclic group, a dialkylamino group, a diarylamino group, an alkoxy group, a cyano group and a fluorine atom. The substituent is appropriately selected for the purpose of controlling the light emission wavelength or potential, but in the case of making the wavelength short, the substituent is preferably an electron donating group, a fluorine atom and an aromatic ring group, and for example, an alkyl group, a dialkylamino group, an alkoxy group, a fluorine atom, an aryl group, an aromatic heterocyclic group and the like are selected. Further, in the case of making the wavelength long, the substituent is preferably an electron withdrawing group, and for example, a cyano group, a perfluoroalkyl group and the like are selected. The substituent on the nitrogen atom is preferably an alkyl group, an aryl group, and an aromatic heterocyclic group, and from the viewpoint of stability of the complex, an alkyl group and an aryl group are preferred. The substituents may be linked to each other to form a condensed ring, and examples of the ring to be formed include a benzene ring, a pyridine ring, a pyrazine ring, a pyridazine ring, a pyrimidine ring, an imidazole ring, an oxazole ring, a thiazole ring, a pyrazole ring, a thiophene ring, a furan ring and the like.

Each of $Z^{23}$ and $Z^{24}$ independently represents a benzene ring or an aromatic heterocyclic ring. Examples of the nitrogen-containing aromatic heterocyclic ring represented by $Z^{23}$ and $Z^{24}$ include a pyridine ring, a pyrimidine ring, a pyrazine ring, a pyridazine ring, a triazine ring, an imidazole ring, a pyrazole ring, an oxazole ring, a thiazole ring, a triazole ring, an oxadiazole ring, a thiadiazole ring, a thiophene ring, a furan ring and the like. From the viewpoint of stability, control of light emission wavelength, and light emission quantum yield of the complex, the ring represented by $Z^{23}$ and $Z^{24}$ is preferably a benzene ring, a pyridine ring, a pyrazine ring, an imidazole ring, a pyrazole ring and a thiophene ring, more preferably a benzene ring, a pyridine ring and a pyrazole ring, and still more preferably a benzene ring and a pyridine ring.

The benzene ring and nitrogen-containing aromatic heterocyclic ring represented by $Z^{23}$ and $Z^{24}$ may have a substituent, and as a substituent on the carbon atom, Group A of substituents may be applied, and as a substituent on the nitrogen atom, Group B of substituents may be applied. The substituent on the carbon atom is preferably an alkyl group, a perfluoroalkyl group, an aryl group, an aromatic heterocyclic group, a dialkylamino group, a diarylamino group, an alkoxy group, a cyano group and a fluorine atom. The substituent is appropriately selected for the purpose of controlling the light emission wavelength or potential, but in the case of making the wavelength long, the substituent is preferably an electron donating group and an aromatic ring group, and for example, an alkyl group, a dialkylamino group, an alkoxy group, an aryl group, an aromatic heterocyclic group and the like are selected. In addition, in the case of making the wavelength short, the substituent is preferably an electron withdrawing group, and for example, a fluorine atom, a cyano group, a perfluoroalkyl group and the like are selected. The substituent on the nitrogen atom is preferably an alkyl group, an aryl group, and an aromatic heterocyclic group, and from the viewpoint of stability of the complex, an alkyl group and an aryl group are preferred. The substituents may be linked to each other to form a condensed ring, and examples of the ring to be formed include a benzene ring, a pyridine ring, a pyrazine ring, a pyridazine ring, a pyrimidine ring, an imidazole ring, an oxazole ring, a thiazole ring, a pyrazole ring, a thiophene ring, a furan ring and the like.

Among platinum complexes represented by Formula (C-2), a more preferred aspect is a platinum complex represented by the following Formula (C-4).

[Chem. 23]

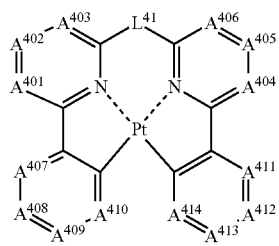

Formula (C-4)

(In Formula (C-4), each of $A^{401}$ to $A^{414}$ independently represents C—R or a nitrogen atom. R represents a hydrogen atom or a substituent. $L^{41}$ represents a single bond or a divalent linking group.)

Formula (C-4) will be described.

Each of $A^{401}$ to $A^{414}$ independently represents C—R or a nitrogen atom. R represents a hydrogen atom or a substituent.

As a substituent represented by R, those exemplified above for the group A of substituents may be applied.

$A^{401}$ to $A^{406}$ are preferably C—R, and R's may be linked to each other to form a ring.

When $A^{401}$ to $A^{406}$ are C—R, the R's of $A^{402}$ and $A^{405}$ are preferably a hydrogen atom, an alkyl group, an aryl group, an amino group, an alkoxy group, an aryloxy group, a fluorine atom and a cyano group, more preferably a hydrogen atom, an amino group, an alkoxy group, an aryloxy group and a fluorine atom, and particularly preferably a hydrogen atom and a fluorine atom. The R's of $A^{401}$, $A^{403}$, $A^{404}$ and $A^{406}$ are preferably a hydrogen atom, an alkyl group, an aryl group, an amino group, an alkoxy group, an aryloxy group, a fluorine atom and a cyano group, more preferably a hydrogen atom, an amino group, an alkoxy group, an aryloxy group and a fluorine atom, and particularly preferably a hydrogen atom.

$L^{41}$ has the same meaning as $L^1$ in Formula (C-1), and preferred ranges thereof are also the same.

For $A^{407}$ to $A^{414}$, the N (number of nitrogen atoms) in each of $A^{407}$ to $A^{410}$ and $A^{411}$ to $A^{414}$ is preferably 0 to 2, and more preferably 0 or 1. When the light emission wavelength is shifted to the short wavelength side, it is preferred that any one of $A^{408}$ and $A^{412}$ is a nitrogen atom, and it is more preferred that both $A^{408}$ and $A^{412}$ are a nitrogen atom.

When $A^{407}$ to $A^{414}$ represent C—R, the Rs of $A^{408}$ and $A^{412}$ are preferably a hydrogen atom, an alkyl group, a perfluoroalkyl group, an aryl group, an amino group, an alkoxy group, an aryloxy group, a fluorine atom and a cyano group, more preferably a hydrogen atom, a perfluoroalkyl group, an alkyl group, an aryl group, a fluorine atom and a cyano group, and particularly preferably a hydrogen atom, a phenyl group, a perfluoroalkyl group and a cyano group. The R's of $A^{407}$, $A^{409}$, $A^{411}$ and $A^{413}$ are preferably a hydrogen atom, an alkyl group, a perfluoroalkyl group, an aryl group, an amino group, an alkoxy group, an aryloxy group, a fluorine atom and a cyano group, more preferably a hydrogen atom, a perfluoroalkyl group, a fluorine atom and a cyano group, and particularly preferably a hydrogen atom, a phenyl group and a fluorine atom. The Rs of $A^{410}$ and $A^{414}$ are preferably a hydrogen atom and a fluorine atom, and more preferably a hydrogen atom. When any one of $A^{407}$ to $A^{409}$ and $A^{411}$ to $A^{413}$ represents C—R, R's may be linked to each other to form a ring.

Specific examples of the platinum complex represented by Formula (C-1) include compounds as described in [0143] to [0152], [0157], [0158] and [0162] to [0168] of Japanese Patent Application Laid-Open No. 2005-310733, compounds as described in [0065] to [0083] of Japanese Patent Application Laid-Open No. 2006-256999, compounds as described in [0065] to [0090] of Japanese Patent Application Laid-Open No. 2006-93542, compounds as described in [0063] to [0071] of Japanese Patent Application Laid-Open No. 2007-73891, compounds as described in [0079] to [0083] of Japanese Patent Application Laid-Open No. 2007-324309, compounds as described in [0065] to [0090] of Japanese Patent Application Laid-Open No. 2006-93542, compounds as described in [0055] to [0071] of Japanese Patent Application Laid-Open No. 2007-96255 and compounds as described in to [0046] of Japanese Patent Application Laid-Open No. 2006-313796, and other platinum complexes as exemplified below.

[Chem. 24]

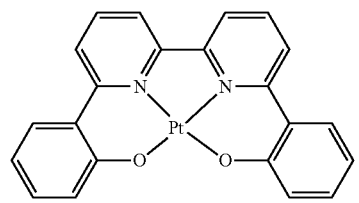

1-1

1-2
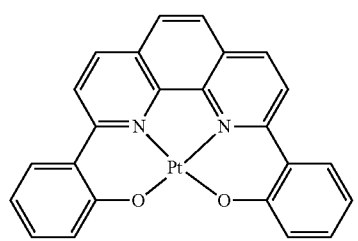
1-3
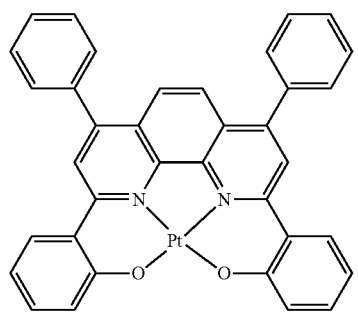
2-0
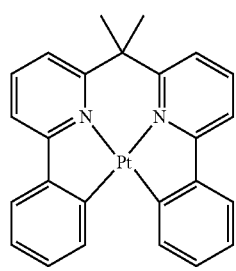
2-1
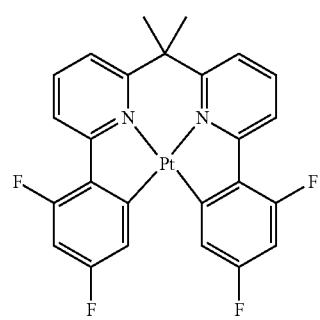
2-2
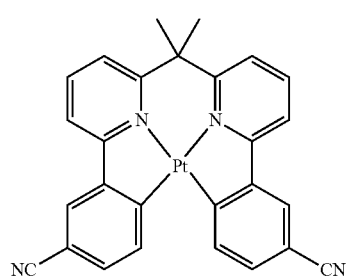
2-3
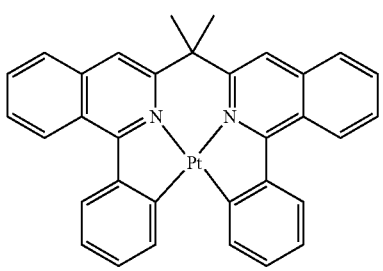
2-4
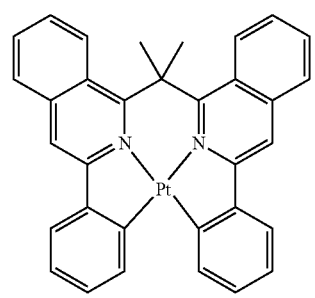
2-5
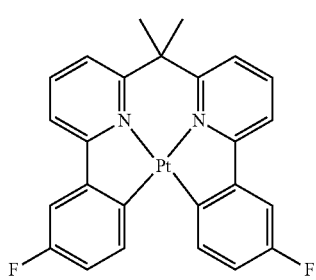
2-6
2-7
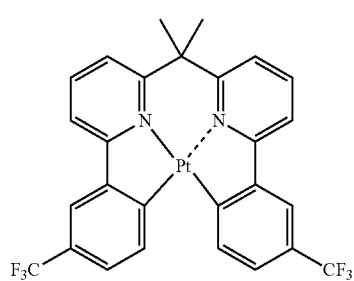

2-8
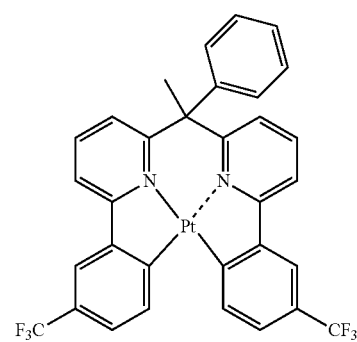
2-9
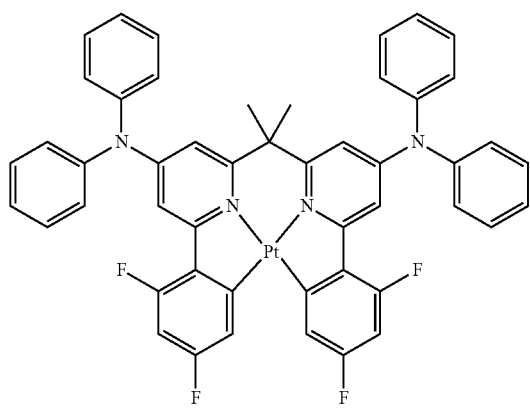
2-10
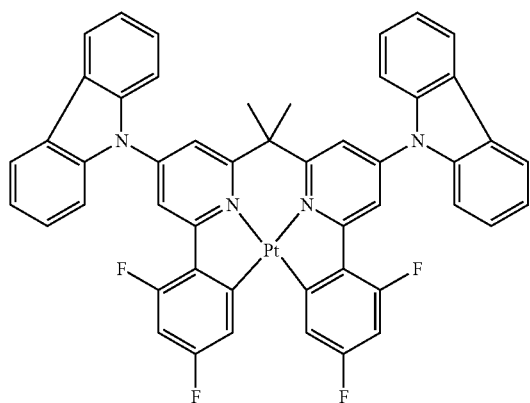
2-11
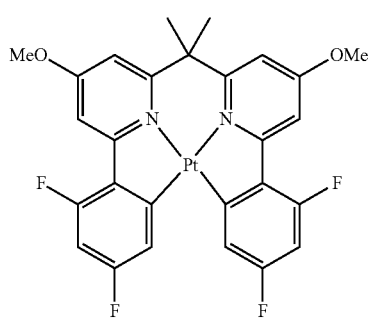
2-12
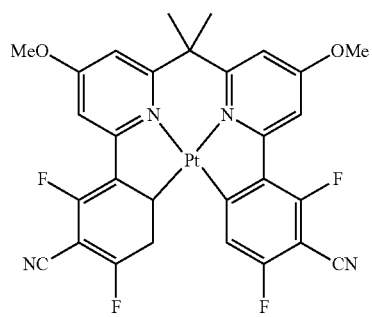
3-1
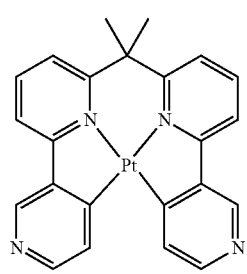
3-2
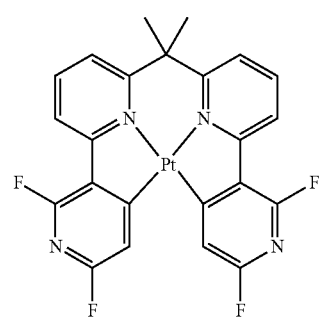
3-3
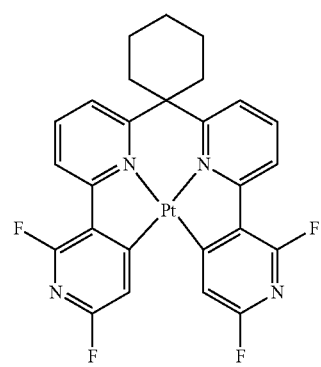
3-4
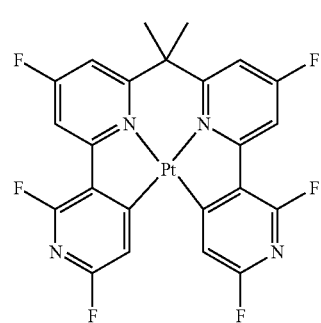

3-5
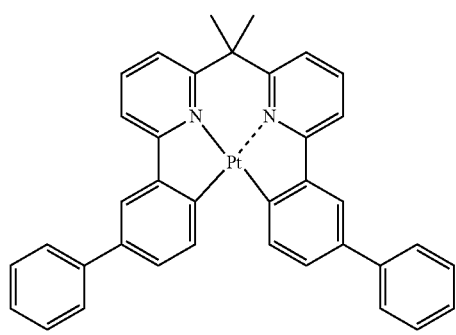
[Chem. 25]
4-1
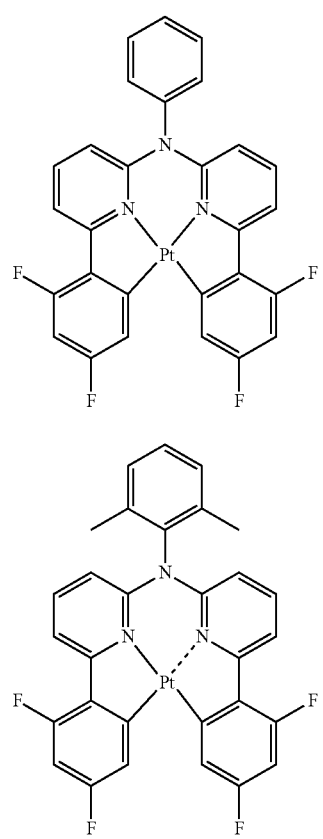
4-2
4-3
4-4
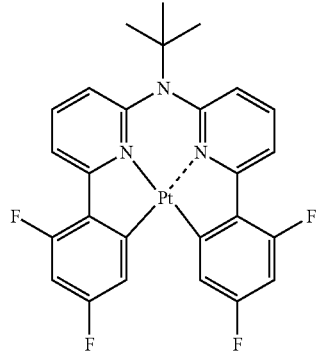
4-5
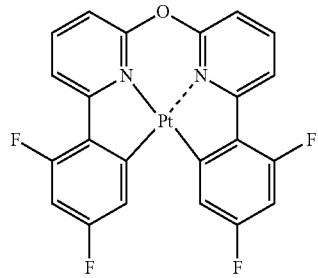
5-1
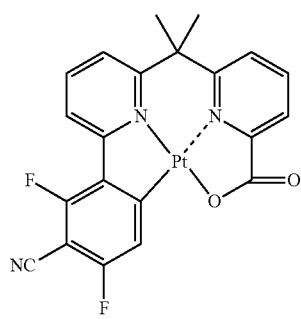
5-2
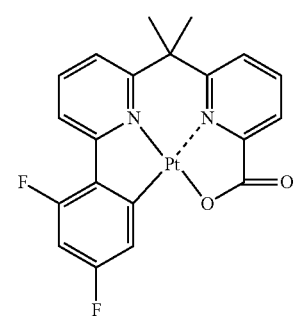
5-3
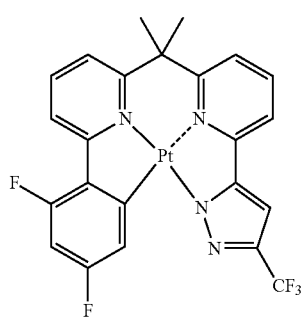

-continued
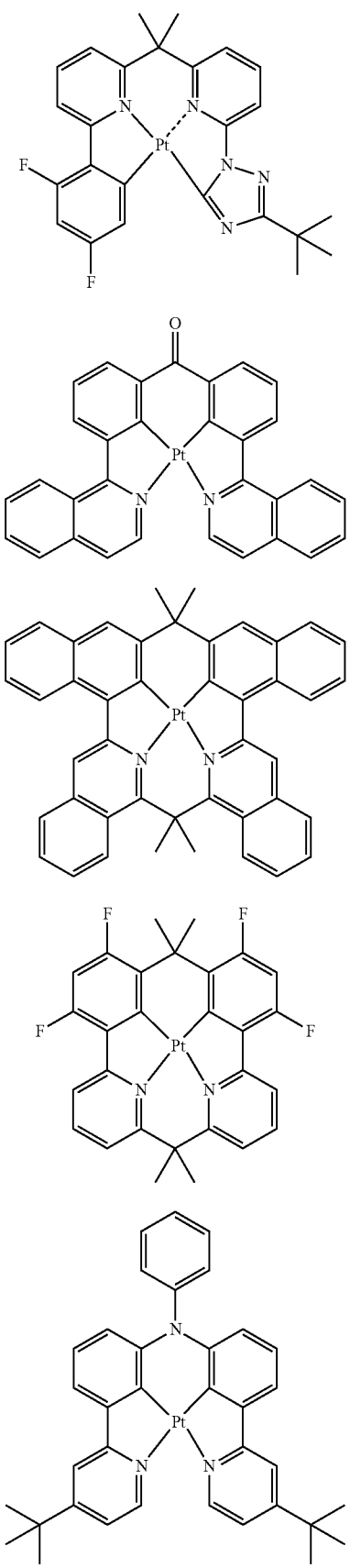
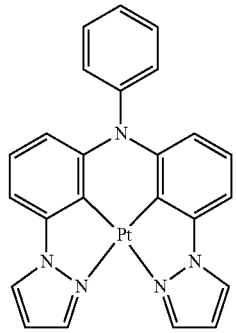
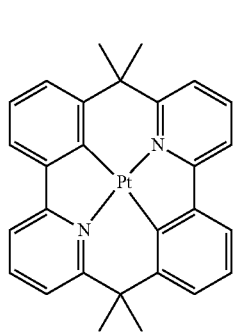
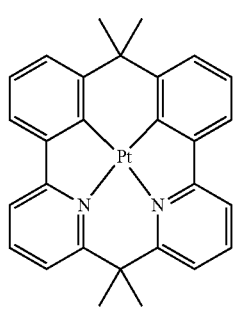
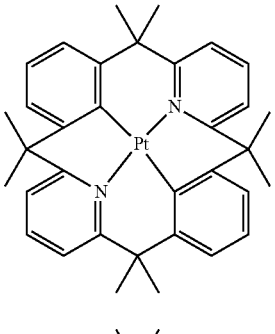
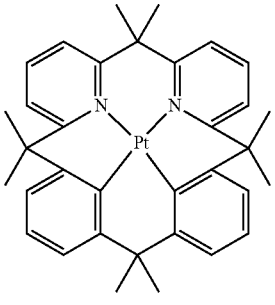

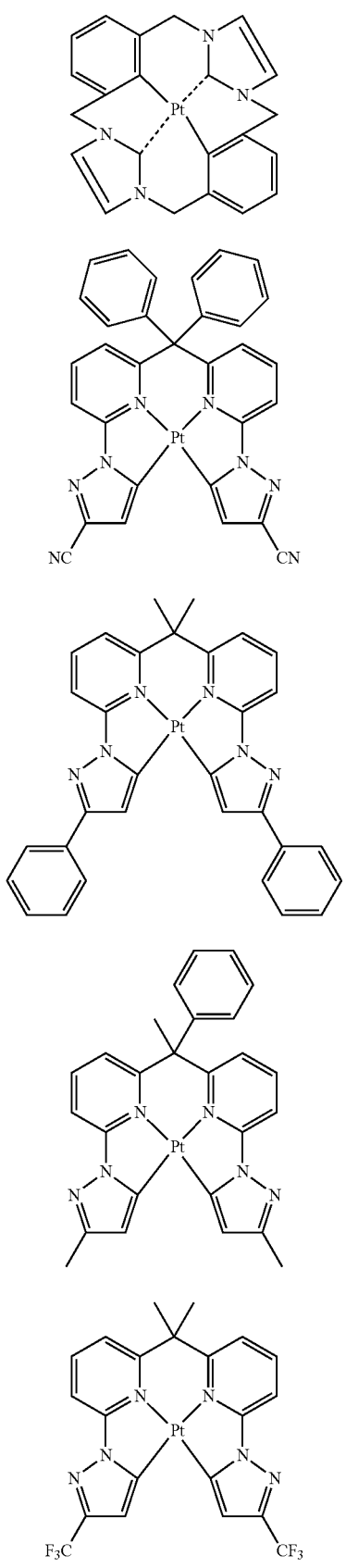
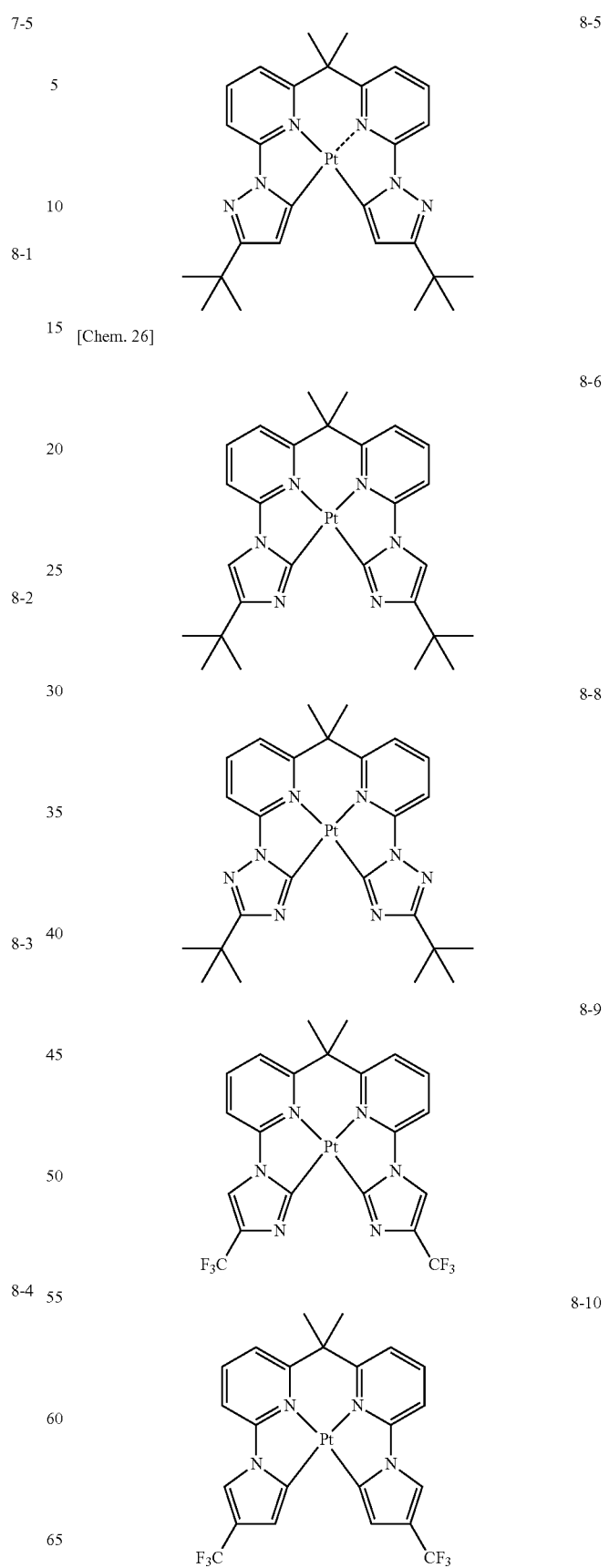

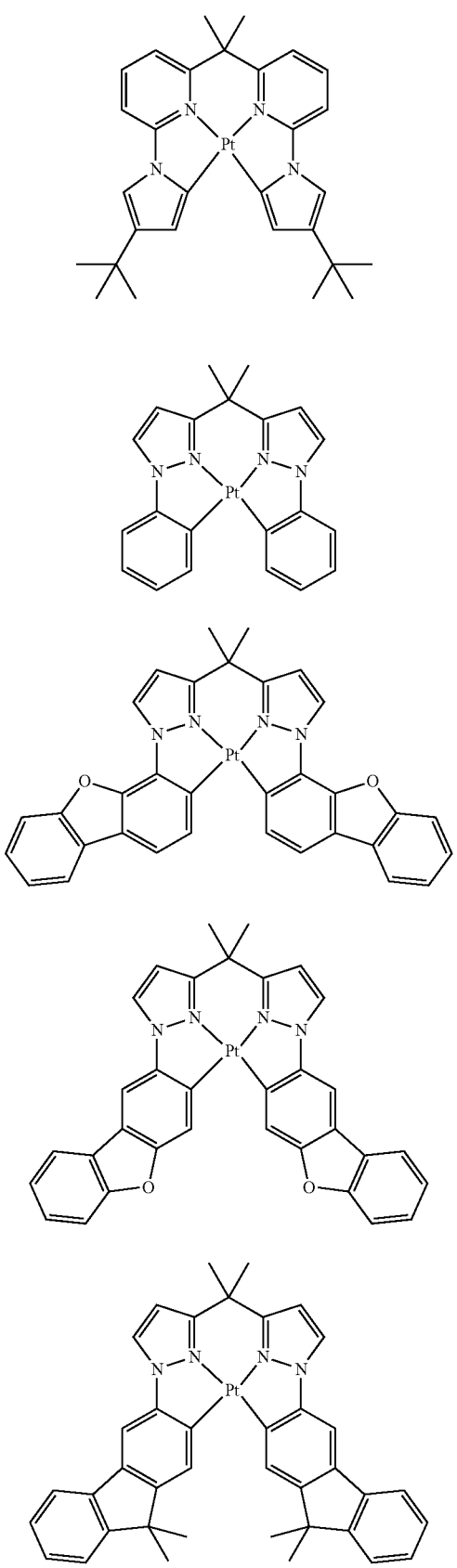
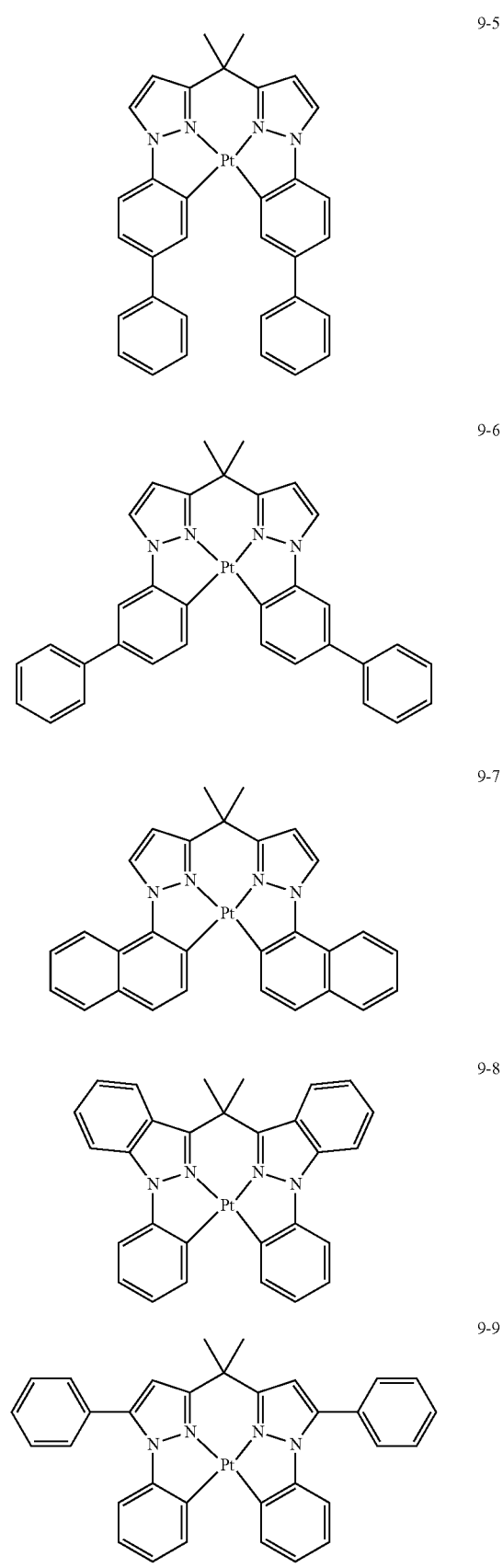

9-10
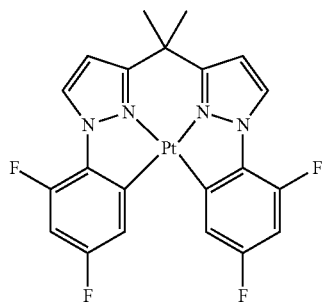
9-11
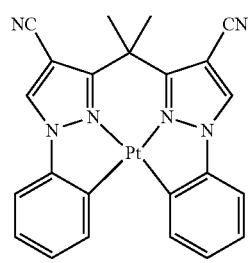
9-12
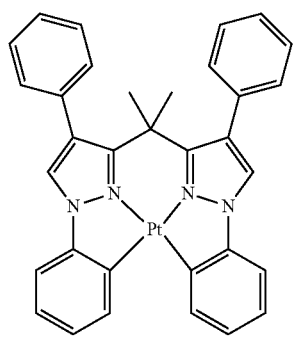
9-13
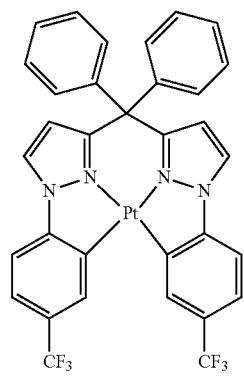
9-14
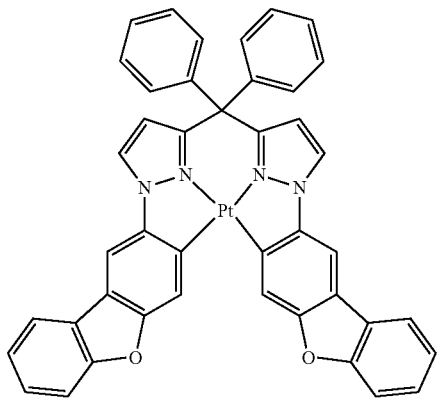
9-15
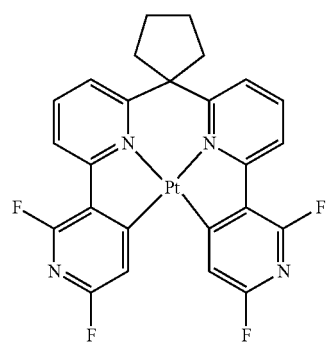
9-16
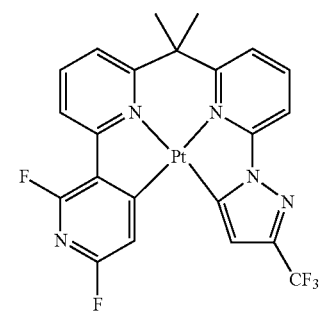
9-17
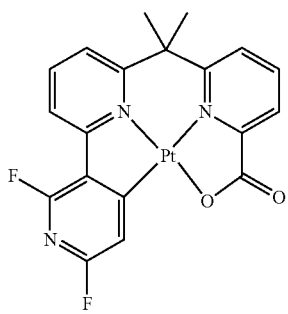

-continued 9-18

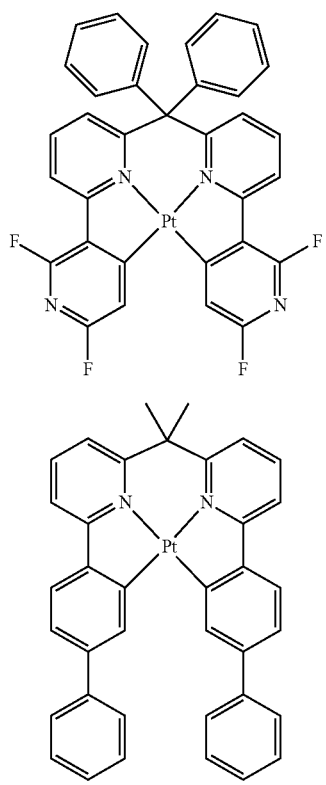

9-19

The platinum complex compound represented by Formula (C-1) may be synthesized by various techniques, for example, a method described on page 789, line 53 of the left-hand column to line 7 of the right-hand column, a method described on page 790, lines 18 to 38 of the left-hand column, a method described on page 790, lines 19 to 30 of the right-hand column in Journal of Organic Chemistry 53, 786, (1988), G. R. Newkome et al., and a combination thereof, a method described on page 2752, lines 26 to 35 in Chemische Berichte 113, 2749 (1980), H. Lexy et al., and the like.

For example, the platinum complex compound may be obtained by treating a ligand or a dissociation material thereof and a metal compound in the presence or absence of a solvent (examples thereof include a halogen-based solvent, an alcohol-based solvent, an ether-based solvent, an ester-based solvent, a ketone-based solvent, a nitrile-based solvent, an amide-based solvent, a sulfone-based solvent, a sulfoxide-based solvent, water and the like) or in the presence or absence of a base (various inorganic or organic bases, and examples thereof include sodium methoxide, t-butoxy potassium, triethylamine, potassium carbonate and the like) at room temperature or less or by heating (in addition to typical heating, a technique for heating by microwaves is also effective).

The content of the compound represented by Formula (C-1) in the light emitting layer of the present invention is preferably 1% by mass to 30% by mass, more preferably 3% by mass to 25% by mass, and still more preferably 5% by mass to 20% by mass, in the light emitting layer.

As an iridium complex, an iridium complex represented by the following Formula (T-1) is preferred.

[Compound Represented by Formula (T-1)]

A compound represented by Formula (T-1) will be described.

[Chem. 27]

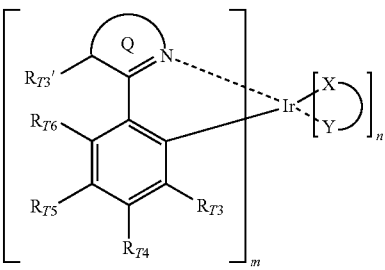

(T-1)

(In Formula (T-1), each of $R_{T3}'$, $R_{T3}$, $R_{T4}$, $R_{T5}$ and $R_{T6}$ independently represents a hydrogen atom, an alkyl group, an alkenyl group, an alkynyl group, —CN, a perfluoroalkyl group, a trifluorovinyl group, —$CO_2R_T$, —$C(O)R_T$, —$N(R_T)_2$, —$NO_2$, —$OR_T$, a fluorine atom, an aryl group or a heteroaryl group, and may further have Substituent T.

Q is a 5- or 6-membered aromatic heterocycle or a condensed aromatic heterocycle, which includes one or more nitrogen atoms.

Any adjacent two of $R_{T3}$, $R_{T4}$, $R_{T5}$ and $R_{T6}$ may be combined with each other to form a condensed 4- to 7-membered ring, and the condensed 4- to 7-membered ring is cycloalkyl, aryl or heteroaryl and may further have Substituent T.

$R_{T3}'$ and $R_{T6}$ may be linked by a linking group selected from —$C(R_T)_2$—$C(R_T)_2$—, —$CR_T$=$CR_T$—, —$C(R_T)_2$—, —O—, —$NR_T$—, —O—$C(R_T)_2$—, —$NR_T$—$C(R_T)_2$— and —N=$CR_T$— to form a ring, each $R_T$ independently represents a hydrogen atom, an alkyl group, an alkenyl group, an alkynyl group, a heteroalkyl group, an aryl group or a heteroaryl group, and may further have Substituent T.

Each Substituent T independently represents a fluorine atom, —R', —OR', —N(R')$_2$, —SR', —C(O)R', —C(O)OR', —C(O)N(R')$_2$, —CN, —$NO_2$, —$SO_2$, —SOR', —$SO_2R'$ or —$SO_3R'$, and each R' independently represents a hydrogen atom, an alkyl group, a perfluoroalkyl group, an alkenyl group, an alkynyl group, a heteroalkyl group, an aryl group or a heteroaryl group. (X—Y) represents a ligand. m represents an integer of 1 to 3 and n represents an integer of 0 to 2. m+n is 3.)

The alkyl group may have a substituent and may be saturated or unsaturated, and examples of a group which may be substituted include the above-described Substituent T. The alkyl group represented by $R_{T3}'$, $R_{T3}$, $R_{T4}$, $R_{T5}$ and $R_{T6}$ is preferably an alkyl group having a total carbon number from 1 to 8 and more preferably an alkyl group having a total carbon number from 1 to 6, and examples thereof include a methyl group, an ethyl group, an i-propyl group, a cyclohexyl group, a t-butyl group and the like.

The cycloalkyl group may have a substituent and may be saturated or unsaturated, and examples of a group which may be substituted include the above-described Substituent T. The cycloalkyl group represented by $R_{T3}'$, $R_{T3}$, $R_{T4}$, $R_{T5}$, and $R_{T6}$ is preferably a cycloalkyl group having the number of ring members from 4 to 7 and more preferably a cycloalkyl group having a total carbon number of 5 and 6, and examples thereof include a cyclopentyl group, a cyclohexyl group and the like.

The alkenyl group represented by $R_{T3}'$, $R_{T3}$, $R_{T4}$, $R_{T5}$, and $R_{T6}$ is an alkenyl group having preferably 2 to 30 carbon atoms, more preferably 2 to 20 carbon atoms, and particularly preferably 2 to 10 carbon atoms, and examples thereof include vinyl, allyl, 1-propenyl, 1-isopropenyl, 1-butenyl, 2-butenyl, 3-pentenyl and the like.

The alkynyl group represented by $R_{T3}'$, $R_{T3}$, $R_{T4}$, $R_{T5}$, and $R_{T6}$ has preferably 2 to 30 carbon atoms, more preferably 2 to 20 carbon atoms, and particularly preferably 2 to 10 carbon atoms, and examples thereof include ethynyl, propargyl, 1-propynyl, 3-pentynyl and the like.

Examples of the heteroalkyl group represented by $R_{T3}'$, $R_{T3}$, $R_{T4}$, $R_{T5}$ and $R_{T6}$ include a group in which at least one carbon of the alkyl group has been substituted with O, $NR_T$ or S.

The aryl group represented by $R_{T3}'$, $R_{T3}$, $R_{T4}$, $R_{T5}$, and $R_{T6}$ is preferably a substituted or unsubstituted aryl group having 6 to 30 carbon atoms, and examples thereof include a phenyl group, a tolyl group, a naphthyl group and the like.

The heteroaryl group represented by $R_{T3}'$, $R_{T3}$, $R_{T4}$, $R_{T5}$, and $R_{T6}$ is preferably a heteroaryl group having 5 to 8 carbon atoms, more preferably a 5- or 6-membered, substituted or unsubstituted heteroaryl group, and examples thereof include a pyridyl group, a pyrazinyl group, a pyridazinyl group, a pyrimidinyl group, a triazinyl group, a quinolinyl group, an isoquinolinyl group, a quinazolinyl group, a cinnolinyl group, phthalazinyl group, a quinoxalinyl group, a pyrrolyl group, an indolyl group, a furyl group, a benzofuryl group, a thienyl group, a benzothienyl group, a parazolyl group, an imidazolyl group, a benzimidazolyl group, a triazolyl group, an oxazolyl group, a benzoxazolyl group, a thiazolyl group, a benzothiazolyl group, an isothiazolyl group, a benzisothiazolyl group, a thiadiazolyl group, an isoxazolyl group, a benzisoxazolyl group, a pyrrolidinyl group, a piperidinyl group, a piperazinyl group, an imidazolidinyl group, a thiazolinyl group, a sulfolanyl group, a carbazolyl group, a dibenzofuryl group, a dibenzothienyl group, a pyridoindolyl group and the like. Preferred examples thereof include a pyridyl group, a pyrimidinyl group, an imidazolyl group and a thienyl group, and more preferably a pyridyl group and a pyrimidinyl group.

$R_{T3}'$, $R_{T3}$, $R_{T4}$, $R_{T5}$ and $R_{T6}$ are preferably a hydrogen atom, an alkyl group, a cyano group, a trifluoromethyl group, a perfluoroalkyl group, a dialkylamino group, a fluorine atom, an aryl group and a heteroaryl group, more preferably a hydrogen atom, an alkyl group, a cyano group, a trifluoromethyl group, a fluorine atom and an aryl group, and still more preferably a hydrogen atom, an alkyl group and an aryl group. Substituent T is preferably an alkyl group, an alkoxy group, a fluorine atom, a cyano group and a dialkylamino group, and more preferably a hydrogen atom.

Any adjacent two of $R_{T3}$, $R_{T4}$, $R_{T5}$ and $R_{T6}$ may be combined with each other to form a condensed 4- to 7-membered ring, and the condensed 4- to 7-membered ring is a cycloalkyl group, an aryl group or a heteroaryl group and may further have Substituent T. The definition and preferred ranges of cycloalkyl, aryl and heteroaryl to be formed are the same as those of a cycloalkyl group, an aryl group and a heteroaryl group defined in $R_{T3}$, $R_{T4}$, $R_{T5}$ and $R_{T6}$.

Examples of an aromatic heterocycle represented by ring Q include a pyridine ring, a pyrazine ring, a pyrimidine ring, a pyrazole ring, an imidazole ring, a triazole ring, an oxazole ring, an oxadiazole ring, a thiazole ring, a thiadiazole ring and the like. The aromatic heterocycle is preferably a pyridine ring and a pyrazine ring, and more preferably a pyridine ring.

Examples of a condensed aromatic heterocycle presented by ring Q include a quinoline ring, an isoquinoline ring, a quinoxaline ring and the like. The condensed aromatic heterocycle is preferably a quinoline ring and an isoquinoline ring, and more preferably a quinoline ring.

m is preferably 1 to 3, and more preferably 2 or 3. That is, n is preferably 0 or 1. The kind of ligand in a complex is composed of preferably one or two kind thereof, and more preferably one kind. From the viewpoint of easiness in synthesis when a reactive group is introduced into a complex molecule, the ligand is also preferably composed of two kinds thereof.

A metal complex represented by Formula (T-1) may be composed by including a combination of a ligand represented by the following Formula (T-1-A) in Formula (T-1) or the tautomer thereof and a ligand represented by (X—Y) or the tautomer thereof, or all the ligands of the metal complex may be composed only of a ligand represented by Formula (T-1-A) or the tautomer thereof.

[Chem. 28]

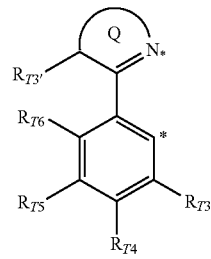

(T-1-A)

(In Formula (T-1-A), $R_{T3}'$, $R_{T3}$, $R_{T4}$, $R_{T5}$, $R_{T6}$ and Q have the same meanings as $R_{T3}'$, $R_{T3}$, $R_{T4}$, $R_{T5}$, $R_{T6}$ and Q in Formula (T-1). * represents a coordination position to iridium.)

Furthermore, a ligand (may be referred to as a coordination compound) known to those skilled in the art as a so-called ligand, which is used in the formation of the metal complex known in the related art may be included as a ligand represented by (X—Y), if necessary.

As a ligand to be used in the metal complex known in the related art, there are various ligands which are known, but examples thereof include ligands (for example, halogen ligands (preferably chlorine ligands)) described in, for example, "Photochemistry and Photophysics of Coordination Compounds", published by Springer-Verlag, written by H. Yersin, 1987, "Organometallic Chemistry-Principles and Applications", published by Shokabo Publishing Co., Ltd., written by Yamamoto, Akio, 1982, nitrogen-containing heteroaryl ligands (for example, bipyridyl, phenanthroline and the like) and diketone ligands (for example, acetylacetone and the like). The ligand represented by (X—Y) is preferably diketones or a picolinic acid derivative, and most preferably acetylacetonate (acac) represented as follows from the viewpoint of obtaining stability of the complex and high light emission efficiency.

[Chem. 29]

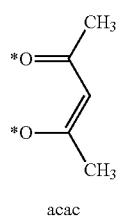
acac

* represents a coordination position to iridium.

Hereinafter, specific examples of the ligand represented by (X—Y) are listed, but the present invention is not limited thereto.

[Chem. 30]

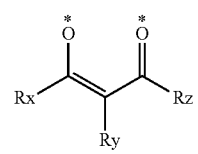
(I-1)

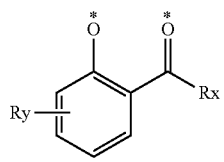
(I-2)

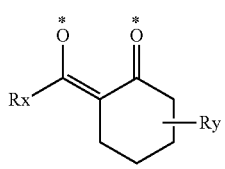
(I-3)

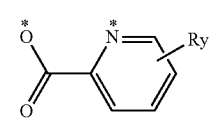
(I-4)

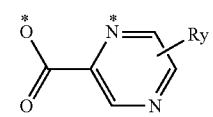
(I-5)

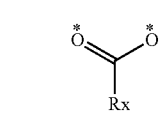
(I-6)

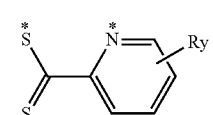
(I-7)

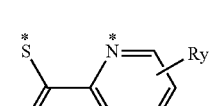
(I-8)

-continued

(I-9)

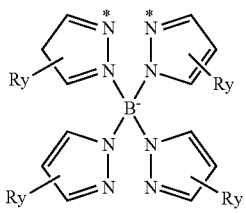
(I-10)

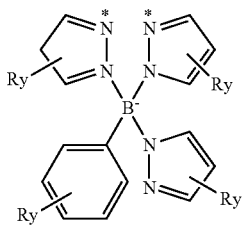
(I-11)

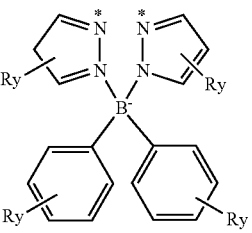
(I-12)

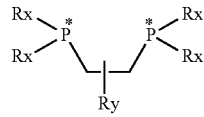
(I-13)

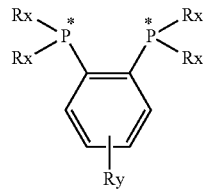
(I-14)

In the example of the ligand represented by (X—Y), * represents a coordination position to iridium in Formula (T-1). Each of Rx, Ry and Rz independently represents a hydrogen atom or a substituent. The substituent may include a substituent selected from Group A of substituents. Preferably, each of Rx and Rz is independently any of an alkyl group, a perfluoroalkyl group, a fluorine atom and an aryl group, more preferably an alkyl group having 1 to 4 carbon atoms, a perfluoroalkyl group having 1 to 4 carbon atoms, a fluorine atom and a phenyl group which may be substituted, and most preferably a methyl group, an ethyl group, a trifluoromethyl group, a fluorine atom and a phenyl group. Ry is preferably any of a hydrogen atom, an alkyl group, a perfluoroalkyl group, a fluorine atom and an aryl group, more preferably a hydrogen atom, an alkyl group having 1 to 4 carbon atoms and a phenyl group which may be substituted, and most preferably any of a hydrogen atom and a methyl group. It is thought that these ligands are not a site in which electrons are transported in a device or electrons are concentrated by exitation, and thus Rx, Ry and Rz may be a chemically stable substituent and do not have any influence on the effect of the present invention.

The complex is easily synthesized, and thus, is preferably (I-1), (I-4) and (I-5), and most preferably (I-1). The complex having these ligands may be synthesized in the same manner as in Synthetic Examples, which are known, by using the corresponding ligand precursor. In the same manner as in a method described on, for example, page 46 of International Publication No. 2009-073245, the complex may be synthesized by a method shown in the following by using commercially available difluoroacetylacetone.

[Chem. 33]

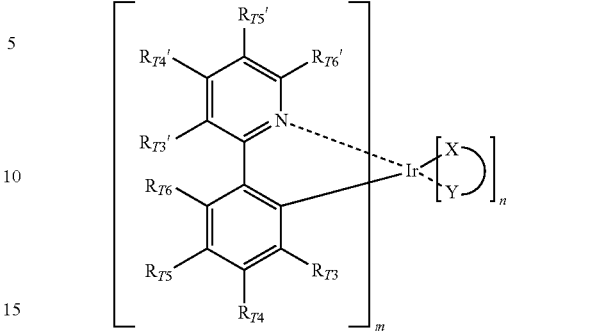

(T-2)

[Chem. 31]

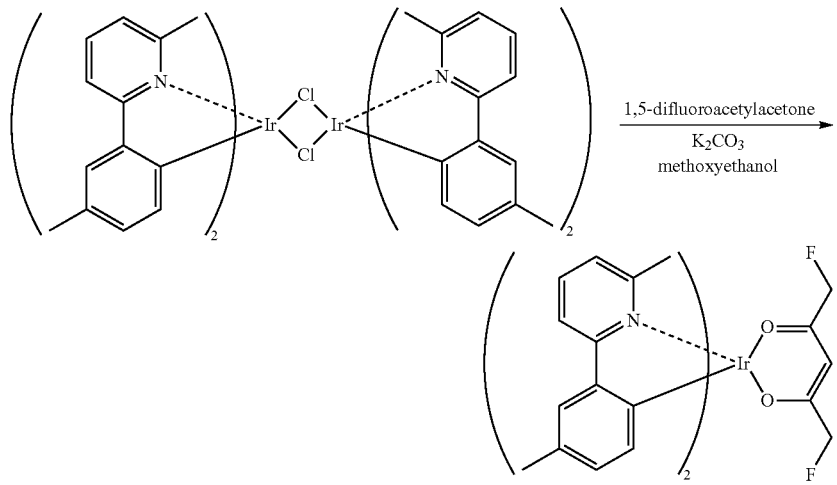

Further, a mono-anionic ligand represented by Formula (I-15) may also be used as a ligand.

[Chem. 32]

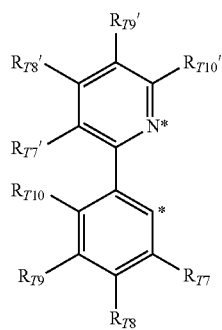

(I-15)

$R_{T7}$ to $R_{T10}$ in Formula (I-15) have the same meaning as $R_{T3}$ to $R_{T6}$ in Formula (T-1), and preferred ranges thereof are also the same. $R_{T7}'$ to $R_{T10}'$ have the same meaning as $R_{T3}'$, and preferred ranges thereof are also the same as $R_{T3}'$. * represents a coordination position to iridium.

The compound represented by Formula (T-1) is preferably a compound represented by the following Formula (T-2).

(In Formula (T-2), each of $R_{T3}'$ to $R_{T6}'$ and $R_{T3}$ to $R_{T6}$ independently represents a hydrogen atom, an alkyl group, an alkenyl group, an alkynyl group, —CN, a perfluoroalkyl group, a trifluorovinyl group, —$CO_2R_T$, —$C(O)R_T$, —$N(R_T)_2$, —$NO_2$, —$OR_T$, a fluorine atom, an aryl group or a heteroaryl group, and may further have Substituent T.

Any adjacent two of $R_{T3}$, $R_{T4}$, $R_{T5}$ and $R_{T6}$ may be combined with each other to form a condensed 4- to 7-membered ring, and the condensed 4- to 7-membered ring may further have Substituent T.

$R_{T3}'$ and $R_{T6}$ may be linked by a linking group selected from —$C(R_T)_2$—$C(R_T)_2$—, —$CR_T$=$CR_T$—, —$C(R_T)_2$—, —O—, —$NR_T$—, —O—$C(R_T)_2$—, —$NR_T$—$C(R_T)_2$— and —N=$CR_T$— to form a ring.

Each $R_T$ independently represents a hydrogen atom, an alkyl group, an alkenyl group, an alkynyl group, a heteroalkyl group, an aryl group or a heteroaryl group, and may further have Substituent T.

Each Substituent T independently represents a fluorine atom, —R', —OR', —$N(R')_2$, —SR', —C(O)R', —C(O)OR', —$C(O)N(R')_2$, —CN, —$NO_2$, —$SO_2$, —SOR', —$SO_2R'$ or —$SO_3R'$, and each of R' independently represents a hydrogen atom, an alkyl group, a perfluoroalkyl group, an alkenyl group, an alkynyl group, a heteroalkyl group, an aryl group or a heteroaryl group.

(X—Y) represents a ligand. m represents an integer of 1 to 3 and n represents an integer of 0 to 2. m+n is 3.)

Preferred ranges of $R_{T3}'$, $R_{T3}$ to $R_{T6}$, (X—Y), m and n in Formula (T-2) are the same as the preferred ranges of $R_{T3}'$, $R_{T3}$ to $R_{T6}$, (X—Y), m and n in Formula (T-1).

$R_{T4}'$ is preferably a hydrogen atom, an alkyl group, an aryl group and a fluorine atom, and more preferably a hydrogen atom.

$R_{T5}'$ and $R_6'$ preferably represent a hydrogen atom or are combined with each other to form a condensed 4- to 7-membered cyclic group, and the condensed 4- to 7-membered cyclic group is more preferably cycloalkyl, cycloheteroalkyl, aryl or heteroaryl, and still more preferably aryl.

Substituent T in $R_{T4}'$ to $R_{T6}'$ is preferably an alkyl group, an alkoxy group, a fluorine atom, a cyano group, an alkylamino group and a diarylamino group, and more preferably an alkyl group.

One of preferred forms of the compound represented by Formula (T-2) is the case where any adjacent two of $R_{T3}'$, $R_{T4}'$, $R_{T5}'$, $R_{T6}'$, $R_{T3}$, $R_{T4}$, $R_{T5}$ and $R_{T6}$ in Formula (T-2) are combined with each other and do not form a condensed ring.

One of preferred forms of the compound represented by Formula (T-2) is the case where the compound is represented by the following Formula (T-3).

[Chem. 34]

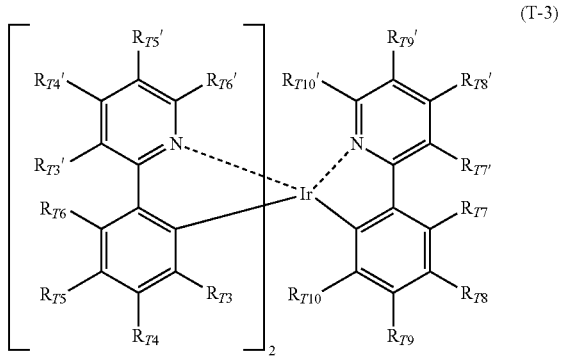

(T-3)

$R_{T3}'$ to $R_{T6}'$ and $R_{T3}$ to $R_{T6}$ in Formula (T-3) have the same meaning as $R_{T3}'$ to $R_{T6}'$ and $R_{T3}$ to $R_{T6}$ in Formula (T-2), and preferred ranges thereof are also the same.

$R_{T7}$ to $R_{T10}$ have the same meaning as $R_{T3}$ to $R_{T6}$, and preferred ranges thereof are also the same. $R_{T7}'$ to $R_{T10}'$ have the same meaning as $R_{T3}'$ to $R_{T6}'$, and preferred ranges thereof are also the same.

Another preferred form of the compound represented by Formula (T-2) is a compound represented by the following Formula (T-4).

[Chem. 35]

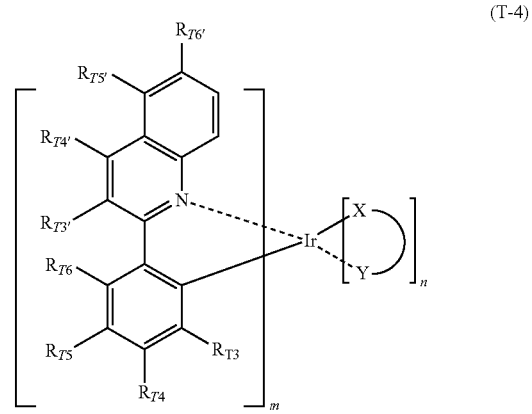

(T-4)

$R_{T3}'$ to $R_{T6}'$, $R_{T3}$ to $R_{T6}$, (X—Y), m and n in Formula (T-4) have the same meaning as $R_{T3}'$ to $R_{T6}'$, $R_{T3}$ to $R_{T6}$, (X—Y), m and n in Formula (T-2), and preferred ranges thereof are also the same. It is particularly preferred that zero to two of $R_{T3}'$ to $R_{T6}'$ and $R_{T3}$ to $R_{T6}$ are an alkyl group or a phenyl group and the rest are all a hydrogen atom, and it is still more preferred that one or two of $R_{T3}'$ to $R_{T6}'$ and $R_{T3}$ to $R_{T6}$ are an alkyl group and the rest are all a hydrogen atom.

Another preferred form of the compound represented by Formula (T-2) is a compound represented by the following Formula (T-5).

[Chem. 36]

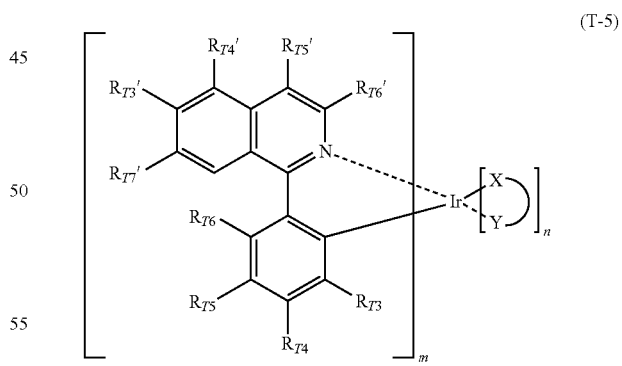

(T-5)

$R_{T3}'$ to $R_{T5}'$, $R_{T3}$ to $R_{T6}$, (X—Y), m and n in Formula (T-5) have the same meaning as $R_{T3}'$ to $R_{T6}'$, $R_{T3}$ to $R_{T6}$, (X—Y), m and n in Formula (T-2), and preferred ranges thereof are also the same.

Another preferred form of the compound represented by Formula (T-1) is the case where a compound is represented by the following Formula (T-6).

[Chem. 37]

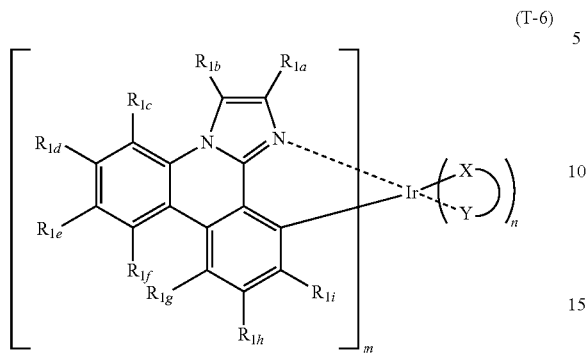

(T-6)

The definition and preferred ranges of $R_{1a}$ to $R_{1i}$ in Formula (T-6) are the same as in the definition and preferred ranges of $R_{T3}$ to $R_{T6}$ in Formula (T-1). In addition, it is particularly preferred that zero to two of $R_{1a}$ to $R_{1i}$ are an alkyl group or an aryl group and the rest are all a hydrogen atom. The definition and preferred ranges of (X—Y), m and n are the same as the definition and preferred ranges of (X—Y), m and n in Formula (T-1).

Preferred specific examples of the compound represented by Formula (T-1) are listed below, but are not limited thereto.

[Chem. 38]

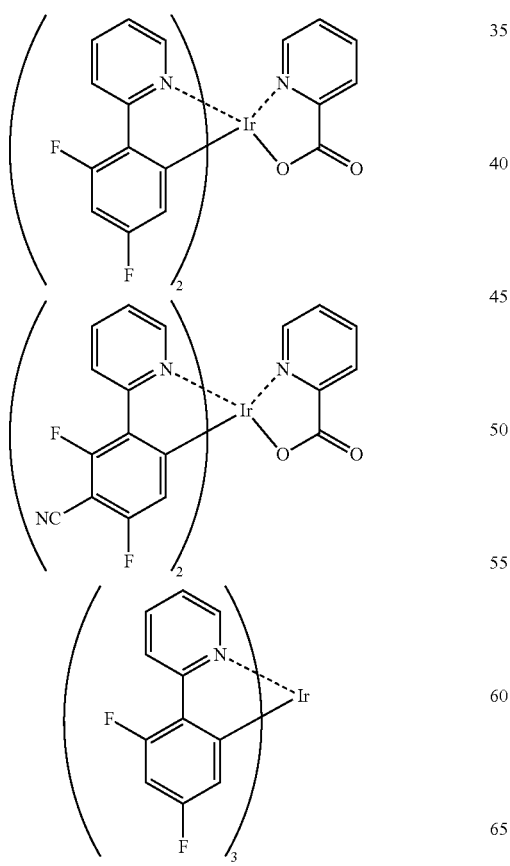

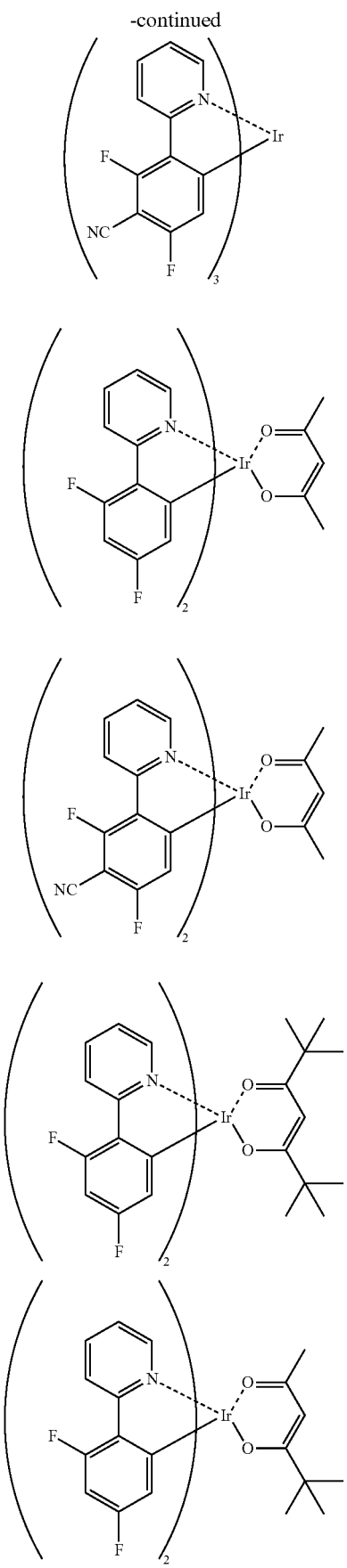

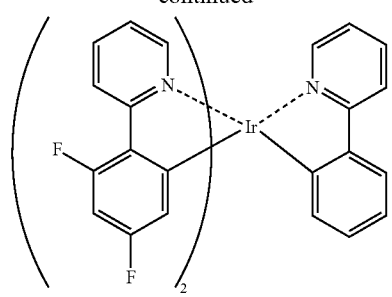
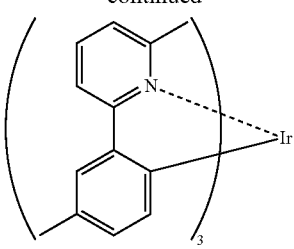
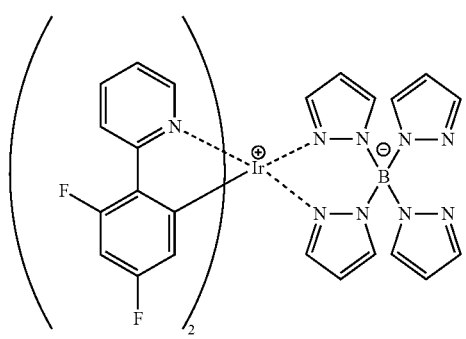
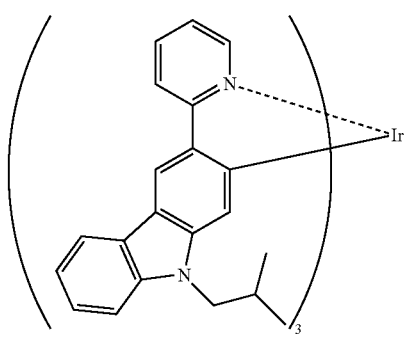
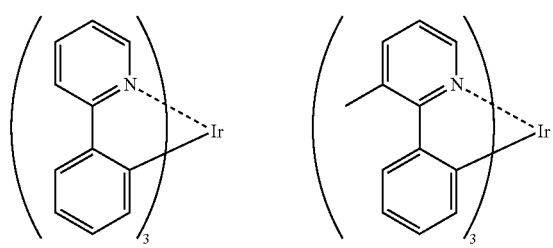
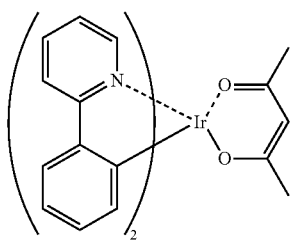
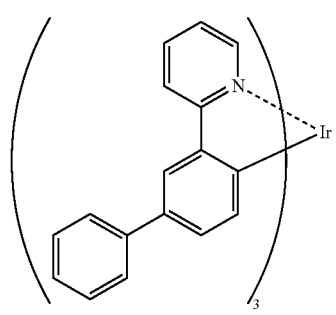
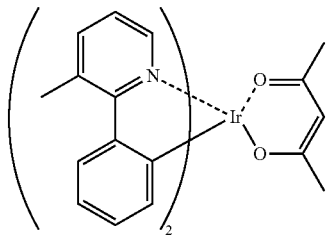
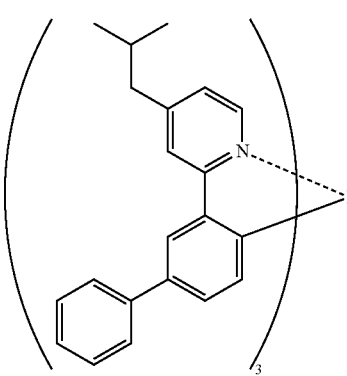
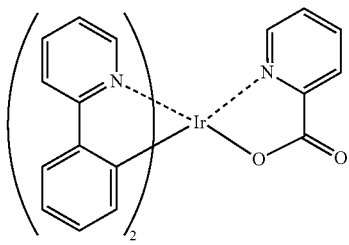
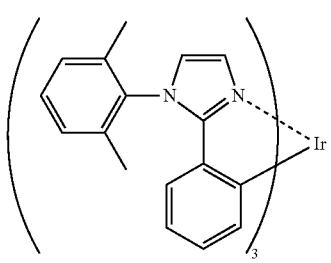

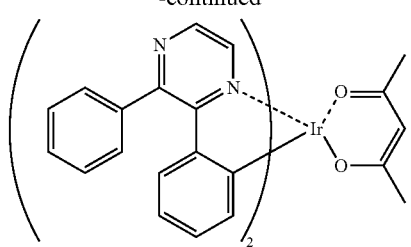
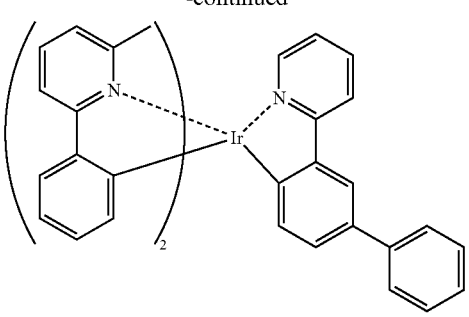
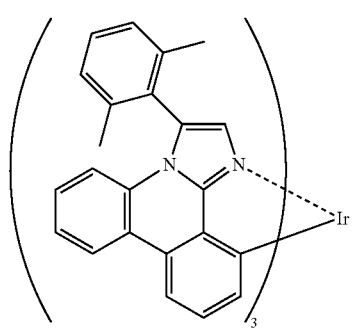
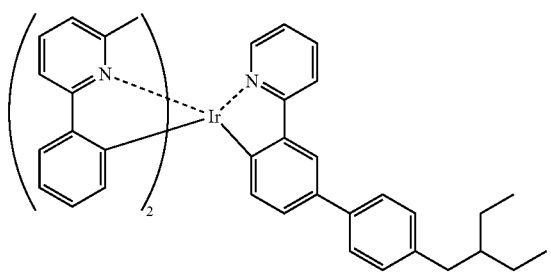
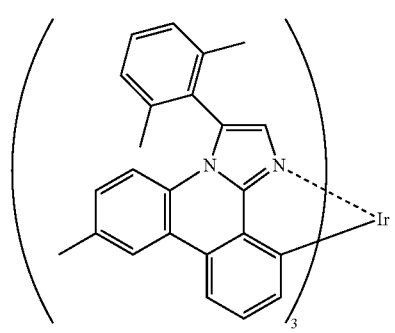
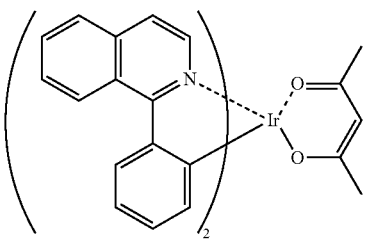
[Chem. 39]
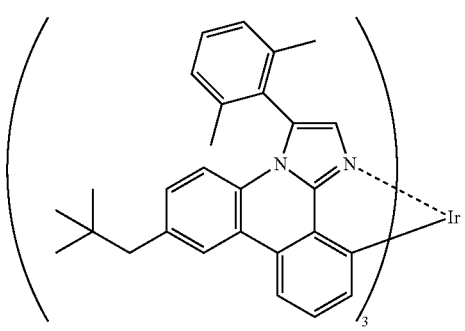
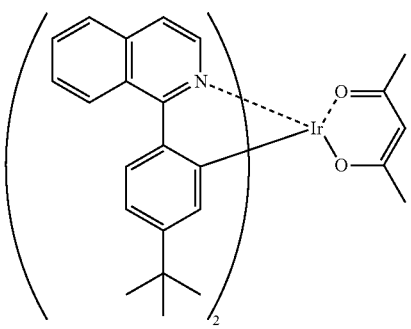
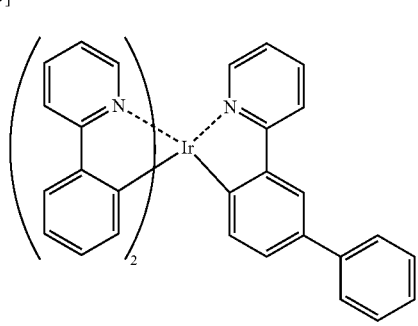
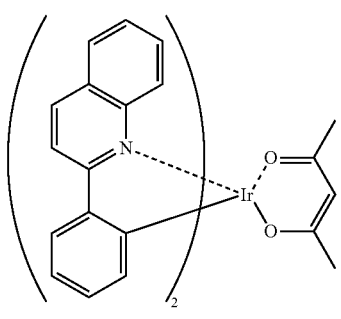

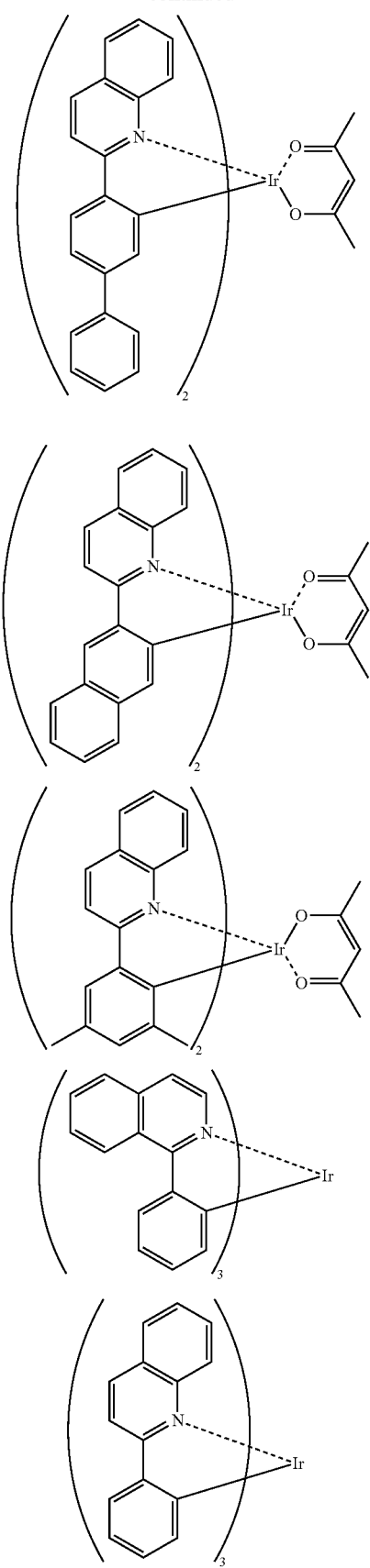
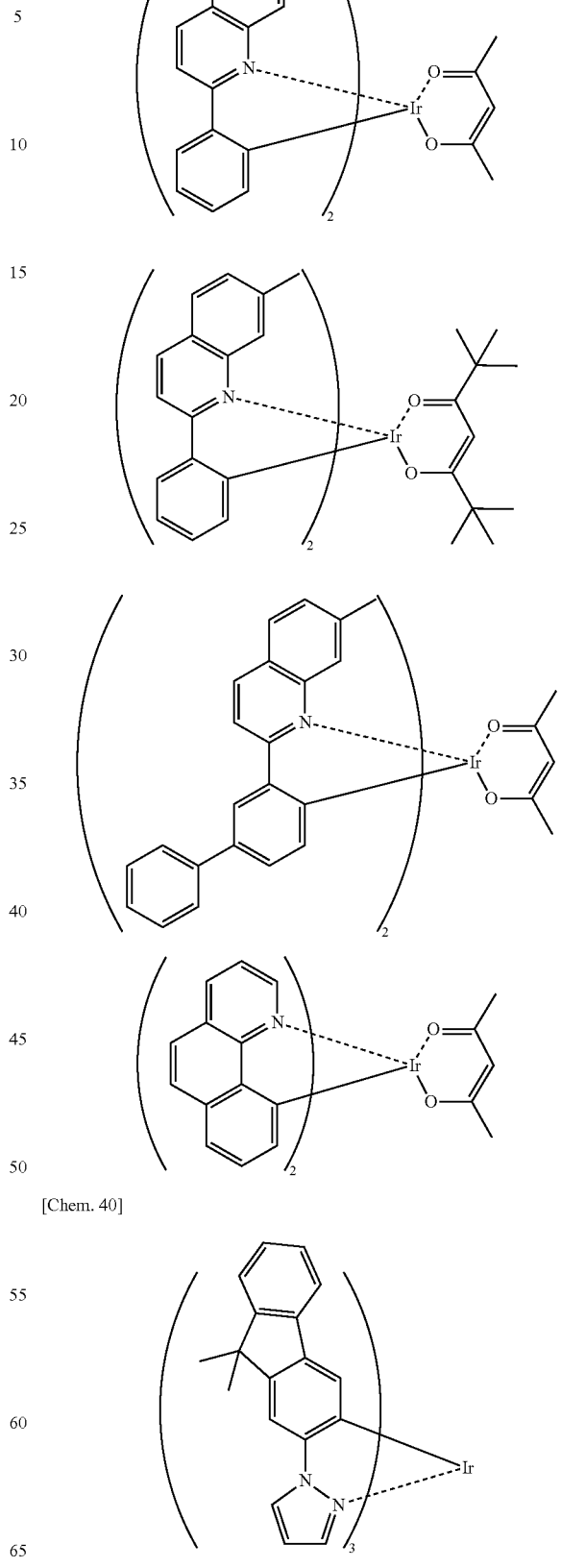
[Chem. 40]

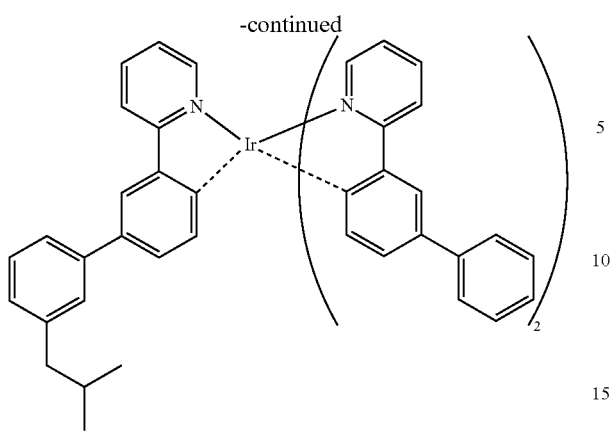

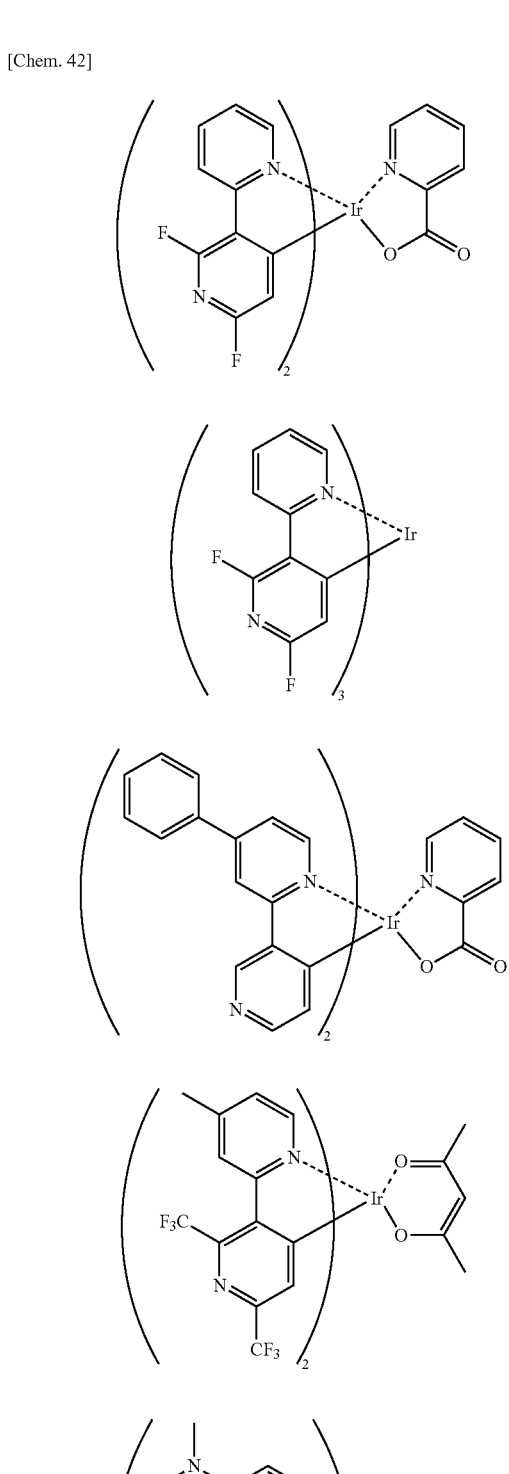

The compound exemplified as the compound represented by Formula (T-1) may be synthesized by a method as described in Japanese Patent Application Laid-Open No. 2009-99783 or by various methods as described in U.S. Pat. No. 7,279,232 and the like. After the synthesis, it is preferred that purification by column chromatography, recrystallization and the like is performed, and then purification is performed by sublimation purification. By sublimation purification, organic impurities may be separated and inorganic salts, residual solvents and the like may be effectively removed.

The compound represented by Formula (T-1) is contained in the light emitting layer, the use thereof is not limited, and the compound may be further contained in any layer in the organic layer.

As the iridium complex, in addition to the compound represented by Formula (T-1), a compound represented by the following Formula (T-7) or a compound having carbene as a ligand may also be preferably used.

[Chem. 41]

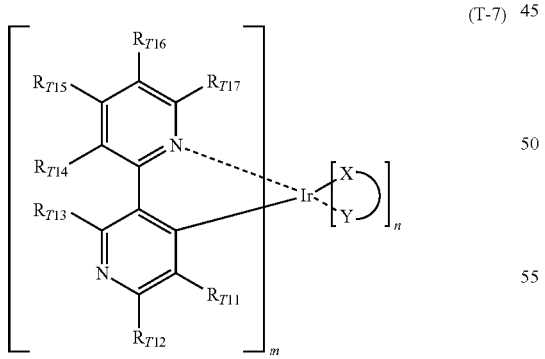

(T-7)

In Formula (T-7), $R_{T11}$ to $R_{T17}$ have the same meaning as $R_{T3}$ to $R_{T6}$ in Formula (T-2), and preferred ranges thereof are also the same. Furthermore, (X—Y), n and m have the same meaning as (X—Y), n and m in Formula (T-2), and preferred ranges thereof are the same.

Preferred specific examples thereof are listed below, but are not limited thereto.

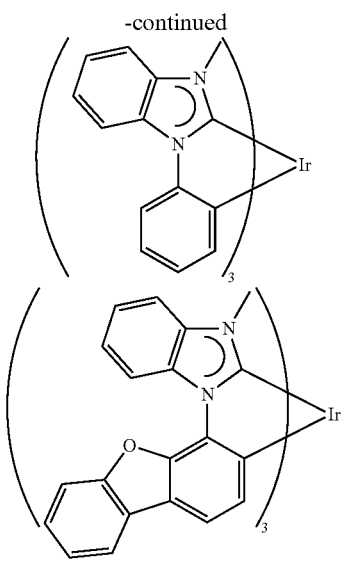

The light emitting material in the light emitting layer is included in an amount from 0.1% by mass to 50% by mass based on the mass of the total compounds which generally form the light emitting layer in the light emitting layer, but is included in an amount of preferably 1% by mass to 50% by mass from the viewpoint of durability and external quantum efficiency, and still more preferably 2% by mass to 40% by mass.

A thickness of the light emitting layer is not particularly limited, but typically, is preferably 2 nm to 500 nm, and among them, from the viewpoint of external quantum efficiency, the thickness is more preferably 3 nm to 200 nm, and still more preferably 5 nm to 100 nm.

The light emitting layer in the device of the present invention may be composed of a mixed layer of a host material and a light emitting material. The light emitting material may be a fluorescent light emitting material or a phosphorescent light emitting material, and the dopant may be used either alone or in combination of two or more thereof. The host material is preferably a charge transporting material. The host material may be used either alone or in combination of two or more thereof, and examples thereof include a configuration of a mixture of an electron transporting host material and a hole transporting host material. Further, the light emitting layer may include a material which does not have a charge transportability nor emit light.

In addition, the light emitting layer may be a single layer or a multi layer of two or more layers. Furthermore, each light emitting layer may emit light with different light emission colors.

<Host Material>

A host material used in the present invention is preferably a compound represented by Formula (1).

The host material used in the present invention may contain the following compound in addition to the compound represented by Formula (1).

Examples of the host material include an electron transporting material and a hole transporting material, and preferably a charge transporting material. The host material may be used either alone or in combination of two or more thereof, and examples thereof include a configuration of a mixture of an electron transporting host material and a hole transporting host material.

Examples thereof include pyrrole, indole, carbazole (for example, CBP (4,4'-di(9-carbazoyl)biphenyl), 3,3'-di(9-carbazolyl)biphenyl)), azaindole, azacarbazole, triazole, oxazole, oxadiazole, pyrazole, imidazole, thiophene, polyarylalkane, pyrazoline, pyrazolone, phenylenediamine, arylamine, amino substituted chalcone, styrylanthracene, fluorenone, hydrazone, stilbene, silazane, aromatic tertiary amine compounds, styrylamine compounds, porphyrin-based compounds, polysilane-based compounds, poly(N-vinylcarbazole), aniline-based copolymers, electrically conductive polymeric oligomers such as thiophene oligomers, polythiophene and the like, organosilanes, carbon films, pyridine, pyrimidine, triazine, imidazole, pyrazole, triazole, oxazole, oxadiazole, fluorenone, anthraquinodimethane, anthrone, diphenylquinone, thiopyran dioxide, carbodiimide, fluorenylidenemethane, distyrylpyrazine, fluorine-substituted aromatic compounds, heterocyclic tetracarboxylic anhydrides such as naphthalene perylene and the like, phthalocyanine, and a variety of metal complexes represented by metal complexes of a 8-quinolinol derivative, metal phthalocyanine, and metal complexes having benzoxazole or benzothiazole as the ligand thereof, derivatives thereof (which may have a substituent or a condensed ring), and the like.

In the light emitting layer in the present invention, it is preferred that the lowest triplet excitation energy ($T_1$ energy) of the host material is higher than the $T_1$ energy of the phosphorescent light emitting material from the viewpoint of color purity, light emission efficiency, and driving durability.

Further, the content of the host compound in the present invention is not particularly limited, but is preferably 15% by mass to 95% by mass based on the mass of the total compounds forming the light emitting layer, from the viewpoint of light emission efficiency and driving voltage.

(Electric Charge Transporting Layer)

The electric charge transporting layer refers to a layer in which the electric charge movement is generated when voltage is applied on an organic electroluminescence device. Specific examples thereof include a hole injection layer, a hole transporting layer, an electron blocking layer, a light emitting layer, a hole blocking layer, an electron transporting layer, or an electron injection layer. An electric charge transporting layer to be formed by an application method is preferably a hole injection layer, a hole transporting layer and an electron blocking layer, and accordingly, it is possible to produce an organic electroluminescence device at a low cost and a high efficiency.

(Hole Injection Layer and Hole Transporting Layer)

Each of the hole injection layer and the hole transporting layer is a layer having a function of accepting holes from the anode or the anode side to transport the holes into the cathode side.

The thickness of the hole transporting layer is preferably 1 nm to 500 nm, more preferably 5 nm to 200 nm, and still more preferably 10 nm to 100 nm. Further, the thickness of the hole injection layer is preferably 0.1 nm to 200 nm, more preferably 0.5 nm to 100 nm, and still more preferably 1 nm to 100 nm.

The hole injection layer and the hole transporting layer are described in detail in, for example, Japanese Patent Application Laid-Open No. 2008-270736 and Japanese Patent Application Laid-Open No. 2007-266458, and the subject matters described in these publications may be applied to the present invention.

(Electron Injection Layer and Electron Transporting Layer)

Each of the electron injection layer and the electron transporting layer is a layer having a function of accepting electrons from the cathode or the cathode side to transport the electrons into the anode side. Each of an electron injection material and an electron transporting material which is used in these layers may be a low-molecular weight compound, or may be a polymer compound.

The thickness of the electron transporting layer is preferably 1 nm to 500 nm, more preferably 5 nm to 200 nm, and still more preferably 5 nm to 100 nm. In addition, the thickness of the electron injection layer is preferably 0.1 nm to 200 nm, more preferably 0.2 nm to 100 nm, and still more preferably 0.5 nm to 50 nm.

The electron injection layer and the electron transporting layer are described in detail in, for example, Japanese Patent Application Laid-Open No. 2008-270736 and Japanese Patent Application Laid-Open No. 2007-266458, and the subject matters described in these publications may be applied to the present invention.

In the device of the present invention, the electron transporting layer preferably contains the compound represented by Formula (II).

In addition, two or more electron transporting layers may be provided, and in this case, at least one electron transporting layer preferably contains the compound represented by Formula (II).

(Hole Blocking Layer)

The hole blocking layer is a layer having a function of preventing a hole transported to the light emitting layer from the anode side from penetrating to the cathode side. In the present invention, the hole blocking layer may be provided as an organic layer adjacent to the light emitting layer on the cathode side.

Examples of the organic compound constituting the hole blocking layer include an aluminum complex such as aluminum(III)bis(2-methyl-8-quinolinato)4-phenylphenolate (simply referred to as BAlq) and the like, triazole derivatives, phenanthroline derivatives such as 2,9-dimethyl-4,7-diphenyl-1,10-phenanthroline (simply referred to as BCP) and the like, triphenylene derivatives, carbazole derivatives and the like, in addition to the compounds represented by Formula (1) in the present invention.

The thickness of the hole blocking layer is preferably 1 nm to 500 nm, more preferably 5 nm to 200 nm, and still more preferably 10 nm to 100 nm.

The hole blocking layer may have a single layer structure composed of one or two or more kinds of the above-described materials or may have a multilayer structure composed of a plurality of layers having the same or different compositions.

(Electron Blocking Layer)

The electron blocking layer is a layer having a function of preventing an electron transported to the light emitting layer from the cathode side from penetrating to the anode side. In the present invention, the electron blocking layer may be provided as an organic layer adjacent to the light emitting layer on the anode side.

As an example of the organic compound constituting the electron blocking layer, for example, those exemplified as the above-described hole transporting material may be applied.

The thickness of the electron blocking layer is preferably 1 nm to 500 nm, more preferably 5 nm to 200 nm, and still more preferably 10 nm to 100 nm.

The electron blocking layer may have a single layer structure composed of one or two or more kinds of the above-described materials or may have a multilayer structure composed of a plurality of layers having the same or different compositions.

(Protective Layer)

In the present invention, the entire organic EL device may be protected by a protective layer.

A material to be included in the protective layer may have a function of inhibiting those promoting the deterioration in the device, such as moisture, oxygen and the like from being incorporated into the device.

With respect to the protective layer, the subject matters described in paragraph Nos. and [0170] of Japanese Patent Application Laid-Open No. 2008-270736 may be applied to the present invention.

(Sealing Container)

The entire device of the present invention may be sealed by using a sealing container.

With respect to the sealing container, the subject matters described in paragraph No. of Japanese Patent Application Laid-Open No. 2008-270736 may be applied to the present invention.

Furthermore, a moisture absorbent or an inert liquid may be sealed in a space between the sealing container and the luminescence device. The moisture absorbent is not particularly limited, but examples thereof include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieves, zeolites, magnesium oxide and the like. The inert liquid is not particularly limited, but examples thereof include paraffins, liquid paraffins, fluorine-based solvents such as perfluoroalkane, perfluoroamine, perfluoroether and the like, chlorine-based solvents, and silicone oil.

(Driving)

In the organic electroluminescence device of the present invention, light emission may be obtained by applying a voltage (typically from 2 volts to 15 volts) of direct current (may include an alternating current component if necessary) or a current of direct current between the anode and the cathode.

With respect to the driving method of the organic electroluminescence device of the present invention, it is possible to apply driving methods described in each publication of Japanese Patent Application Laid-Open Nos. H2-148687, H6-301355, H5-29080, H7-134558, H8-234685, and H8-241047, and each specification of Japanese Patent No. 2784615, U.S. Pat. Nos. 5,828,429 and 6,023,308, and the like.

The external quantum efficiency of the organic electroluminescence device of the present invention is preferably 5% or more, and more preferably 7% or more. As values of external quantum efficiency, it is possible to use a maximum value of external quantum efficiency when the device is driving at 20° C. or a value of external quantum efficiency in the vicinity from 100 cd/m$^2$ to 300 cd/m$^2$ when the device is driving at 20° C.

The internal quantum efficiency of the organic electroluminescence device of the present invention is preferably 30% or more, more preferably 50% or more, and still more preferably 70% or more. The internal quantum efficiency of the device is calculated by dividing the external quantum efficiency by the light extraction efficiency. Typical organic EL devices have an light extraction efficiency of about 20%, but it is possible to achieve a light extraction efficiency of 20% or more by studying the shape of the substrate, the shape of the electrode, the film thickness of the organic layer, the film thickness of the inorganic layer, the refractive index of the organic layer, the refractive index of the inorganic layer and the like.

The organic electroluminescence device of the present invention has a local maximum emission wavelength (maximum intensity wavelength of the light emission spectrum) of preferably from 500 nm to 700 nm, more preferably from 500 nm to 600 nm, and still more preferably from 500 nm to 550 nm.

(Use of Luminescence Device of the Present Invention)

The luminescence device of the present invention may be suitably used for light emission apparatuses, pixels, display devices, displays, backlights, electrophotography, illumination light sources, recording light sources, exposure light sources, reading light sources, indicators, signboards, interiors, optical communication and the like. In particular, the luminescence device of the present invention is preferably used for a device that is driven in a region with high light emission luminance intensity, such as an illumination apparatus, a display apparatus and the like.

(Light Emission Apparatus)

Next, the light emission apparatus of the present invention will be described with reference to FIG. 2.

The light emission apparatus of the present invention is made by using the organic electroluminescence device.

Figure 2:
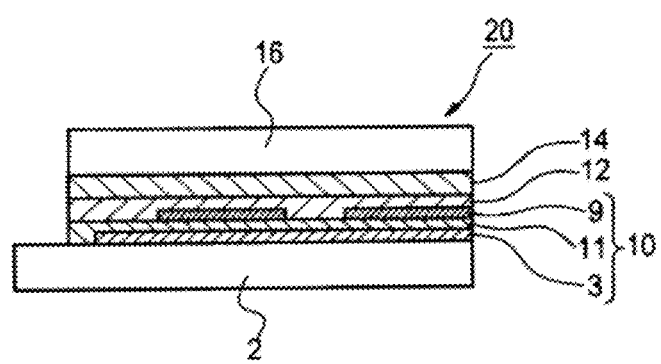
FIG. 2 is a schematic view illustrating an example (second embodiment) of a light emission apparatus according to the present invention.

FIG. 2 is a cross-sectional view schematically illustrating an example of a light emission apparatus of the present invention.

A light emission apparatus 20 of FIG. 2 is configured by a substrate (supporting substrate) 2, an organic electroluminescence device 10, a sealing container 16 and the like.

The organic electroluminescence device 10 is configured by sequentially stacking an anode (first electrode) 3, an organic layer 11 and a cathode (second electrode) 9 on the substrate 2. In addition, a protective layer 12 is stacked on the cathode 9. Furthermore, a sealing container 16 is provided on the protective layer 12 through an adhesion layer 14. Further, a part of each of the electrodes 3 and 9, a partition wall, an insulating layer and the like are omitted.

Here, as the adhesion layer 14, a photocurable or thermosetting adhesive such as an epoxy resin and the like may be used and, for example, a thermosetting adhesive sheet may also be used.

The light emission apparatus of the present invention is not particularly limited in the use thereof and, for example, may be used as not only an illumination apparatus but also a display apparatus such as a television set, a personal computer, a cellular phone, an electronic paper and the like.

(Illumination Apparatus)

Next, an illumination apparatus according to an embodiment of the present invention will be described with reference to FIG. 3.

Figure 3:
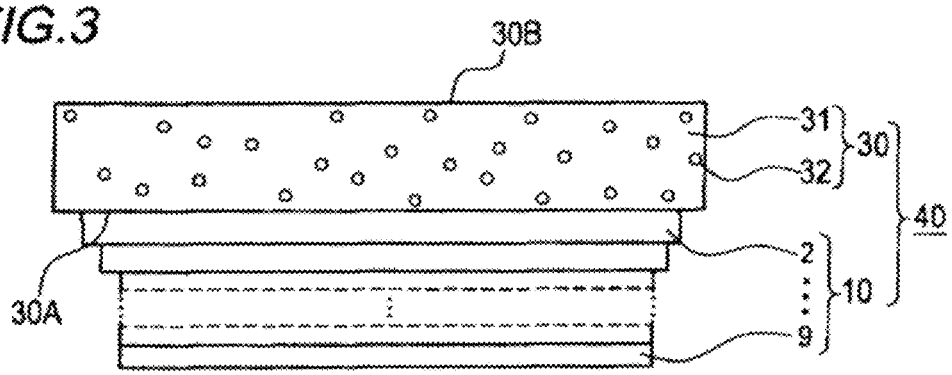
FIG. 3 is a schematic view illustrating an example (third embodiment) of an illumination apparatus according to the present invention.

FIG. 3 is a cross-sectional view schematically illustrating an example of the illumination apparatus according to the embodiment of the present invention.

The illumination apparatus 40 according to the embodiment of the present invention includes, as illustrated in FIG. 3, the above-described organic EL device 10 and a light scattering member 30. More specifically, the illumination apparatus 40 is configured such that the substrate 2 of the organic EL device 10 and the light scattering member 30 are brought into contact with each other.

The light scattering member 30 is not particularly limited so long as the member may scatter light, but in FIG. 3, is formed of a member obtained by dispersing fine particles 32 in a transparent substrate 31. Suitable examples of the transparent substrate 31 include a glass substrate. Suitable examples of the fine particle 32 include a transparent resin fine particle. As the glass substrate and the transparent resin fine particle, products known in the art may be used. In such an illumination apparatus 40, when light emitted from the organic electroluminescence device 10 is incident on a light incident surface 30A of the light scattering member 30, the incident light is scattered by the light scattering member 30 and the scattered light is outputted as illuminating light from a light exit surface 30B.

EXAMPLES

Hereinafter, the present invention will be described in detail with reference to the Examples, but the scope of the present invention is not limited to the following specific examples.

The compounds represented by Formula (I) were synthesized with reference to International Publication No. 2009/021126. Compound A used below was synthesized by the method of Synthetic Example described on page 37 in International Publication No. 2009/021126. Compound B was synthesized by the method of Synthetic Example described on page 30 in International Publication No. 2009/021126. Compound C was synthesized by the method of Synthetic Example described on pages 32 and 33 in International Publication No. 2009/021126.

Exemplary Compound (a-3) and Exemplary Compound (a-57) were synthesized with reference to the pamphlet of International Publication No. 03/080760, the pamphlet of International Publication No. 03/078541, the pamphlet of International Publication No. 05/085387, the pamphlet of International Publication No. 05/022962 and the like. For example, Exemplary Compound (a-3) may be synthesized by a method described in [0074] and [0075] of the pamphlet of International Publication No. 05/085387 (page 45, line 11 to page 46, line 18) using m-bromobenzoaldehyde as a starting material.

Further, the organic material used in the present example were all purified by sublimation and analyzed by high-speed liquid chromatography (TOSOH CORPORATION TSKgel ODS-100Z), and found to have an absorption intensity area ratio of 99.9% or more at 254 nm.

Example 1

Manufacture of Organic Electroluminescence Device

A glass substrate having an indium tin oxide (ITO) film with a thickness of 0.7 mm and each side of 2.5 cm in square (the thickness of the ITO film is 100 nm) was put into a washing container, and ultrasonically washed in 2-propanol, followed by UV-ozone treatment for 30 minutes. Each of the following layers was deposited on the glass substrate by a vacuum deposition method using a vacuum deposition apparatus (manufactured by Tokki Corp., Small-ELVESS). Furthermore, the vacuum deposition methods in the following Examples and Comparative Examples were all performed in the same conditions, and the deposition rate was 0.2 nm/sec unless otherwise specified. The deposition rate is measured by using a crystal oscillator. Further, the pressure was $1 \times 10^{-4}$ Pa or less. In addition, the thickness of each of the following layers was measured by using a crystal oscillator.

A film was formed by vacuum depositing 2-TNATA as a hole injection layer (HIL) on the anode (ITO) so as to have a thickness of 10 nm.

Subsequently, a film was formed by vacuum depositing N,N-dinaphthyl-N,N-diphenyl-[1,1'-biphenyl]-4,4'-diamine (α-NPD) as a hole transporting layer (HTL) on the hole injection layer so as to have a thickness of 30 nm.

Subsequently, a film was formed by vacuum depositing a light emitting layer containing Compound A (host material) and Light Emitting Material D (guest) that is a phosphorescent light emitting material in a mass ratio of 90:10 on the hole transporting layer so as to have a thickness of 30 nm.

Subsequently, an electron transporting layer (ETL) was formed by vacuum depositing Compound (a-3) on the light emitting layer so as to have a thickness of 5 nm. Furthermore, a film was formed by vacuum depositing $Alq_3$ as another electron transporting layer (ETL2) of one layer on the electron transporting layer so as to have a thickness of 40 nm.

Subsequently, a film was formed by vacuum depositing LiF as an electron injection layer (EIL) on the electron transporting layer (ETL2) so as to have a thickness of 0.5 nm, a mask (a mask having a light emitting region of 2 mm×2 mm) patterned as a cathode was provided thereon, and a film was formed by vacuum depositing metal aluminum so as to have a thickness of 100 nm.

The laminate thus manufactured was placed in a glove box substituted with an argon gas and sealed by using a glass-made sealing can and a UV-curable adhesive (XNR5516HV, manufactured by Nagase-CIBA Co., Ltd.). By the above process, an organic electroluminescence device of Example 1 was manufactured.

(Evaluation of Performance of Organic Electroluminescence Device)

The performance of the manufactured organic electroluminescence device of Example 1 was evaluated as follows. The evaluation results are shown in Table 2 below.

(a) External Quantum Efficiency (Light Emission Efficiency)

A direct current voltage is applied to an organic electroluminescence device at a predetermined current density (25 mA/cm$^2$) by using a Source Measure Unit 2400 manufactured by Toyo Technica Corporation to allow the device to emit light, and the luminance intensity is measured by using a luminance meter BM-8 manufactured by Topcon Corporation. Emission spectra and emission wavelengths are measured by using a spectrum analyzer PMA-11 manufactured by Hamamatsu Photonics Co., Ltd. On the basis of the obtained numerical values, the external quantum efficiency in the vicinity of the luminance intensity of 5000 cd/m$^2$ is calculated by a luminance intensity conversion method. It is desirable that the external quantum efficiency is as large as possible.

(b) Driving Voltage

The organic electroluminescence device was set on an emission spectrum measurement system (ELS1500) manufactured by Shimadzu Corporation and was allowed to emit light at a predetermined current density (25 mA/cm$^2$), and applied voltages were measured at the time when the luminance intensity thereof is 5,000 cd/m$^2$. It is desirable that the driving voltage is as low as possible.

(c) Change in Chromaticity before and after Driving at High Current Density

The organic electroluminescence device was set on an emission spectrum measurement system (ELS1500) manufactured by Shimadzu Corporation, and was allowed to emit light by applying a direct current voltage at a constant current density (25 mA/cm$^2$) such that the luminance intensity thereof becomes 5,000 cd/m$^2$. The obtained emission spectra are converted into the CIE chromaticity to obtain the CIE chromaticity (x, y) at that time. Thereafter, the chromaticity (x, y) at the time when the luminance intensity thereof is reduced into 2,500 cd/m$^2$ is obtained in the same manner as above, the differences ($\Delta x$, $\Delta y$) in both x values and y values were obtained, and $\Delta Z = (\Delta x)^2 + (\Delta y)^2$ was defined as an index of change in chromaticity before and after driving. It is desirable that the value of $\Delta Z$ is as small as possible.

(d) Durability at High Current Density

A direct current voltage was applied to an organic electroluminescence device at a predetermined current density (25 mA/cm$^2$) to emit light such that the luminance intensity thereof becomes 5,000 cd/m$^2$. The time until the luminance intensity decreased to 80% of 5,000 cd/m$^2$ is measured, and used as an index of durability at a high current density. It is desirable that the value is as large as possible.

Examples 2 to 7 and Comparative Examples 1 to 10

Devices were manufactured and evaluated in the same manner as in Example 1, except that compounds used in each layer are changed as shown in the following Table 1. The evaluation results are shown in the following Table 2.

Furthermore, in Table 2, the durability at a high current density is recorded as a relative value when the value in Comparative Example 7 is set to 1.0.

TABLE 1

| | Anode | HIL | HTL | Light emitting layer | ETL | ETL2 | EIL/Cathode |
|---|---|---|---|---|---|---|---|
| Example 1 | ITO | 2-TNATA | α-NPD | Light Emitting Material D + Compound A | Compound (a-3) | $Alq_3$ | LiF/Al |
| Example 2 | ITO | 2-TNATA | α-NPD | Light Emitting Material D + Compound A | Compound (a-57) | $Alq_3$ | LiF/Al |
| Example 3 | ITO | 2-TNATA | α-NPD | Light Emitting Material D + Compound B | Compound (a-3) | $Alq_3$ | LiF/Al |
| Example 4 | ITO | 2-TNATA | α-NPD | Light Emitting Material D + Compound B | Compound (a-57) | $Alq_3$ | LiF/Al |
| Example 5 | ITO | 2-TNATA | α-NPD | Light Emitting Material D + Compound C | Compound (a-3) | $Alq_3$ | LiF/Al |
| Example 6 | ITO | 2-TNATA | α-NPD | Light Emitting Material E + Compound A | Compound (a-3) | $Alq_3$ | LiF/Al |
| Example 7 | ITO | 2-TNATA | α-NPD | Light Emitting Material F + Compound A | Compound (a-3) | $Alq_3$ | LiF/Al |
| Comparative Example 1 | ITO | 2-TNATA | α-NPD | Light Emitting Material D + Compound A | Compound H | $Alq_3$ | LiF/Al |

TABLE 1-continued

| | Anode | HIL | HTL | Light emitting layer | ETL | ETL2 | EIL/Cathode |
|---|---|---|---|---|---|---|---|
| Comparative Example 2 | ITO | 2-TNATA | α-NPD | Light Emitting Material D + Compound B | Compound H | Alq$_3$ | LiF/Al |
| Comparative Example 3 | ITO | 2-TNATA | α-NPD | Light Emitting Material D + Compound G | Compound (a-3) | Alq$_3$ | LiF/Al |
| Comparative Example 4 | ITO | 2-TNATA | α-NPD | Light Emitting Material D + Compound G | Compound (a-57) | Alq$_3$ | LiF/Al |
| Comparative Example 5 | ITO | 2-TNATA | α-NPD | Light Emitting Material D + Compound G | Compound H | Alq$_3$ | LiF/Al |
| Comparative Example 6 | ITO | 2-TNATA | α-NPD | Light Emitting Material E + Compound G | Compound (a-3) | Alq$_3$ | LiF/Al |
| Comparative Example 7 | ITO | 2-TNATA | α-NPD | Light Emitting Material E + Compound G | Compound (a-57) | Alq$_3$ | LiF/Al |
| Comparative Example 8 | ITO | 2-TNATA | α-NPD | Light Emitting Material E + Compound G | Compound H | Alq$_3$ | LiF/Al |
| Comparative Example 9 | ITO | 2-TNATA | α-NPD | Light Emitting Material F + Compound G | Compound (a-3) | Alq$_3$ | LiF/Al |
| Comparative Example 10 | ITO | 2-TNATA | α-NPD | Light Emitting Material F + Compound G | Compound H | Alq$_3$ | LiF/Al |

TABLE 2

| | External quantum efficiency (%) | Driving voltage (V) | Change in Chromaticity before and after driving at high current density ΔZ | Durability at high current density |
|---|---|---|---|---|
| Example 1 | 11.4 | 9.6 | 0.000707 | 4.3 |
| Example 2 | 11.7 | 9.7 | 0.001000 | 3.5 |
| Example 3 | 12.7 | 9.5 | 0.000806 | 3.4 |
| Example 4 | 11.4 | 9.6 | 0.000950 | 3.1 |
| Example 5 | 11.2 | 9.5 | 0.000632 | 2.6 |
| Example 6 | 11.3 | 9.5 | 0.000632 | 2.5 |
| Example 7 | 11.0 | 9.6 | 0.000632 | 3.0 |
| Comparative Example 1 | 11.0 | 10.6 | 0.001170 | 2.2 |
| Comparative Example 2 | 11.1 | 9.9 | 0.001350 | 1.7 |
| Comparative Example 3 | 11.1 | 9.8 | 0.001120 | 2.5 |
| Comparative Example 4 | 10.2 | 10.2 | 0.001410 | 1.3 |
| Comparative Example 5 | 10.2 | 9.9 | 0.001350 | 1.0 |
| Comparative Example 6 | 11.1 | 9.9 | 0.001005 | 1.7 |
| Comparative Example 7 | 10.2 | 10.1 | 0.001099 | 1.0 |
| Comparative Example 8 | 10.3 | 9.8 | 0.001105 | 0.7 |
| Comparative Example 9 | 10.5 | 9.9 | 0.001487 | 2.4 |
| Comparative Example 10 | 10.8 | 10.4 | 0.001931 | 2.3 |

As apparent from the results of Table 2, it can be known that the device of the present invention, which uses a specific compound represented by Formula (I) containing a benzothiophene structure and a triphenylene structure as a host material for a light emitting layer, and a specific material represented by Formula (II) containing a carbazole structure and a phenylpyridine or phenylpyrimidine structure as an electron transporting material for an electron transporting layer, has a high external quantum efficiency, is capable of driving at a low voltage, and has a high durability in a high current density region and a very small change in chromaticity before and after driving, as compared to the devices of the Comparative Examples, which do not use both of the materials or either of the materials.

Further, from the comparison of the results of devices in Examples 1 and 2 with the results of devices in Examples 3 and 4, it can be known that a device using a compound represented by Formula (II) in which each of the carbazole structure and the phenylpyridine or phenylpyrimidine structure does not have a substituent (n1 to n5 are 0) has high durability in a high current density region and a small change in chromaticity before and after driving.

Furthermore, from the comparison of the results of devices in Examples 1, 3 and 5, it can be known that a device using a compound represented by Formula (I-1) has high durability in a high current density region compared to a device using a compound represented by Formula (I-2). On the contrary, it can be known that the compound represented by Formula (I-2) has a small change in chromaticity before and after driving in a high current density region compared to the device using the compound represented by Formula (I-1).

In the case of a light emission apparatus, a display apparatus and an illumination apparatus, it is necessary to instantaneously emit light at a high luminance intensity through a high current density in each pixel part, and in that case, the luminescence device of the present invention is designed to increase the light emission efficiency and thus may be advantageously used.

Structures of the compounds used in the Examples and the Comparative Examples are shown below.

[Chem. 43]

Compound A

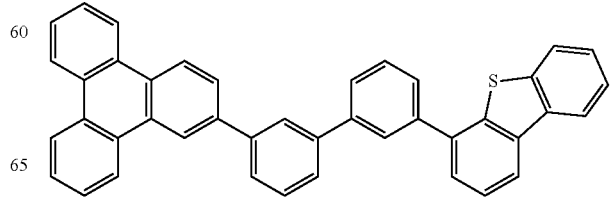

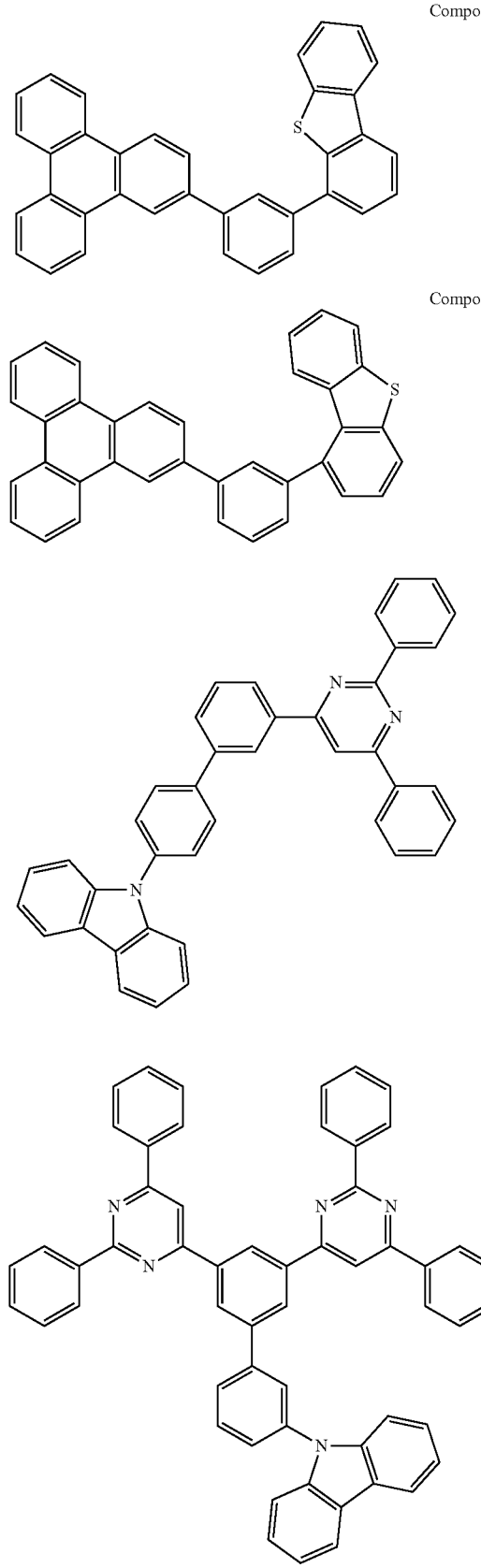
Compound B
Compound C
(a-3)
(a-57)
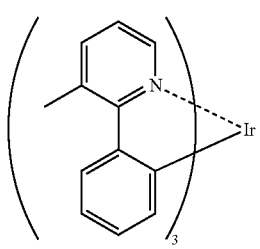
Light Emitting
Meterial D
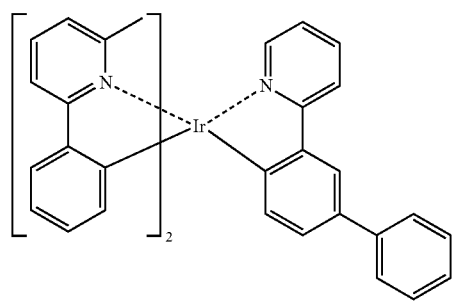
Light Emitting
Meterial E
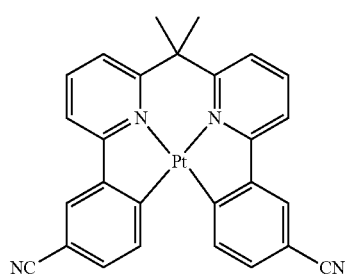
Light Emitting
Meterial F
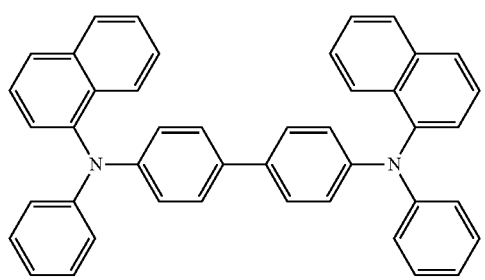
α - NPD

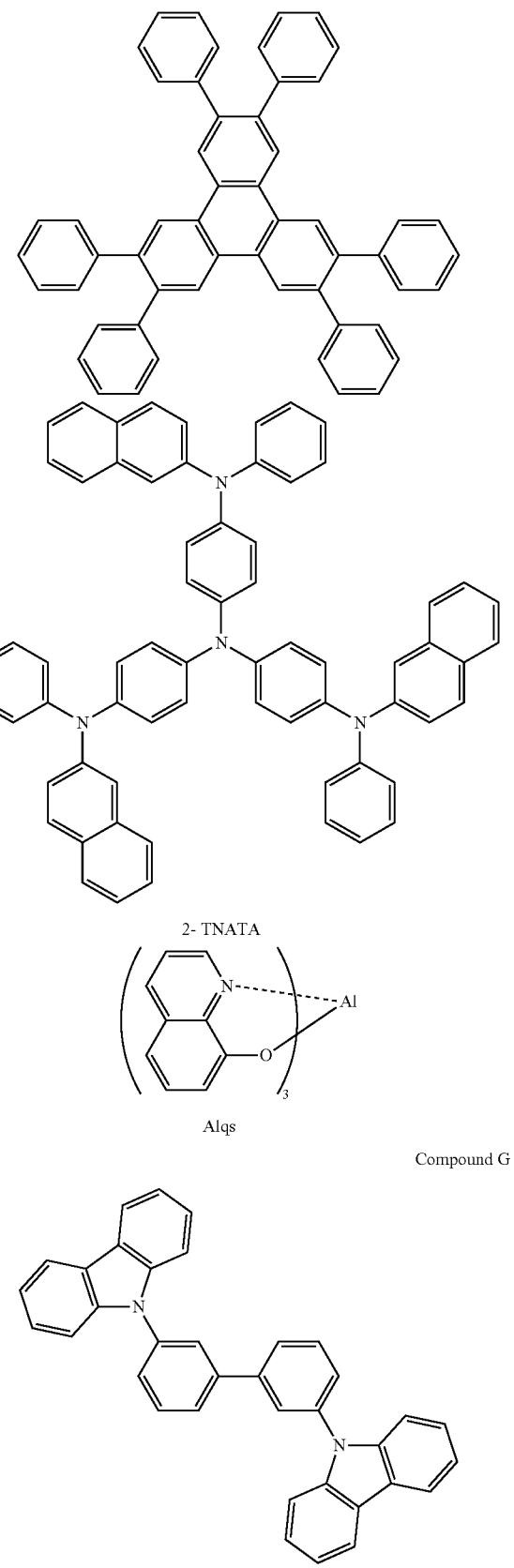

INDUSTRIAL APPLICABILITY

The organic electroluminescence device of the present invention has a high light emission efficiency, a low driving voltage, a high durability in a high current density region, and a small change in chromaticity before and after driving in the high current density region. For this reason, the organic electroluminescence device of the present invention may be preferably used for various light emission apparatuses, pixels, display devices, displays, backlights, electrophotography, illumination light sources, recording light sources, exposure light sources, reading light sources, indicators, signboards, interiors, optical communication and the like.

Although the present invention has been described in detail with reference to specific embodiments thereof, it is obvious to those skilled in the art that various changes or modifications may be made without departing from the spirit and scope of the present invention.

The present application is based on the Japanese Patent Application (Japanese Patent Application No. 2010-157353) filed on Jul. 9, 2010, and the content thereof is hereby incorporated by reference in its entirety.

REFERENCE SIGNS LIST

2 Substrate
3 Anode
4 Hole injection layer
5 Hole transporting layer
6 Light emitting layer
7 Hole blocking layer
8 Electron transporting layer
9 Cathode
10 Organic electroluminescence device (Organic EL device)
11 Organic layer
12 Protective layer
14 Adhesion layer
16 Sealing container
20 Light emission apparatus
30 Light Scattering Member
30A Light incident surface
30B Light exit surface
31 Transparent substrate
32 Fine particle
40 Illumination apparatus

The invention claimed is:

1. An organic electroluminescence device comprising: a pair of electrodes of an anode and a cathode; a light emitting layer between the electrodes; and at least one organic layer between the light emitting layer and the cathode,
wherein the light emitting layer contains at least one phosphorescent light emitting material and at least one compound represented by the following Formula (I-2), and
the at least one organic layer between the light emitting layer and the cathode contains at least one compound represented by the following Formula (II),
wherein the at least one organic layer is in contact with the light emitting layer:

(I-2)

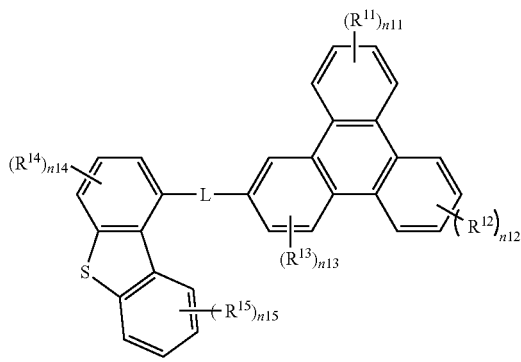

wherein, in Formula (I-2), each of $R^{11}$ to $R^{15}$ independently represents an alkyl group, an alkoxy group, an aryl group, an aromatic heterocyclic group, an alkenyl group, an alkynyl group, —$OAr^{11}$, —$N(R^{16}XR^{17})$, or —$N(Ar^{11})(Ar^{12})$, each of $R^{16}$ and $R^{17}$ independently represents a hydrogen atom or a substituent, each of $Ar^{11}$ and $Ar^{12}$ independently represents an aryl group or an aromatic heterocyclic group, L represents a single bond, an arylene group, a divalent aromatic heterocyclic group or a group composed of a combination thereof, each of n11, n12 and n15 independently represents an integer of 0 to 4, and each of n13 and n14 independently represents an integer of 0 to 3:

Formula (II)

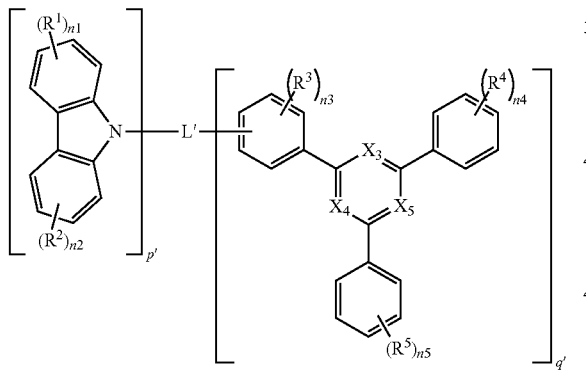

wherein, in Formula (II), each of $X_3$, $X_4$, and $X_5$ is independently a nitrogen atom, or a carbon atom having a hydrogen atom or a substituent bonded thereto, and the ring containing $X_3$, $X_4$, and $X_5$ is pyridine or pyrimidine, L' represents a single bond or a benzene ring, each of $R^1$ to $R^5$ independently represents a fluorine atom, a methyl group, a phenyl group, a cyano group, a pyridyl group, a pyrimidyl group, a silyl group, a carbazolyl group or a tert-butyl group, each of n1 to n5 independently represents 0 or 1, and each of p' and q' independently represents 1 or 2.

2. The organic electroluminescence device of claim 1, wherein each of $R^{11}$ to $R^{15}$ is independently an aryl group or an aromatic heterocyclic group.

3. The organic electroluminescence device of claim 1, wherein L is an arylene group.

4. The organic electroluminescence device of claim 1, wherein at least one layer of the light emitting layer and the other organic layers present between the anode and the cathode is formed by a solution application process.

5. A light emission apparatus using the organic electroluminescence device of claim 1.

6. A display apparatus using the organic electroluminescence device of claim 1.

7. An illumination apparatus using the organic electroluminescence device of claim 1.

8. The organic electroluminescence device of claim 1, wherein the phosphorescent light emitting material is a platinum complex.

9. The organic electroluminescent device of claim 1, wherein the at least one organic layer between the light emitting layer comprises a first organic layer and a second organic layer,
wherein the first organic layer comprises at least one compound represented by the following Formula (II), and wherein the first organic layer is in contact with the light emitting layer.

10. An organic electroluminescence device comprising: a pair of electrodes of an anode and a cathode; a light emitting layer between the electrodes; and at least one organic layer between the light emitting layer and the cathode,
wherein the light emitting layer contains at least one phosphorescent light emitting material and at least one compound represented by the following Formula (I), and
the at least one organic layer between the light emitting layer and the cathode contains at least one compound represented by the following Formula (II),
wherein the at least one organic layer is in contact with the light emitting layer:

Formula (I)

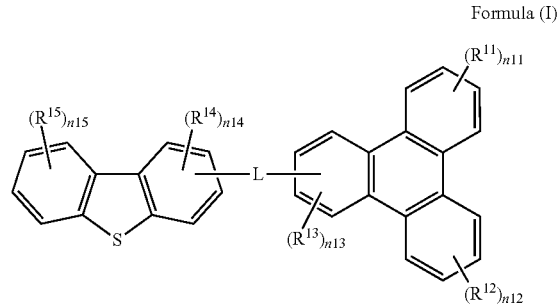

wherein, in Formula (I), each of $R^{11}$ to $R^{15}$ independently represents an alkyl group, an alkoxy group, an aryl group, an aromatic heterocyclic group, an alkenyl group, an alkynyl group, —$OAr^{11}$, —$N(R^{16})(R^{17})$, or —$N(Ar^{11}$ $(Ar^{12})$, each of $R^{16}$ and $R^{17}$ independently represents a hydrogen atom or a substituent, each of $Ar^{11}$ and $Ar^{12}$ independently represents an aryl group or an aromatic heterocyclic group, L represents a single bond, an arylene group, a divalent aromatic heterocyclic group or a group composed of a combination thereof, each of n11, n12 and n15 independently represents an integer of 0 to 4, and each of n13 and n14 independently represents an integer of 0 to 3; and at least one of n11 to n15 is not 0;

Formula (II)

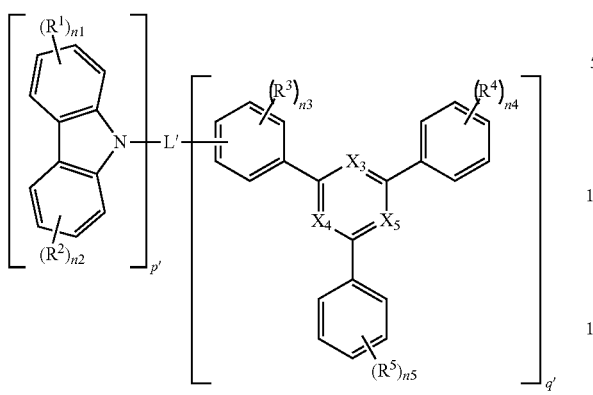

wherein, in Formula (II), each of $X_3$, $X_4$, and $X_5$ is independently a nitrogen atom, or a carbon atom having a hydrogen atom or a substituent bonded thereto, and the ring containing $X_3$, $X_4$, and $X_5$ is pyridine or pyrimidine, L' represents a single bond or a benzene ring, each of $R^1$ to $R^5$ independently represents a fluorine atom, a methyl group, a phenyl group, a cyano group, a pyridyl group, a pyrimidyl group, a silyl group, a carbazolyl group or a tert-butyl group, each of n1 to n5 independently represents 0 or 1, and each of p' and a' independently represents 1 or 2.

11. A light emission apparatus using the organic electroluminescence device of claim 10.

12. A display apparatus using the organic electroluminescence device of claim 10.

13. An illumination apparatus using the organic electroluminescence device of claim 10.

14. An organic electroluminescence device comprising: a pair of electrodes of an anode and a cathode: a light emitting layer between the electrodes; and at least one organic layer between the light emitting layer and the cathode,
wherein the light emitting layer contains at least one phosphorescent light emitting material and at least one compound represented by the following Formula (I), and
the at least one organic layer between the light emitting layer and the cathode contains at least one compound represented by the following Formula (II),
wherein the at least one organic layer is in contact with the light emitting layer:

Formula (I)

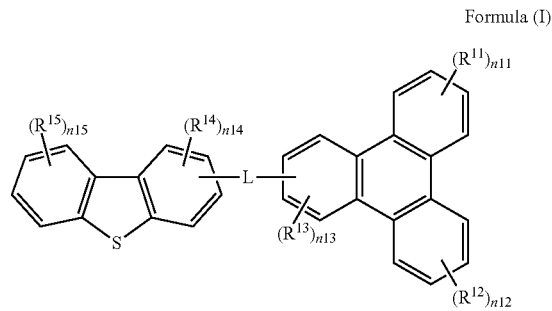

wherein, in Formula (I), each of $R^{11}$ to $R^{15}$ independently represents an alkyl group, an alkoxy group, an aryl group, an aromatic heterocyclic group, an alkenyl group, an alkynyl group, $-OAr^{11}$, $-N(R^{16})(R^{17})$, or $-N(Ar^{11})(Ar^{12})$, each of $R^{16}$ and $R^{17}$ independently represents a hydrogen atom or a substituent, each of $Ar^{11}$ and $Ar^{12}$ independently represents an aryl group or an aromatic heterocyclic group, L represents a single bond, an arylene group, a divalent aromatic heterocyclic group or a group composed of a combination thereof, each of n11, n12 and n15 independently represents an integer of 0 to 4, and each of n13 and n14 independently represents an integer of 0 to 3, and L comprises a divalent aromatic heterocyclic group;

Formula (II)

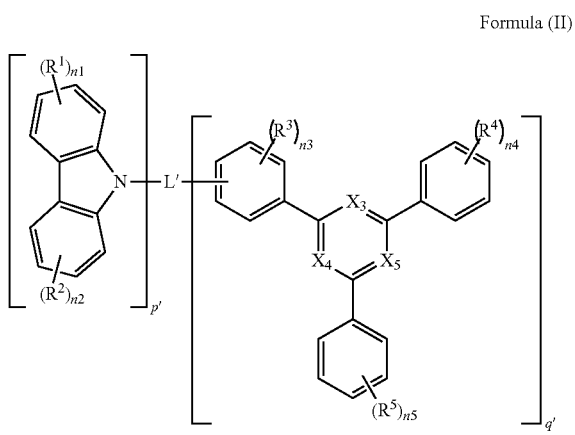

wherein, in Formula (II), each of $X_3$, $X_4$, and $X_5$ is independently a nitrogen atom, or a carbon atom having a hydrogen atom or a substituent bonded thereto, and the ring containing $X_3$, $X_4$, and $X_5$ is pyridine or pyrimidine, L' represents a single bond or a benzene ring, each of $R^1$ to $R^5$ independently represents a fluorine atom, a methyl group, a phenyl group, a cyano group, a pyridyl group, a pyrimidyl group, a silyl group, a carbazolyl group or a tert-butyl group, each of n1 to n5 independently represents 0 or 1, and each of p' and a' independently represents 1 or 2.

15. The organic electroluminescence device of claim 14, wherein the compound represented by Formula (I) is a compound represented by the following Formula (I-1):

Formula (I-1)

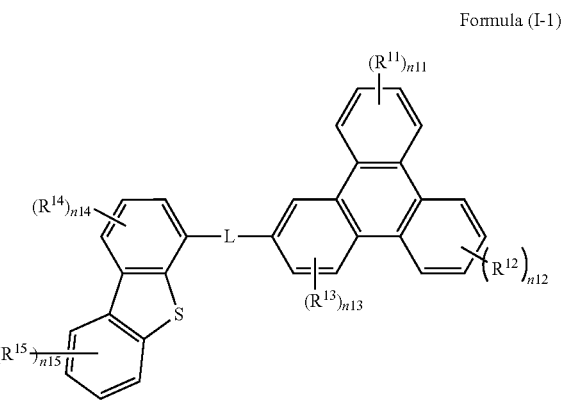

wherein, in Formula (I-1), $R^{11}$ to $R^{15}$, L and $n^{11}$ to $n^{15}$ have the same meaning as $R^1$ to $R^{15}$, L and $n^{11}$ to $n^{15}$ in Formula (I).

16. A light emission apparatus using the organic electroluminescence device of claim 14.

17. A display apparatus using the organic electroluminescence device of claim 14.

18. An illumination apparatus using the organic electroluminescence device of claim 14.

* * * * *